United States Patent
Stoessel et al.

(10) Patent No.: US 11,437,592 B2
(45) Date of Patent: Sep. 6, 2022

(54) DINUCLEAR AND OLIGONUCLEAR METAL COMPLEXES CONTAINING TRIPODAL BIDENTATE PART LIGANDS AND THEIR USE IN ELECTRONIC DEVICES

(71) Applicant: Merck Patent GmbH, Darmstadt (DE)

(72) Inventors: Philipp Stoessel, Frankfurt am Main (DE); Christian Ehrenreich, Darmstadt (DE)

(73) Assignee: MERCK PATENT GMBH, Darmstadt (DE)

( * ) Notice: Subject to any disclaimer, the term of this patent is extended or adjusted under 35 U.S.C. 154(b) by 53 days.

(21) Appl. No.: 16/320,711

(22) PCT Filed: Jul. 20, 2017

(86) PCT No.: PCT/EP2017/068290
§ 371 (c)(1),
(2) Date: Jan. 25, 2019

(87) PCT Pub. No.: WO2018/019687
PCT Pub. Date: Feb. 1, 2018

(65) Prior Publication Data
US 2019/0157578 A1 May 23, 2019

(30) Foreign Application Priority Data
Jul. 25, 2016 (EP) .................................. 16180997

(51) Int. Cl.
| | | |
|---|---|---|
| H01L 51/00 | (2006.01) | |
| C07F 15/00 | (2006.01) | |
| C09K 11/06 | (2006.01) | |
| H05B 33/14 | (2006.01) | |
| H01L 51/50 | (2006.01) | |

(52) U.S. Cl.
CPC ...... *H01L 51/0085* (2013.01); *C07F 15/0033* (2013.01); *C09K 11/06* (2013.01); *H01L 51/009* (2013.01); *H05B 33/14* (2013.01); *C09K 2211/1007* (2013.01); *C09K 2211/1029* (2013.01); *C09K 2211/185* (2013.01); *H01L 51/5016* (2013.01); *H01L 2251/5384* (2013.01); *Y02E 10/549* (2013.01)

(58) Field of Classification Search
CPC ..................................................... C09K 11/06
See application file for complete search history.

(56) References Cited

U.S. PATENT DOCUMENTS

| | | | |
|---|---|---|---|
| 7,332,232 | B2 | 2/2008 | Ma et al. |
| 7,728,137 | B2 | 6/2010 | Stossel et al. |
| 2005/0170206 | A1 * | 8/2005 | Ma .................................. 428/690 |
| 2008/0272203 | A1 | 11/2008 | Leber |
| 2011/0284799 | A1 * | 11/2011 | Stoessel .................. 252/301.16 |
| 2014/0326964 | A1 | 11/2014 | Kim |
| 2018/0026209 | A1 | 1/2018 | Stossel et al. |
| 2018/0254416 | A1 | 9/2018 | Stoessel et al. |
| 2019/0252628 | A1 | 8/2019 | Stoessel et al. |
| 2019/0280220 | A1 | 9/2019 | Stoessel et al. |
| 2019/0315787 | A1 | 10/2019 | Stoessel et al. |
| 2019/0386228 | A1 | 12/2019 | Stoessel et al. |

FOREIGN PATENT DOCUMENTS

| | | |
|---|---|---|
| JP | 2005-082598 A | 3/2005 |
| JP | 2005-187473 A | 7/2005 |
| JP | 2007-524585 A | 8/2007 |
| JP | 2008-506652 A | 3/2008 |
| JP | 2013-149812 A | 8/2013 |
| JP | 2013-235950 A | 11/2013 |
| JP | 2013-243234 A | 12/2013 |
| JP | 2018-510903 A | 4/2018 |
| JP | 2018-531896 A | 11/2018 |
| JP | 2019-527684 A | 10/2019 |
| WO | 2004081017 A1 | 9/2004 |
| WO | 2006/008069 A1 | 1/2006 |
| WO | 2007/086505 A1 | 8/2007 |
| WO | 2014/024668 A1 | 2/2014 |
| WO | 2015/117718 A1 | 8/2015 |
| WO | 2016124304 A1 | 8/2016 |
| WO | WO-2018041769 A1 | 3/2018 |
| WO | WO-2018069197 A1 | 4/2018 |
| WO | WO-2018069273 A1 | 4/2018 |
| WO | WO-2018077769 A1 | 5/2018 |

OTHER PUBLICATIONS

Machine translated English document of JP 2013/243234 A, Masahito Nishizeki, Dec. 5, 2013 (Year: 2013).*
Hajra, T., et al., "Multimetallic compounds containing cyclometalated Ir(III) units: Synthesis, structure, electrochemistry and photophysical properties," Inorganica Chimica Acta, vol. 372, pp. 53-61 (2011).
International Search Report for International Application No. PCT/EP2017/068290, dated Nov. 24, 2017.
International Preliminary Report on Patentability received for PCT Patent Application No. PCT/EP2017/068290, dated Feb. 7, 2019, 30 pages (17 pages of English Translation and 13 pages of Original Document).
Prasad et al., "Syntheses and characterization of mono and dinuclear complexes of platinum group metals bearing benzene-linked bis(pyrazolyl)methane ligands", Journal of Organometallic Chemistry, vol. 695, 2010, pp. 1375-1382.

\* cited by examiner

*Primary Examiner* — Jennifer A Boyd
*Assistant Examiner* — Seokmin Jeon
(74) *Attorney, Agent, or Firm* — Faegre Drinker Biddle & Reath LLP

(57) ABSTRACT

The present invention relates to bi- and oligonuclear metal complexes and to electronic devices, especially organic electroluminescent devices, comprising these metal complexes.

16 Claims, No Drawings

DINUCLEAR AND OLIGONUCLEAR METAL COMPLEXES CONTAINING TRIPODAL BIDENTATE PART LIGANDS AND THEIR USE IN ELECTRONIC DEVICES

RELATED APPLICATIONS

This application is a national stage entry, filed pursuant to 35 U.S.C. § 371, of PCT/EP2017/068290, filed Jul. 20, 2017, which claims the benefit of European Patent Application No, 16180997.5, filed Jul. 25, 2016, which is incorporated herein by reference in its entirety.

The present invention relates to bi- and oligonuclear metal complexes suitable for use as emitters in organic electroluminescent devices.

According to the prior art, triplet emitters used in phosphorescent organic electroluminescent devices (OLEDs) are, in particular, bis- and tris-ortho-metallated iridium complexes having aromatic ligands, where the ligands bind to the metal via a negatively charged carbon atom and an uncharged nitrogen atom or via a negatively charged carbon atom and an uncharged carbene carbon atom. Examples of such complexes are tris(phenylpyridyl)iridium(III) and derivatives thereof, where the ligands used are, for example, 1- or 3-phenylisoquinolines, 2-phenylquinolines or phenylcarbenes.

An improvement in the stability of the complexes was achieved by the use of polypodal ligands, as described, for example, in WO 2004/081017 or U.S. Pat. No. 7,332,232. Even though these complexes show advantages over complexes which otherwise have the same ligand structure except that the individual ligands therein do not have polypodal bridging, there is still a need for improvement. Thus, in the case of complexes having polypodal ligands too, improvements are still desirable in relation to the properties on use in an organic electroluminescent device, especially in relation to efficiency, voltage and/or lifetime.

The problem addressed by the present invention is that of providing novel metal complexes suitable as emitters for use in OLEDs. It is a particular object to provide emitters which exhibit improved properties in relation to efficiency, operating voltage and/or lifetime.

It has been found that this problem is solved, surprisingly, by bi- and oligonuclear iridium complexes in which two or more metal complexes, at least one of which is an iridium complex with a hexadentate tripodal ligand, are joined to one another by a linker, which are of very good suitability for use in an organic electroluminescent device. The present invention provides these complexes and organic electroluminescent devices comprising these complexes. These complexes exhibit good efficiency and solubility, and narrow emission spectra.

The invention provides a compound of the following formula (1):

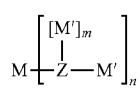

Formula (1)

where the symbols and indices used are as follows:
M is an iridium complex containing a hexadentate tripodal ligand in which three bidentate sub-ligands coordinate to an iridium atom and the three bidentate sub-ligands, which may be the same or different, are joined via a bridge of the following formula (2) or formula (3)

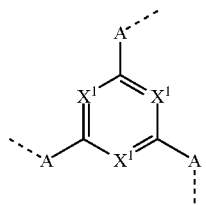

Formula (2)

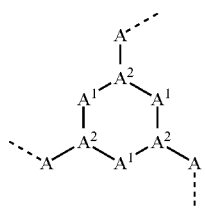

Formula (3)

where the dotted bond represents the bond of the bidentate sub-ligands to this structure and, in addition:
$X^1$ is the same or different at each instance and is CR or N;
$A^1$ is the same or different at each instance and is $C(R)_2$ or O;
$A^2$ is the same or different at each instance and is CR, P(=O), B or SiR, with the proviso that, when $A^2$=P(=O), B or SiR, the symbol $A^1$ is O and the symbol A bonded to this $A^2$ is not —C(=O)—NR'— or —C(=O)—O—;
A is the same or different at each instance and is —CR=CR—, —C(=O)—NR'—, —C(=O)—O— or a group of the following formula (4):

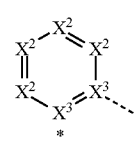

Formula (4)

where the dotted bond represents the position of the bond of the bidentate sub-ligands to this structure and * represents the position of the linkage of the unit of the formula (4) to the central cyclic group, i.e. the group explicitly included in formula (2) or (3);
$X^2$ is the same or different at each instance and is CR or N or two adjacent $X^2$ groups together are NR, O or S, thus forming a five-membered ring, and the remaining $X^2$ are the same or different at each instance and are CR or N; or two adjacent $X^2$ groups together are CR or N when one of the $X^3$ groups in the cycle is N, thus forming a five-membered ring; with the proviso that not more than two adjacent $X^2$ groups are N;
$X^3$ is C at each instance or one $X^3$ group is N and the other $X^3$ group in the same cycle is C; with the proviso that two adjacent $X^2$ groups together are CR or N when one of the $X^3$ groups in the cycle is N;
at the same time, the three bidentate sub-ligands, apart from by the bridge of the formula (2) or (3), may also be ring-closed by a further bridge to form a cryptate;

M' is the same or different at each instance and is M or an iridium complex in which three bidentate ligands which may be the same or different coordinate to one iridium atom, or a platinum complex in which two bidentate ligands which may be the same or different coordinate or a tetradentate ligand coordinates to one platinum atom;

R is the same or different at each instance and is H, D, F, Cl, Br, I, N(R$^1$)$_2$, CN, NO$_2$, OH, COOH, C(=O)N(R$^1$)$_2$, Si(R$^1$)$_3$, B(OR$^1$)$_2$, C(=O)R$^1$, P(=O)(R$^1$)$_2$, S(=O)R$^1$, S(=O)$_2$R$^1$, OSO$_2$R$^1$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, where the alkyl, alkoxy, thioalkoxy, alkenyl or alkynyl group may each be substituted by one or more R$^1$ radicals, where one or more nonadjacent CH$_2$ groups may be replaced by Si(R$^1$)$_2$, C=O, NR$^1$, O, S or CONR$^1$, or an aromatic or heteroaromatic ring system which has 5 to 40 aromatic ring atoms and may be substituted in each case by one or more R$^1$ radicals, or an aryloxy or heteroaryloxy group which has 5 to 40 aromatic ring atoms and may be substituted by one or more R$^1$ radicals; at the same time, two R radicals together may also form a ring system;

R' is the same or different at each instance and is H, D, a straight-chain alkyl group having 1 to 20 carbon atoms or a branched or cyclic alkyl group having 3 to 20 carbon atoms, where the alkyl group in each case may be substituted by one or more R$^1$ radicals and where one or more nonadjacent CH$_2$ groups may be replaced by Si(R$^1$)$_2$, or an aromatic or heteroaromatic ring system which has 5 to 40 aromatic ring atoms and may be substituted in each case by one or more R$^1$ radicals;

R$^1$ is the same or different at each instance and is H, D, F, Cl, Br, I, N(R$^2$)$_2$, CN, NO$_2$, Si(R$^2$)$_3$, B(OR$^2$)$_2$, C(=O)R$^2$, P(=O)(R$^2$)$_2$, S(=O)R$^2$, S(=O)$_2$R$^2$, OSO$_2$R$^2$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, where the alkyl, alkoxy, thioalkoxy, alkenyl or alkynyl group may each be substituted by one or more R$^2$ radicals, where one or more nonadjacent CH$_2$ groups may be replaced by Si(R$^2$)$_2$, C=O, NR$^2$, O, S or CONR$^2$, or an aromatic or heteroaromatic ring system which has 5 to 40 aromatic ring atoms and may be substituted in each case by one or more R$^2$ radicals, or an aryloxy or heteroaryloxy group which has 5 to 40 aromatic ring atoms and may be substituted by one or more R$^2$ radicals; at the same time, two or more R$^1$ radicals together may form a ring system;

R$^2$ is the same or different at each instance and is H, D, F or an aliphatic, aromatic and heteroaromatic organic radical, especially a hydrocarbyl radical, having 1 to 20 carbon atoms, in which one or more hydrogen atoms may also be replaced by F;

Z is the same or different at each instance and is a single bond or a linker that covalently joins two or more complexes M and M' to one another;

n is 1, 2, 3, 4, 5 or 6;

m is the same or different at each instance and is 0, 1, 2, 3 or 4.

When two R or R$^1$ radicals together form a ring system, it may be mono- or polycyclic, and aliphatic, heteroaliphatic, aromatic or heteroaromatic. In this case, the radicals which together form a ring system may be adjacent, meaning that these radicals are bonded to the same carbon atom or to carbon atoms directly bonded to one another, or they may be further remote from one another. For example, it is also possible for an R radical bonded to an A group to form a ring with an R radical bonded to the X$^1$ group. When there is such ring formation between an R radical bonded to an A group and an R radical bonded to the X$^1$ group, this ring is preferably formed by a group having three bridge atoms, preferably having three carbon atoms, and more preferably by a —(CR$_2$)$_3$— group.

The wording that two or more radicals together may form a ring, in the context of the present description, shall be understood to mean, inter alia, that the two radicals are joined to one another by a chemical bond with formal elimination of two hydrogen atoms. This is illustrated by the following scheme:

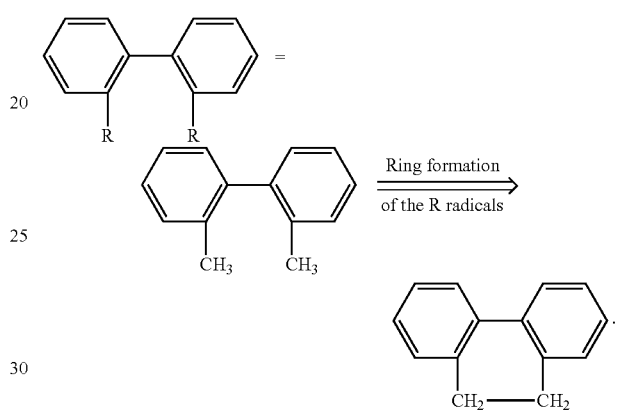

In addition, however, the abovementioned wording shall also be understood to mean that, if one of the two radicals is hydrogen, the second radical binds to the position to which the hydrogen atom was bonded, forming a ring. This shall be illustrated by the following scheme:

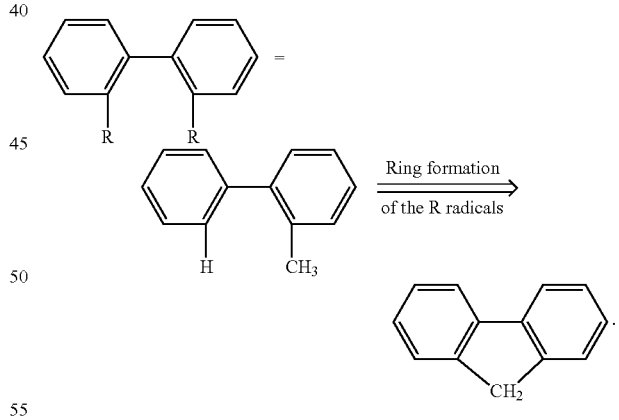

The formation of an aromatic ring system shall be illustrated by the following scheme:

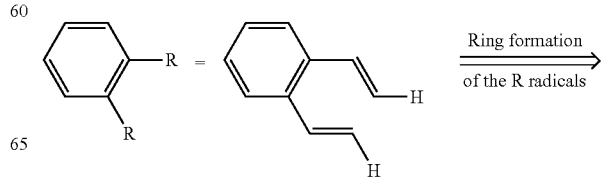

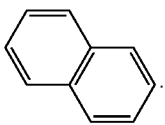

This kind of ring formation is possible in radicals bonded to carbon atoms directly bonded to one another, or in radicals bonded to further-remote carbon atoms. Preference is given to this kind of ring formation in radicals bonded to carbon atoms directly bonded to one another or to the same carbon atom.

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc.

An aromatic ring system in the context of this invention contains 6 to 40 carbon atoms in the ring system. A heteroaromatic ring system in the context of this invention contains 1 to 40 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for two or more aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. shall thus also be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl, terphenyl, quaterphenyl or bipyridine, shall likewise be regarded as an aromatic or heteroaromatic ring system.

A cyclic alkyl, alkoxy or thioalkoxy group in the context of this invention is understood to mean a monocyclic, bicyclic or polycyclic group.

In the context of the present invention, a $C_1$- to $C_{20}$-alkyl group in which individual hydrogen atoms or $CH_2$ groups may also be replaced by the abovementioned groups are understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. A $C_1$ to $C_{20}$-alkoxy group is understood to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system which has 5-40 aromatic ring atoms and may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

The linker Z may be joined to the metal complex M either at the group of the formula (2) or (3) or at one of the sub-ligands.

According to the invention, the ligand of the metal complex M is a hexadentate tripodal ligand having three bidentate sub-ligands. The structure of the hexadentate tripodal ligands can be shown in schematic form by the following formula (Lig):

(Lig)

where V represents the bridge of formula (2) or (3) and L1, L2 and L3 are the same or different at each instance and are each bidentate sub-ligands. "Bidentate" means that the particular sub-ligand in the complex M coordinates or binds to the iridium via two coordination sites. "Tripodal" means that the ligand (Lig) has three sub-ligands bonded to the bridge V or the bridge of the formula (2) or (3). Since the ligand has three bidentate sub-ligands, the overall result is a hexadentate ligand, i.e. a ligand which coordinates or binds to the iridium via six coordination sites. The expression "bidentate sub-ligand" in the context of this application means that this unit would be a bidentate ligand if the bridge of the formula (2) or (3) and the linker Z were not present. However, as a result of the formal abstraction of a hydrogen atom in this bidentate ligand and the attachment to the bridge of the formula (2) or (3) and possibly to Z, it is not a separate ligand but a portion of the hexadentate ligand which thus arises and is bonded to Z, and so the term "sub-ligand" is used therefor.

The iridium complex M formed with this ligand of the formula (Lig) can thus be represented schematically by the following formula:

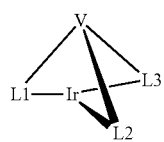

where V represents the bridge of formula (2) or (3) and L1, L2 and L3 are the same or different at each instance and are each bidentate sub-ligands. The linker Z can bind here either to the bridge of the formula (2) or (3) or to one or more of the sub-ligands L1, L2 or L3.

The bond of the ligand to the iridium may either be a coordinate bond or a covalent bond, or the covalent fraction of the bond may vary according to the ligand. When it is said here that the ligand or sub-ligand coordinates or binds to the iridium, this refers in the context of the present application to any kind of bond of the ligand or sub-ligand to the iridium, irrespective of the covalent fraction of the bond.

Preferably, the compounds of the invention are characterized in that they are uncharged, i.e. electrically neutral. It is preferable here when M, M' and the linker Z is uncharged. This is achieved in a simple manner by selecting the charges of the three bidentate sub-ligands such that they compensate for the charge of the iridium atom complexed. Preferably, each of the three bidentate sub-ligands has a single negative charge, such that the three sub-ligands compensate for the charge of the Ir(III).

According to the choice of indices n and m, various bi- and oligonuclear compounds may be formed, as detailed below in schematic form for some combinations of n and m:

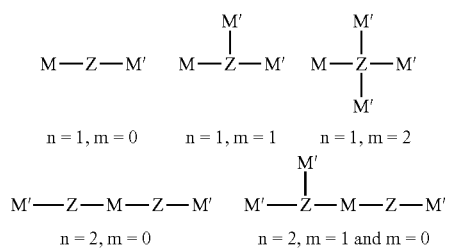

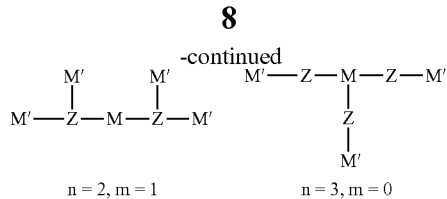

where the symbols used have the definitions given above. In an entirely analogous manner, it is possible to form further oligonuclear complexes from further combinations of the indices n and m.

In a preferred embodiment of the invention, n=1 or 2 and m=0 or 1. In a particularly preferred embodiment, n=1 and m=0.

The preferred embodiments of Z are described hereinafter. As described above, Z is a single bond or a linker. When m=0, Z is a single bond or a bivalent group. When m=1, Z is a trivalent group. When m=2, Z is a tetravalent group.

Preferably, Z is selected from the group consisting of a single bond, an alkylene group which has 1 to 20 carbon atoms and may be substituted by one or more $R^1$ radicals, where one or more nonadjacent $CH_2$ groups may be replaced by $R^1C=CR^1$, $C\equiv C$, $Si(R^1)_2$, $C=O$, $NR^1$, O, S or $CONR^1$, an aromatic or heteroaromatic ring system which has 5 to 20 aromatic ring atoms and may be substituted in each case by one or more $R^1$ radicals, an —Ar-alkylene- group, an -alkylene-Ar-alkylene- group, an —Ar-[alkylene-Ar]$_p$— group with p=1, 2 or 3. Ar here is the same or different at each instance and in each case is an aromatic or heteroaromatic ring system having 5 to 30 aromatic ring atoms, preferably having 6 to 24 aromatic ring atoms, more preferably having 6 to 30 aromatic ring atoms, which may be substituted by one or more $R^1$ radicals, and alkylene here is an alkylene group having 1 to 20 carbon atoms, preferably having 1 to 10 carbon atoms, more preferably having 1 to 4 carbon atoms, which may be substituted by one or more $R^1$ radicals, where one or more nonadjacent $CH_2$ groups may be replaced by $R^1C=CR^1$, $C\equiv C$, $Si(R^1)_2$, $C=O$, $NR^1$, O, S or $CONR^1$. The alkylene group here may be straight-chain, or an alkylene group having three or more carbon atoms may also be branched or cyclic. In addition, Z may also be an oligomer or polymer.

In a preferred embodiment of the invention, Z is the same or different at each instance and is selected from the group consisting of a single bond and an aromatic or heteroaromatic ring system which has 6 to 24 aromatic ring atoms and may be substituted in each case by one or more $R^1$ radicals. Preferred aromatic and heteroaromatic ring systems are the groups of the following formulae (Z-1) to (Z-8):

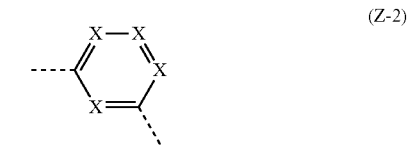

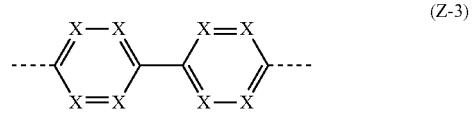

-continued

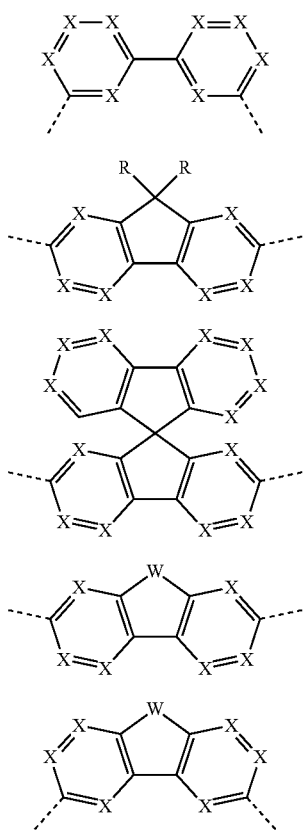

where the dotted bonds indicate the linkage of this group, R has the definitions given above and, in addition:
X is the same or different at each instance and is CR or N;
W is the same or different at each instance and is NR, O or S.

When Z is an —Ar-alkylene- group, an -alkylene-Ar-alkylene- group or an —Aralkylene-Ark- group, Ar in these groups is also the same or different at each instance and is preferably selected from the formulae (Z-1) to (Z-8) depicted above.

Preferably not more than two symbols X in each of the formulae (Z-1) to (Z-8) and more preferably not more than one symbol X per Z group is N, and the other symbols X are CR. More preferably, all symbols X are CR. Particular preference is given, therefore, to the Z groups of the following formulae (Z-1a) to (Z-8a):

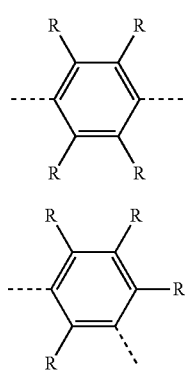

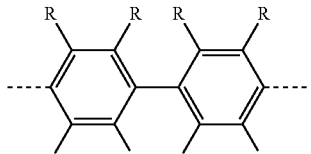

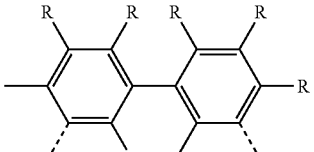

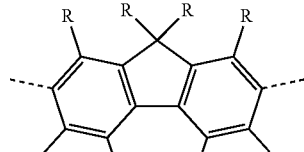

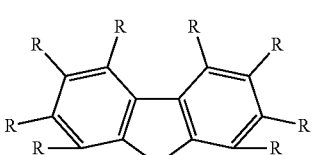

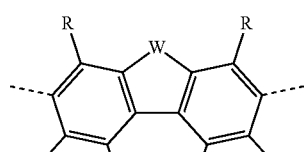

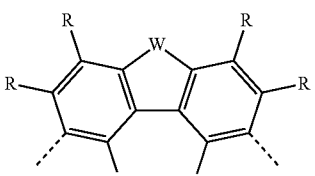

where the symbols used have the definitions given above.

The preferred embodiments for the iridium complex M are described hereinafter. First of all, preferred embodiments of the bridge of the formula (2) or (3) that joins the three bidentate sub-ligands are recited.

Suitable embodiments of the group of the formula (2) are the structures of the following formulae (5) to (8), and suitable embodiments of the group of the formula (3) are the structures of the following formulae (9) to (13):

Formula (5)
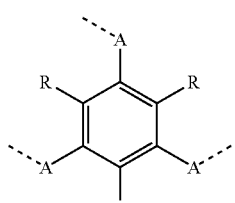

Formula (6)
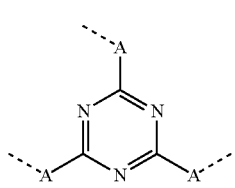

Formula (7)
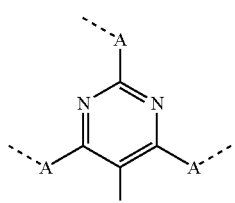

Formula (8)
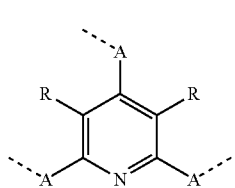

Formula (9)
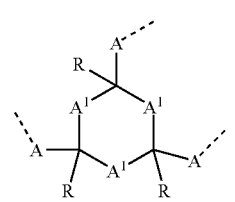

Formula (10)
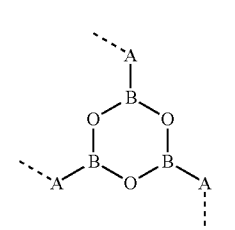

Formula (11)
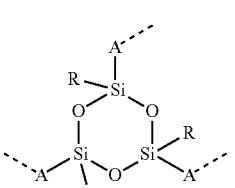

Formula (12)
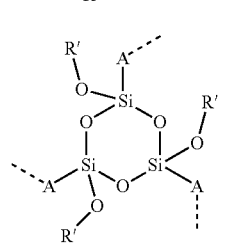

Formula (13)
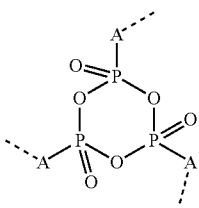

where the symbols have the definitions given above.

Preferred R radicals in formulae (5) to (13) are as follows:

R is the same or different at each instance and is H, D, F, CN, a straight-chain alkyl or alkoxy group having 1 to 10 carbon atoms or an alkenyl group having 2 to 10 carbon atoms or a branched or cyclic alkyl or alkoxy group having 3 to 10 carbon atoms, each of which may be substituted by one or more $R^1$ radicals, or an aromatic or heteroaromatic ring system which has 5 to 24 aromatic ring atoms and may be substituted in each case by one or more $R^1$ radicals;

$R^1$ is the same or different at each instance and is H, D, F, CN, a straight-chain alkyl or alkoxy group having 1 to 10 carbon atoms or an alkenyl group having 2 to 10 carbon atoms or a branched or cyclic alkyl or alkoxy group having 3 to 10 carbon atoms, each of which may be substituted by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic, aromatic and/or heteroaromatic organic radical having 1 to 20 carbon atoms, in which one or more hydrogen atoms may also be replaced by F.

Particularly preferred R radicals in formulae (5) to (13) are as follows:

R is the same or different at each instance and is H, D, F, CN, a straight-chain alkyl group having 1 to 4 carbon atoms or a branched or cyclic alkyl group having 3 to 6 carbon atoms, each of which may be substituted by one or more $R^1$ radicals, or an aromatic or heteroaromatic ring system which has 6 to 12 aromatic ring atoms and may be substituted in each case by one or more $R^1$ radicals;

$R^1$ is the same or different at each instance and is H, D, F, CN, a straight-chain alkyl group having 1 to 4 carbon atoms or a branched or cyclic alkyl group having 3 to 6 carbon atoms, each of which may be substituted by one or more $R^2$ radicals, or an aromatic or heteroaromatic ring system which has 6 to 12 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic or aromatic hydrocarbyl radical having 1 to 12 carbon atoms.

In a preferred embodiment of the invention, all $X^1$ groups in the group of the formula (2) are CR, and so the central trivalent cycle of the formula (2) is a benzene. More preferably, all $X^1$ groups are CH. In a further preferred embodiment of the invention, all $X^1$ groups are a nitrogen atom, and so the central trivalent cycle of the formula (2) is a triazine. Preferred embodiments of the formula (2) are thus the structures of the formulae (5) and (6) depicted above. More preferably, the structure of the formula (5) is a structure of the following formula (5'):

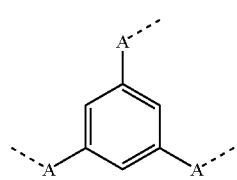

Formula (5')

where the symbols have the definitions given above.

In a further preferred embodiment of the invention, all $A^2$ groups in the group of the formula (3) are CR. More preferably, all $A^2$ groups are CH. Preferred embodiments of the formula (3) are thus the structures of the formula (9) depicted above. More preferably, the structure of the formula (9) is a structure of the following formula (9') or (9"):

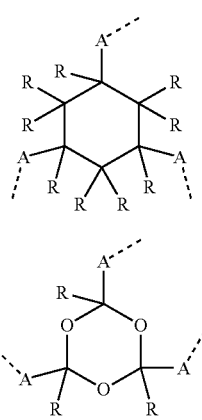

Formula (9')

Formula (9")

where the symbols have the definitions given above and R is preferably H. Particular preference is given here to the group of the formula (9').

When $A^2$ is CR, especially when all $A^2$ are CR, very particularly when, in addition, 0, 1, 2 or 3, especially 3, of the $A^1$ are $CR_2$, the R radicals on $A^2$ may assume different positions depending on the configuration. Preference is given here to small R radicals such as H or D. It is preferable that they are either all directed away from the metal (apical) or all directed inward toward the metal (endohedral). This is illustrated hereinafter by the example of a complex with ester bridges. This is equally true of ortho-arylene, ortho-heteroarylene, 1,2-olefin, imine and amide bridges, irrespective of how the bridge is oriented, i.e. whether the carbonyl group of the ester/amide bridge or the nitrogen atom of the imine bridge binds to the cyclohexane ring or to the aromatic system of the bidentate sub-ligand.

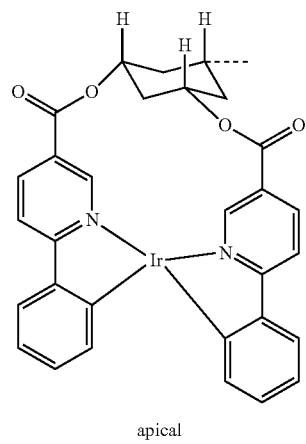

apical

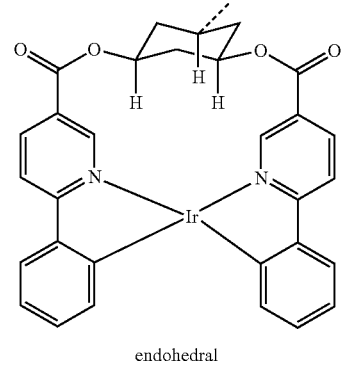

endohedral

For the sake of clarity, the third sub-ligand is not shown, but merely indicated by the dotted bond. Preference is therefore given to complexes that can assume at least one of the two configurations. These are complexes in which all three A groups are arranged equatorially on the central ring.

There follows a description of preferred A groups as occur in the structures of the formulae (2) and (3) and (5) to (13). The A group may be the same or different at each instance and may be an alkenyl group, an amide group, an ester group or an ortho-bonded arylene or heteroarylene group of the formula (4). When A is an alkenyl group, it is a cis-bonded alkenyl group. In the case of unsymmetric A groups, any orientation of the groups is possible. This is shown schematically hereinafter by the example of A=—C(=O)—O—. This gives rise to the following possible orientations of A, all of which are encompassed by the present invention:

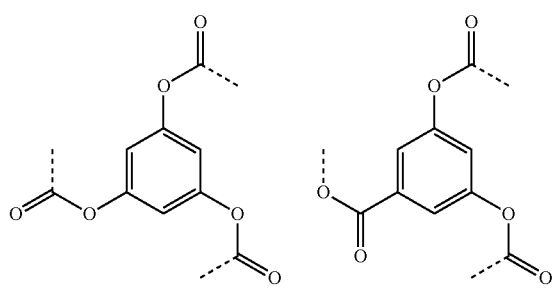

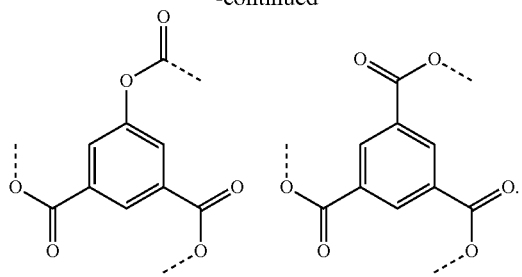

In a preferred embodiment of the invention, A is the same or different, preferably the same, at each instance and is selected from the group consisting of —C(=O)—O—, —C(=O)—NR'— and a group of the formula (4). Further preferably, two A groups are the same and also have the same substitution, and the third A group is different from the first two A groups, or all three A groups are the same and also have the same substitution. Preferred combinations for the three A groups in formulae (2) and (3) and the preferred embodiments are:

| A | A | A |
|---|---|---|
| Formula (4) | Formula (4) | Formula (4) |
| —C(=O)—O— | —C(=O)—O— | —C(=O)—O— |
| —C(=O)—O— | —C(=O)—O— | Formula (4) |
| —C(=O)—O— | Formula (4) | Formula (4) |
| —C(=O)—NR'— | —C(=O)—NR'— | —C(=O)—NR'— |
| —C(=O)—NR'— | —C(=O)—NR'— | Formula (4) |
| —C(=O)—NR'— | Formula (4) | Formula (4) |

It is particularly preferable when all three A groups are groups of the formula (4).

When A is —C(=O)—NR'—, R' is preferably the same or different at each instance and is a straight-chain alkyl group having 1 to 10 carbon atoms or a branched or cyclic alkyl group having 3 to 10 carbon atoms or an aromatic or heteroaromatic ring system which has 6 to 24 aromatic ring atoms and may be substituted in each case by one or more $R^1$ radicals. More preferably, R' is the same or different at each instance and is a straight-chain alkyl group having 1 to 5 carbon atoms or a branched or cyclic alkyl group having 3 to 6 carbon atoms or an aromatic or heteroaromatic ring system which has 6 to 12 aromatic ring atoms and may be substituted in each case by one or more $R^1$ radicals, but is preferably unsubstituted.

Preferred embodiments of the group of the formula (4) are described hereinafter. The group of the formula (4) may represent a heteroaromatic five-membered ring or an aromatic or heteroaromatic six-membered ring. In a preferred embodiment of the invention, the group of the formula (4) contains not more than two heteroatoms in the aromatic or heteroaromatic unit, more preferably not more than one heteroatom. This does not mean that any substituents bonded to this group cannot also contain heteroatoms. In addition, this definition does not mean that formation of rings by substituents cannot give rise to fused aromatic or heteroaromatic structures, for example naphthalene, benzimidazole, etc.

When both $X^3$ groups in formula (4) are carbon atoms, preferred embodiments of the group of the formula (4) are the structures of the following formulae (14) to (30), and, when one $X^3$ group is a carbon atom and the other $X^3$ group in the same cycle is a nitrogen atom, preferred embodiments of the group of the formula (4) are the structures of the following formulae (31) to (38):

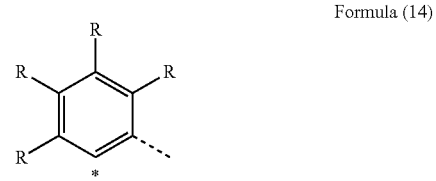

Formula (14)

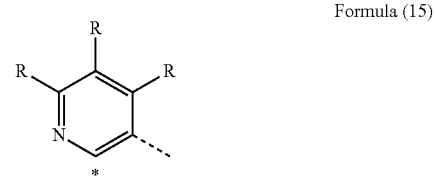

Formula (15)

Formula (16)

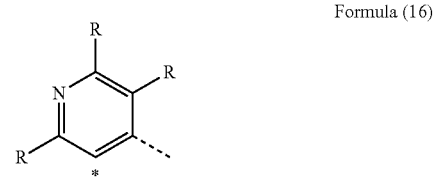

Formula (17)

Formula (18)

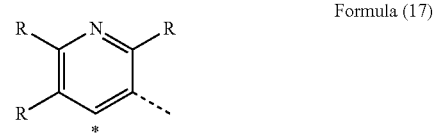

Formula (19)

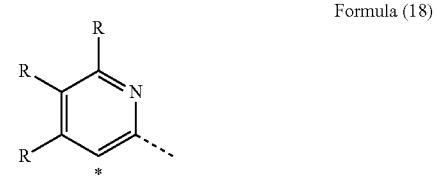

Formula (20)

Formula (21)

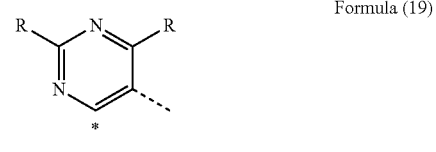

Formula (22)

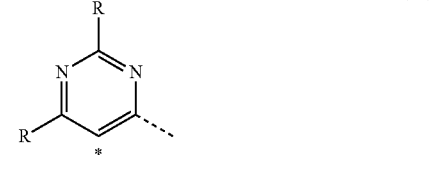

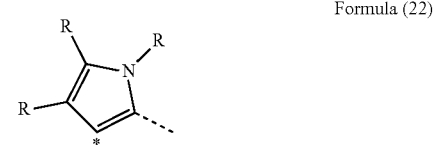

-continued

Formula (23)
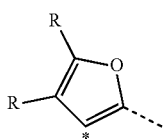

Formula (24)
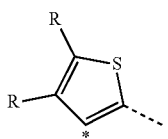

Formula (25)
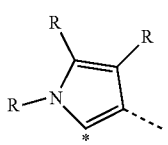

Formula (26)
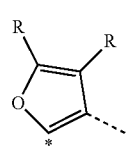

Formula (27)
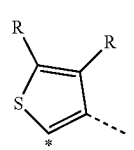

Formula (28)
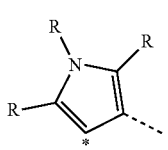

Formula (29)
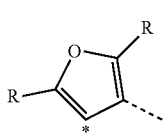

Formula (30)
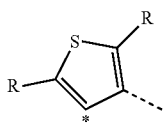

Formula (31)
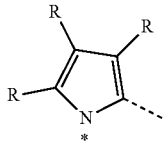

Formula (32)
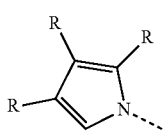

-continued

Formula (33)
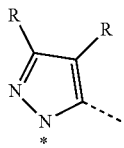

Formula (34)
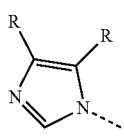

Formula (35)
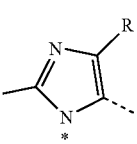

Formula (36)
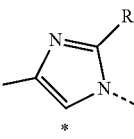

Formula (37)
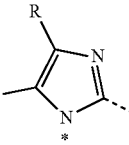

Formula (38)
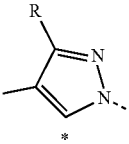

where the symbols have the definitions given above.

Particular preference is given to the six-membered aromatic rings and heteroaromatic rings of the formulae (14) to (18) depicted above. Very particular preference is given to ortho-phenylene, i.e. a group of the abovementioned formula (14), where, especially preferably, all R=H.

At the same time, it is also possible for adjacent R substituents together to form a ring system, such that it is possible to form fused structures, including fused aryl and heteroaryl groups, for example naphthalene, quinoline, benzimidazole, carbazole, dibenzofuran or dibenzothiophene. Such ring formation is shown schematically below in groups of the abovementioned formula (14), which can lead, for example, to groups of the following formulae (14a) to (14j):

Formula (14a)
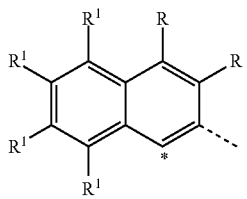

Formula (14b)
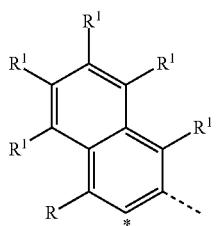

Formula (14b)
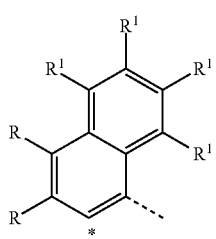

Formula (14d)
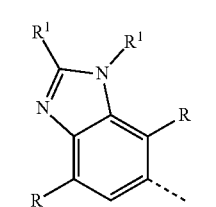

Formula (14e)
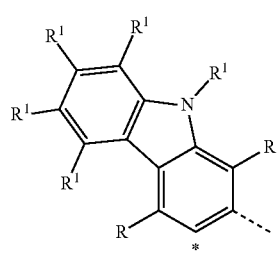

Formula (14f)
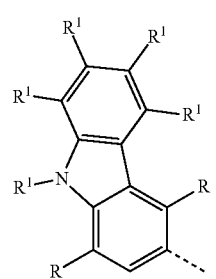

Formula (14g)
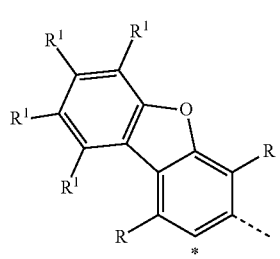

Formula (14h)
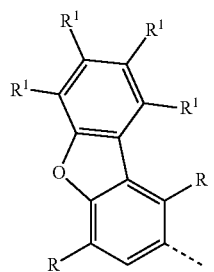

Formula (14i)
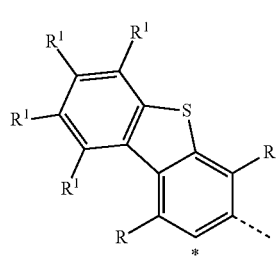

Formula (14j)
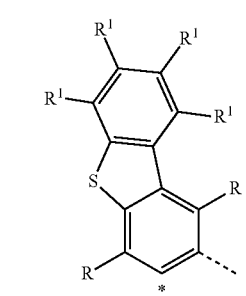

where the symbols have the definitions given above.

In general, the groups fused on may be fused onto any position in the unit of formula (4), as shown by the fused-on benzo group in the formulae (14a) to (14c). The groups as fused onto the unit of the formula (4) in the formulae (14d) to (14j) may therefore also be fused onto other positions in the unit of the formula (4).

The group of the formula (2) can more preferably be represented by the following formulae (2a) to (2m), and the group of the formula (3) can more preferably be represented by the following formulae (3a) to (3m):

Formula (2a)
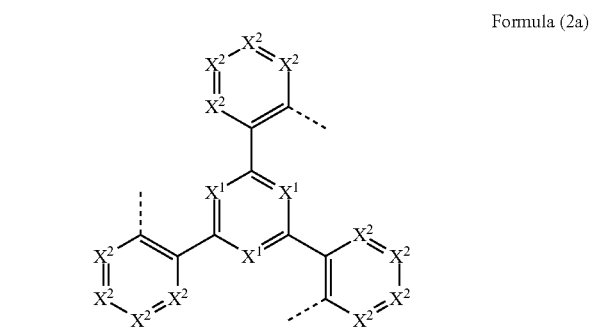

Formula (2b)
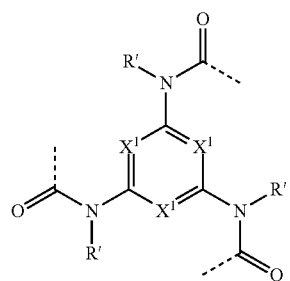
Formula (2c)
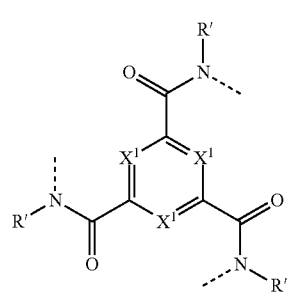
Formula (2d)
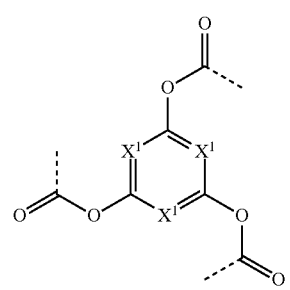
Formula (2e)
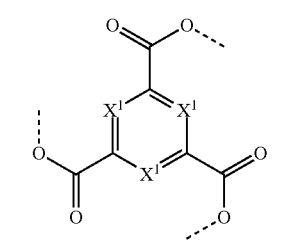
Formula (2f)
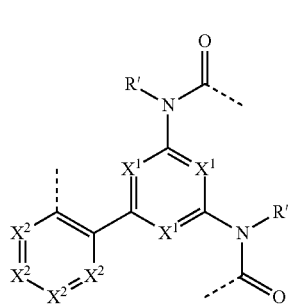
Formula (2g)
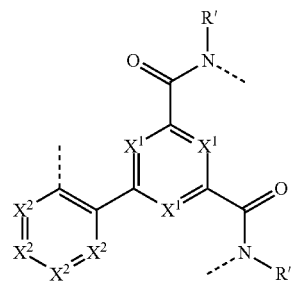
Formula (2h)
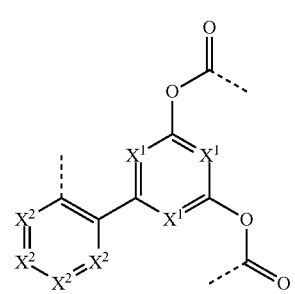
Formula (2i)
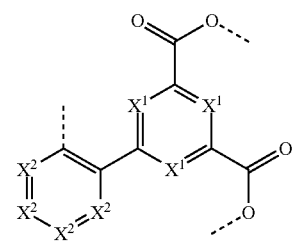
Formula (2j)
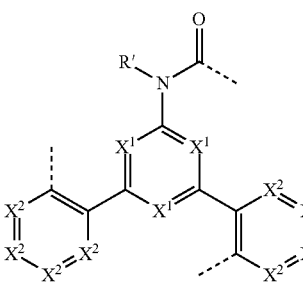
Formula (2k)
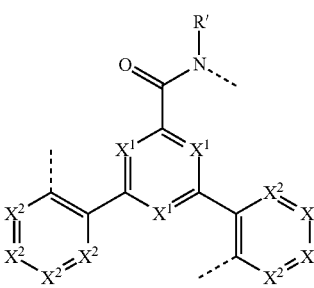

-continued
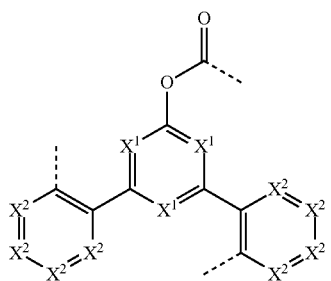
Formula (2l)
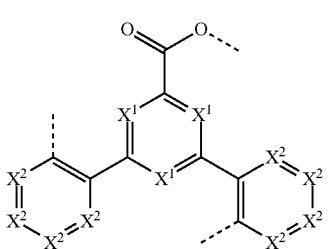
Formula (2m)
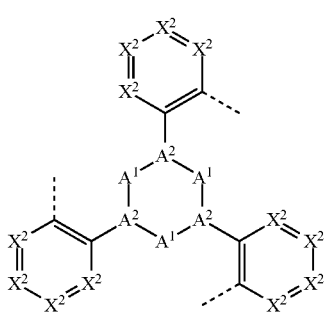
Formula (3a)
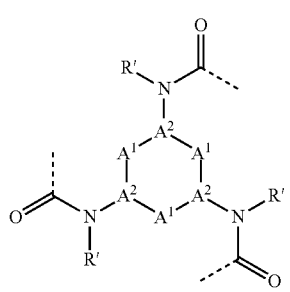
Formula (3b)
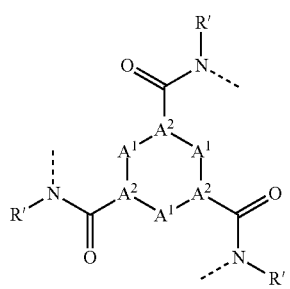
Formula (3c)
-continued
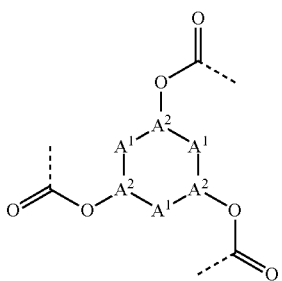
Formula (3d)
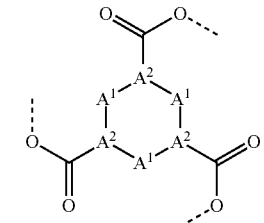
Formula (3e)
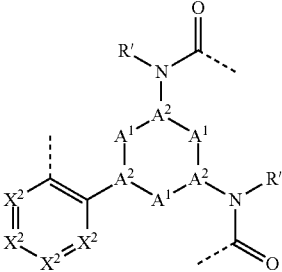
Formula (3f)
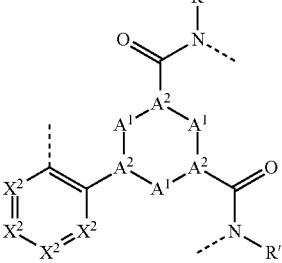
Formula (3g)
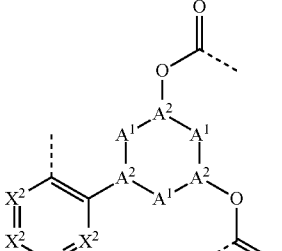
Formula (3h)
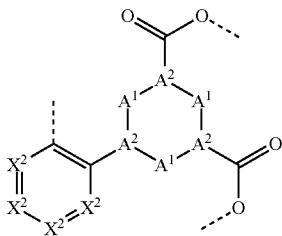
Formula (3i)

Formula (3j)

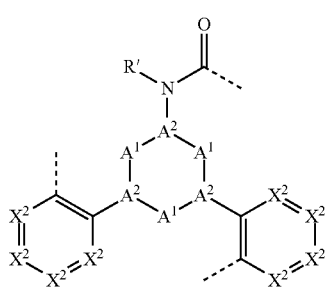

Formula (3k)

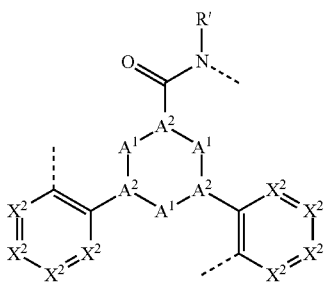

Formula (3l)

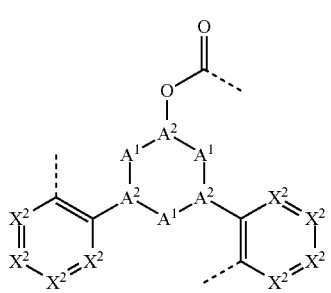

Formula (3m)

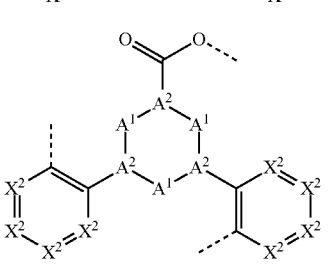

where the symbols have the definitions given above. Preferably, $X^2$ is the same or different at each instance and is CR.

In a preferred embodiment of the invention, the group of the formulae (2a) to (2m) is selected from the groups of the formulae (5a') to (5m'), and the group of the formulae (3a) to (3m) from the groups of the formulae (9a') to (9m'):

Formula (5a')

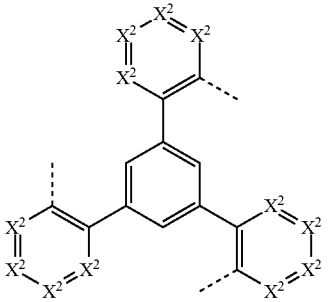

Formula (5b')

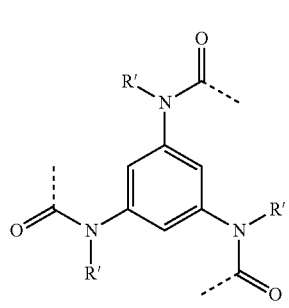

Formula (5c')

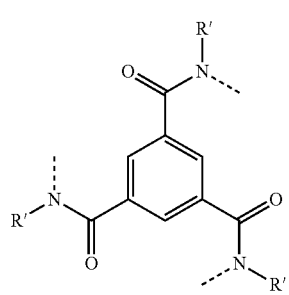

Formula (5d')

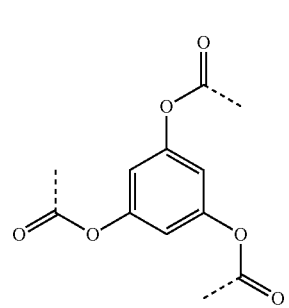

Formula (5e')

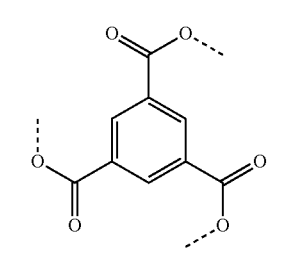

Formula (5f')

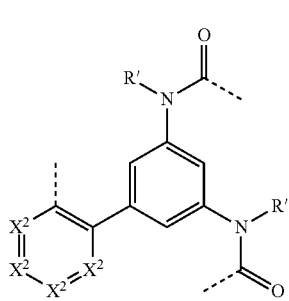

-continued
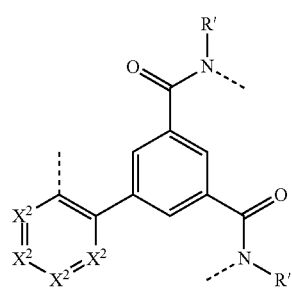
Formula (5g')
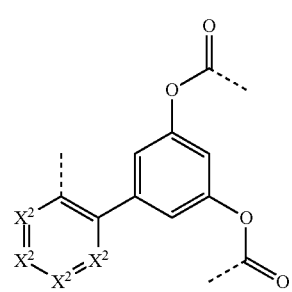
Formula (5h')
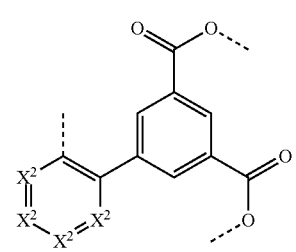
Formula (5i')
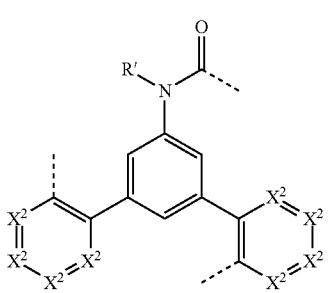
Formula (5j')
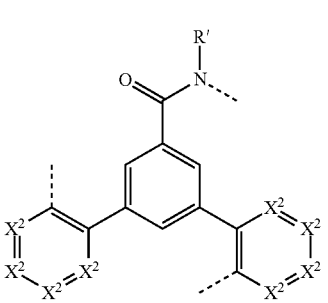
Formula (5k')
-continued
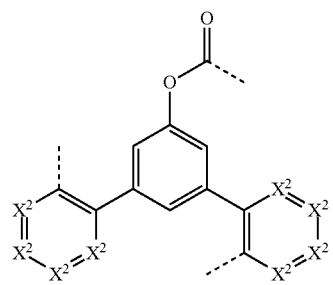
Formula (5l')
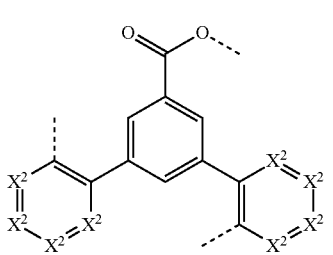
Formula (5m')
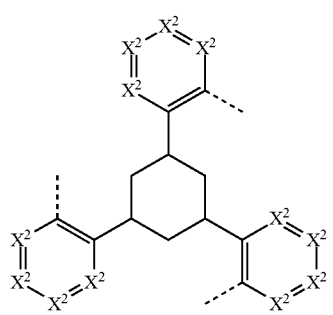
Formula (9a')
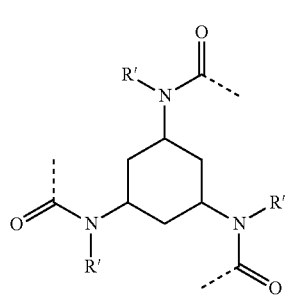
Formula (9b')
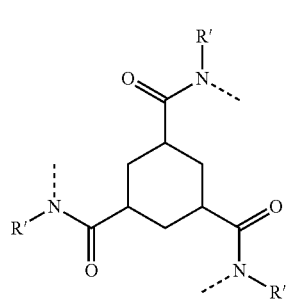
Formula (9c')

Formula (9d')
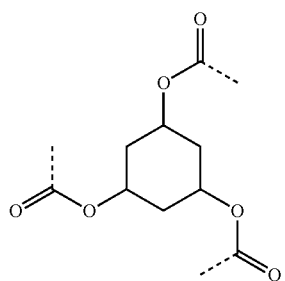
Formula (9e')
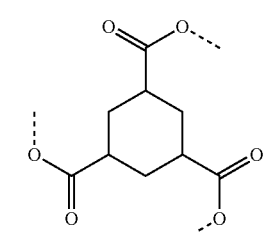
Formula (9f')
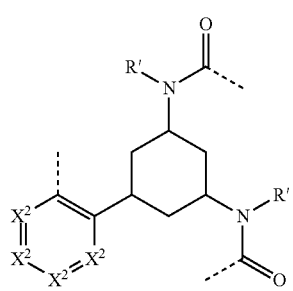
Formula (9g')
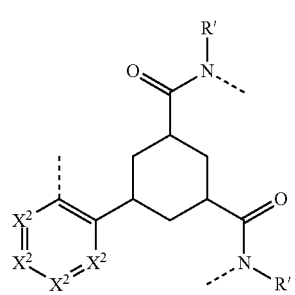
Formula (9h')
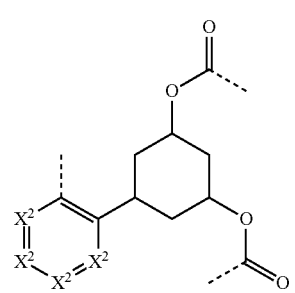
Formula (9i')
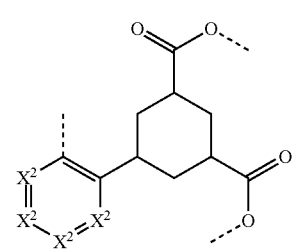
Formula (9j')
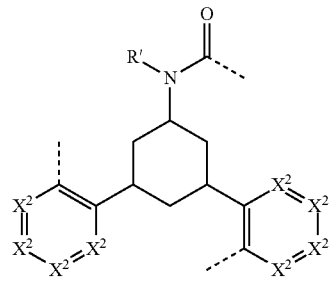
Formula (9k')
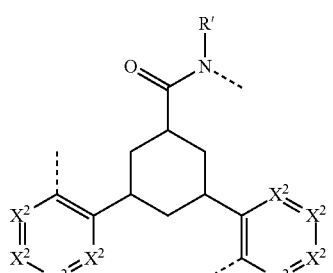
Formula (9l')
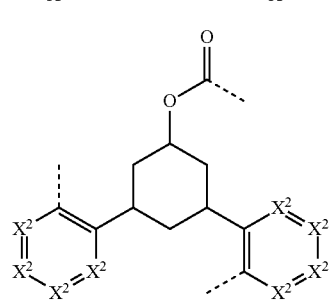
Formula (9m')
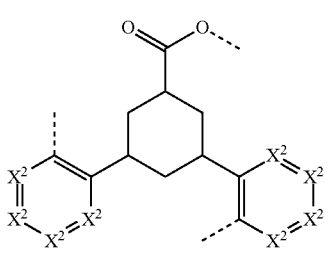
where the symbols have the definitions given above. Preferably, $X^2$ is the same or different at each instance and is CR, especially CH.
A particularly preferred embodiment of the group of the formula (2) is the group of the following formula (5a″):
Formula (5a″)
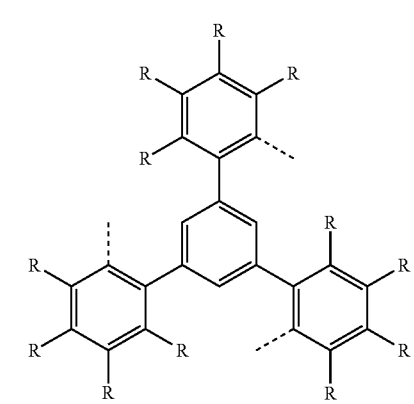

where the symbols have the definitions given above.

More preferably, the R groups in the abovementioned formulae are the same or different and are H, D or an alkyl group having 1 to 4 carbon atoms. Most preferably, R=H. Very particular preference is thus given to the structure of the following formula (5a'''):

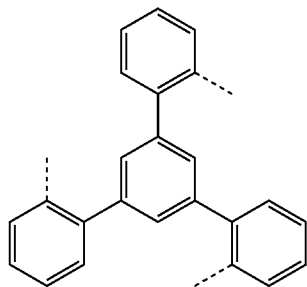

Formula (5a''')

where the symbols have the definitions given above.

There follows a description of the bidentate sub-ligands joined in M to the bridge of the formula (2) or (3) or the abovementioned preferred embodiments.

In a preferred embodiment of the invention, each of the bidentate sub-ligands is monoanionic.

The three bidentate sub-ligands may be the same or different. When the bidentate sub-ligands are the same, they preferably also have the same substitution. When all three bidentate sub-ligands selected are the same, this results in $C_3$-symmetric iridium complexes when the unit of the formula (2) or (3) also has $C_3$ symmetry, which is advantageous in terms of the synthesis of the ligands. However, it may also be advantageous to select the three bidentate sub-ligands differently or to select two identical sub-ligands and a different third sub-ligand, so as to give rise to $C_1$-symmetric metal complexes, because this permits greater possible variation of the ligands, such that the desired properties of the complex, for example the HOMO and LUMO position or the emission colour, can be varied more easily. Moreover, the solubility of the complexes can thus also be improved without having to attach long aliphatic or aromatic solubility-imparting groups. In a preferred embodiment of the invention, either the three bidentate sub-ligands are selected identically or two of the bidentate sub-ligands are selected identically and the third bidentate sub-ligand is different from the first two bidentate sub-ligands.

In a further preferred embodiment of the invention, the coordinating atoms of the bidentate sub-ligands are the same or different at each instance and are selected from C, N, P, O, S and/or B, more preferably C, N and/or O and most preferably C and/or N. The bidentate sub-ligands preferably have one carbon atom and one nitrogen atom or two carbon atoms or two nitrogen atoms or two oxygen atoms or one oxygen atom and one nitrogen atom as coordinating atoms. In this case, the coordinating atoms of each of the three sub-ligands may be the same, or they may be different. Preferably, at least one of the bidentate sub-ligands has one carbon atom and one nitrogen atom or two carbon atoms as coordinating atoms, especially one carbon atom and one nitrogen atom. More preferably at least two of the bidentate sub-ligands and most preferably all three bidentate sub-ligands have one carbon atom and one nitrogen atom or two carbon atoms as coordinating atoms, especially one carbon atom and one nitrogen atom. Particular preference is thus given to an iridium complex in which all three bidentate sub-ligands are ortho-metallated, i.e. form a metallacycle with the iridium in which at least one iridium-carbon bond is present.

It is further preferable when the metallacycle which is formed from the iridium and the bidentate sub-ligand is a five-membered ring, which is preferable particularly when the coordinating atoms are C and N, N and N, or N and O. When the coordinating atoms are O, a six-membered metallacyclic ring may also be preferred. This is shown schematically hereinafter:

 

Five-membered ring    Six-membered ring where N is a coordinating nitrogen atom, C is a coordinating carbon atom and O represents coordinating oxygen atoms, and the carbon atoms shown are atoms of the bidentate ligand.

In a preferred embodiment of the invention, at least one of the bidentate sub-ligands, more preferably at least two of the bidentate sub-ligands, most preferably all three bidentate sub-ligands, are the same or different at each instance and are selected from the structures of the following formulae (L-1), (L-2) and (L-3):

Formula (L-1)

Formula (L-2)

Formula (L-3)

where the dotted bond represents the bond of the sub-ligand to the bridge of the formula (2) or (3) or the preferred embodiments, the sub-ligands are optionally joined to Z and the other symbols used are as follows:

CyC is the same or different at each instance and is a substituted or unsubstituted aryl or heteroaryl group which has 5 to 14 aromatic ring atoms or a substituted or unsubstituted fluorene group, each of which coordinates to the metal via a carbon atom and which is bonded in each case to CyD via a covalent bond;

CyD is the same or different at each instance and is a substituted or unsubstituted heteroaryl group which has 5 to 14 aromatic ring atoms and coordinates to the metal via a nitrogen atom or via a carbene carbon atom and which is bonded to CyC via a covalent bond;

at the same time, two or more of the optional substituents together may form a ring system; in addition, the optional radicals are preferably selected from the abovementioned R radicals.

At the same time, CyD in the sub-ligands of the formulae (L-1) and (L-2) preferably coordinates via an uncharged nitrogen atom or via a carbene carbon atom, especially via an uncharged nitrogen atom. Further preferably, one of the two CyD groups in the ligand of the formula (L-3) coordinates via an uncharged nitrogen atom and the other of the two CyD groups via an anionic nitrogen atom. Further preferably, CyC in the sub-ligands of the formulae (L-1) and (L-2) coordinates via anionic carbon atoms.

When two or more of the substituents, especially two or more R radicals, together form a ring system, it is possible for a ring system to be formed from substituents bonded to directly adjacent carbon atoms. In addition, it is also possible that the substituents on CyC and CyD in the formulae (L-1) and (L-2) or the substituents on the two CyD groups in formula (L-3) together form a ring, as a result of which CyC and CyD or the two CyD groups may also together form a single fused aryl or heteroaryl group as bidentate ligand.

In a preferred embodiment of the present invention, CyC is an aryl or heteroaryl group having 6 to 13 aromatic ring atoms, more preferably having 6 to 10 aromatic ring atoms, most preferably having 6 aromatic ring atoms, especially a phenyl group, which coordinates to the metal via a carbon atom, which may be substituted by one or more R radicals and which is bonded to CyD via a covalent bond.

Preferred embodiments of the CyC group are the structures of the following formulae (CyC-1) to (CyC-20):

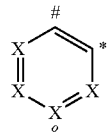
(CyC-1)

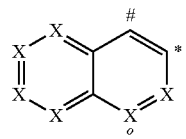
(CyC-2)

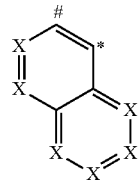
(CyC-3)

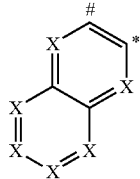
(CyC-4)

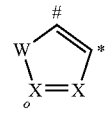
(CyC-5)

-continued

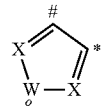
(CyC-6)

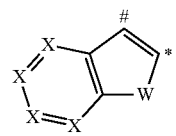
(CyC-7)

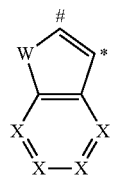
(CyC-8)

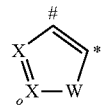
(CyC-9)

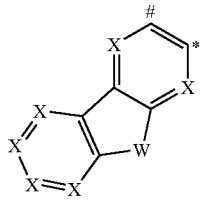
(CyC-10)

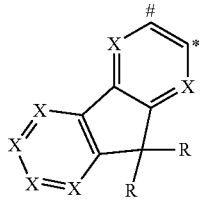
(CyC-11)

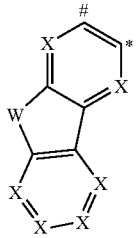
(CyC-12)

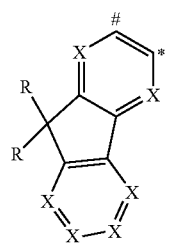
(CyC-13)

(CyC-14) 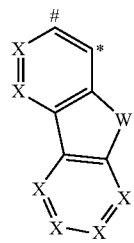

(CyC-15) 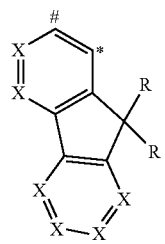

(CyC-16) 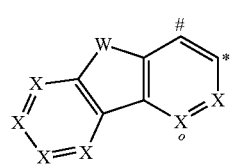

(CyC-17) 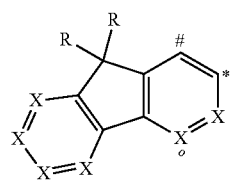

(CyC-18) 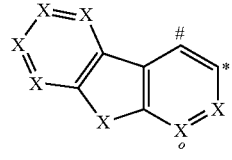

(CyC-19) 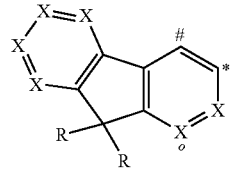

(CyC-20) 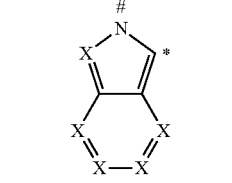

where CyC binds in each case to the position in CyD indicated by # and coordinates to the metal at the position indicated by *, R has the definitions given above and the further symbols used are as follows:

X is the same or different at each instance and is CR or N, with the proviso that not more than two symbols X per cycle are N;

W is NR, O or S, with the proviso that, when the bridge of the formula (2) or (3) or the preferred embodiments is bonded to CyC, one symbol X is C and the bridge of the formula (2) or (3) or the preferred embodiments is bonded to this carbon atom, and additionally with the proviso that, when Z is bonded to CyC, one symbol X is C and Z is bonded to this carbon atom. When the CyC group is bonded to the bridge of the formula (2) or (3) or the preferred embodiments, the bond is preferably via the position marked by "o" in the formulae depicted above, and so the symbol X marked by "o" in that case is preferably C. The above-depicted structures which do not contain any symbol X marked by "o" are preferably not bonded directly to the bridge of the formula (2) or (3) or the preferred embodiments, since such a bond to the bridge is not advantageous for steric reasons.

Preferably not more than one symbol X in CyC is N, and more preferably all symbols X are CR, with the proviso that, when the bridge of the formula (2) or (3) or the preferred embodiments is bonded to CyC, one symbol X is C and the bridge of the formula (2) or (3) or the preferred embodiments is bonded to this carbon atom, and that, when Z is bonded to CyC, one symbol X is C and Z is bonded to this carbon atom.

Particularly preferred CyC groups are the groups of the following formulae (CyC-1a) to (CyC-20a):

(CyC-1a) 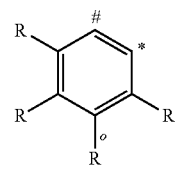

(CyC-1b) 

(CyC-1c) 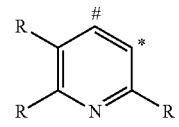

(CyC-1d) 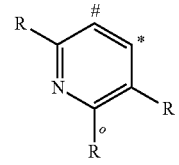

(CyC-1e) 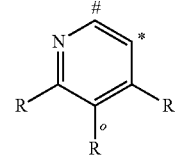

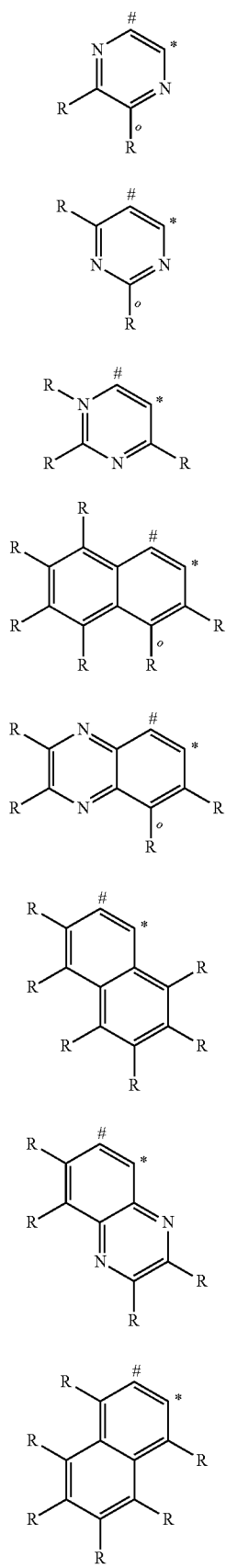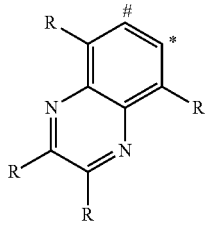

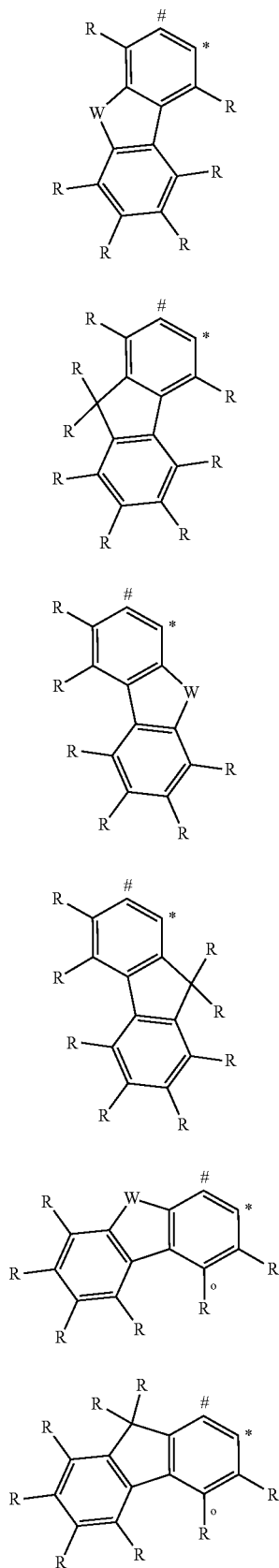

(CyC-12a)
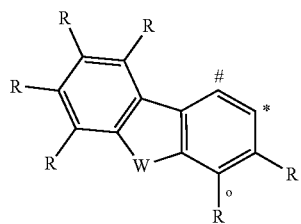

(CyC-18a)

(CyC-13a)
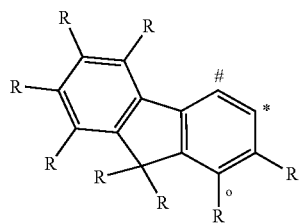

(CyC-19a)

(CyC-14a)
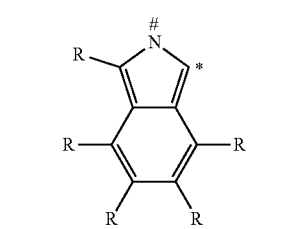

(CyC-20a)

(CyC-15a)
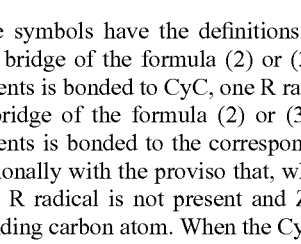

(CyC-16a)

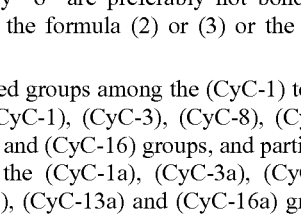

(CyC-17a)

where the symbols have the definitions given above and, when the bridge of the formula (2) or (3) or the preferred embodiments is bonded to CyC, one R radical is not present and the bridge of the formula (2) or (3) or the preferred embodiments is bonded to the corresponding carbon atom, and additionally with the proviso that, when Z is bonded to CyC, one R radical is not present and Z is bonded to the corresponding carbon atom. When the CyC group is bonded to the bridge of the formula (2) or (3) or the preferred embodiments, the bond is preferably via the position marked by "o" in the formulae depicted above, and so the R radical in this position in that case is preferably absent. The above-depicted structures which do not contain any carbon atom marked by "o" are preferably not bonded directly to the bridge of the formula (2) or (3) or the preferred embodiments.

Preferred groups among the (CyC-1) to (CyC-20) groups are the (CyC-1), (CyC-3), (CyC-8), (CyC-10), (CyC-12), (CyC-13) and (CyC-16) groups, and particular preference is given to the (CyC-1a), (CyC-3a), (CyC-8a), (CyC-10a), (CyC-12a), (CyC-13a) and (CyC-16a) groups.

In a further preferred embodiment of the invention, CyD is a heteroaryl group 5 to 13 aromatic ring atoms, more preferably having 6 to 10 aromatic ring atoms, which coordinates to the metal via an uncharged nitrogen atom or via a carbene carbon atom and which may be substituted by one or more R radicals and which is bonded via a covalent bond to CyC.

Preferred embodiments of the CyD group are the structures of the following formulae (CyD-1) to (CyD-14):

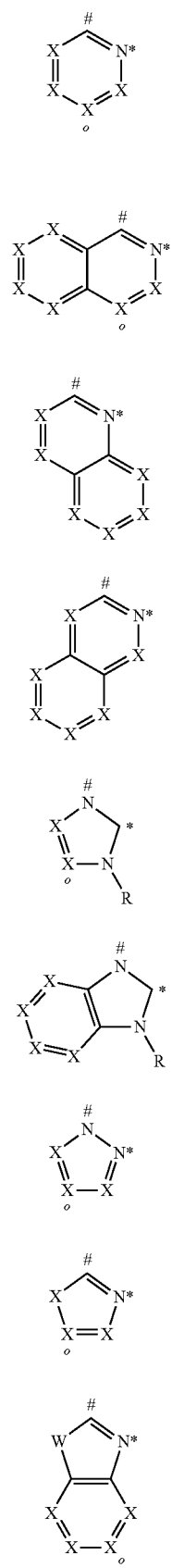

(CyD-1)
(CyD-2)
(CyD-3)
(CyD-4)
(CyD-5)
(CyD-6)
(CyD-7)
(CyD-8)
(CyD-9)

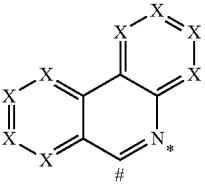

(CyD-10)

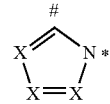

(CyD-11)

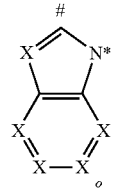

(CyD-12)

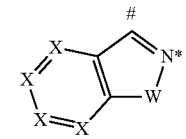

(CyD-13)

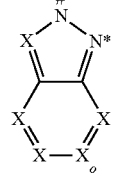

(CyD-14)

where the CyD group binds in each case to the position in CyC indicated by # and coordinates to the metal at the position indicated by *, and where X, W and R have the definitions given above, with the proviso that, when the bridge of the formula (2) or (3) or the preferred embodiments is bonded to CyD, one symbol X is C and the bridge of the formula (2) or (3) or the preferred embodiments is bonded to this carbon atom, and additionally with the proviso that, when Z is bonded to CyD, one symbol X is C and Z is bonded to this carbon atom. When the CyD group is bonded to the bridge of the formula (2) or (3) or the preferred embodiments, the bond is preferably via the position marked by "o" in the formulae depicted above, and so the symbol X marked by "o" in that case is preferably C. The above-depicted structures which do not contain any symbol X marked by "o" are preferably not bonded directly to the bridge of the formula (2) or (3) or the preferred embodiments, since such a bond to the bridge is not advantageous for steric reasons.

In this case, the (CyD-1) to (CyD-4), (CyD-7) to (CyD-10), (CyD-13) and (CyD-14) groups coordinate to the metal via an uncharged nitrogen atom, the (CyD-5) and (CyD-6) groups via a carbene carbon atom and the (CyD-11) and (CyD-12) groups via an anionic nitrogen atom.

Preferably not more than one symbol X in CyD is N, and more preferably all symbols X are CR, with the proviso that, when the bridge of the formula (2) or (3) or the preferred embodiments is bonded to CyD, one symbol X is C and the bridge of the formula (2) or (3) or the preferred embodiments is bonded to this carbon atom. In addition, when Z is bonded to CyD, one symbol X is C and Z is bonded to this carbon atom.
Particularly preferred CyD groups are the groups of the following formulae (CyD-1a) to (CyD-14b):
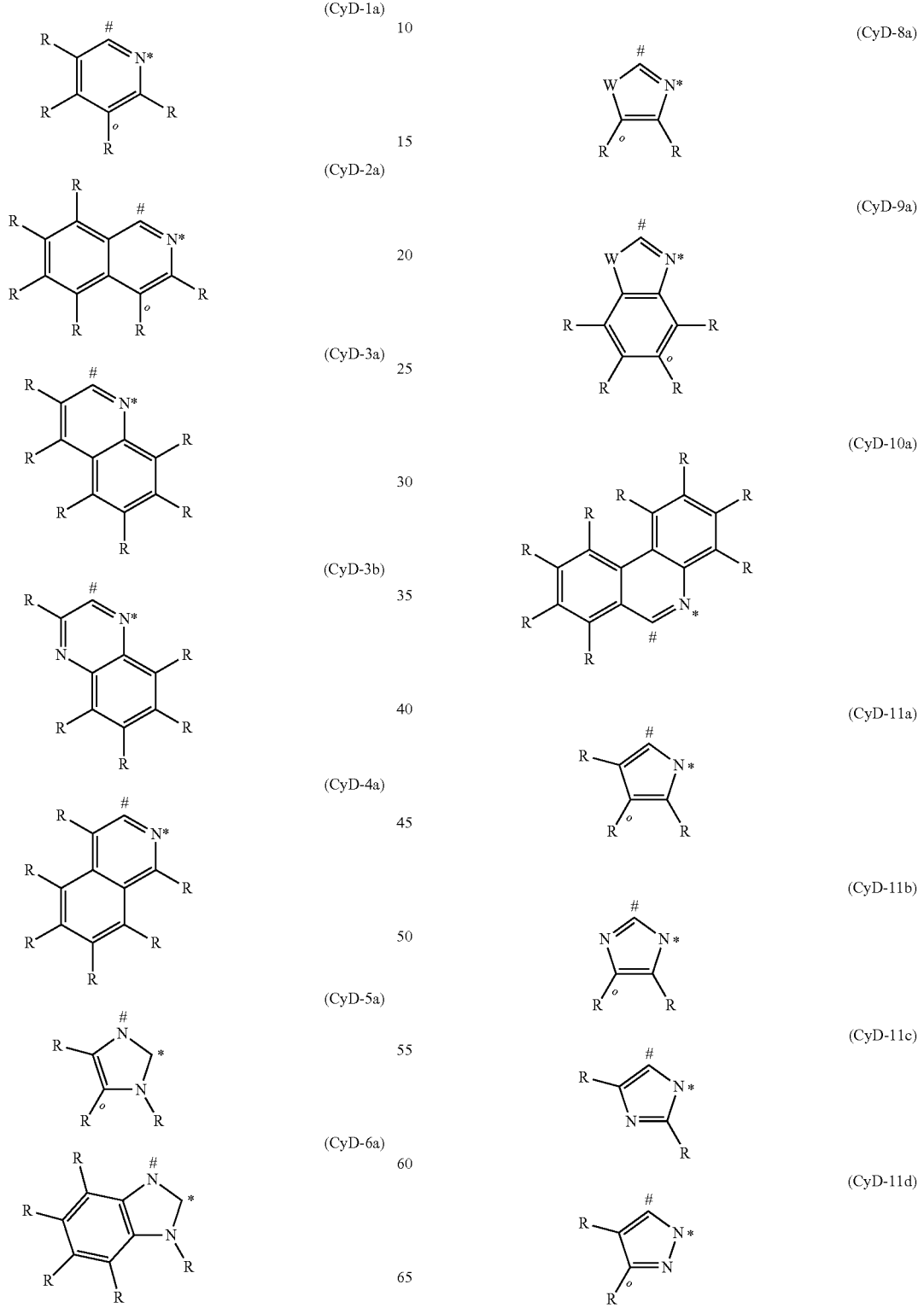

-continued

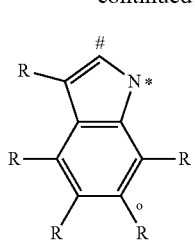
(CyD-12a)

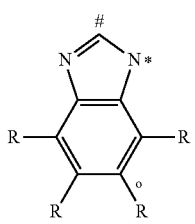
(CyD-12b)

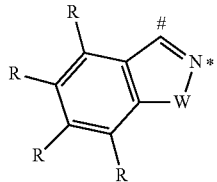
(CyD-13a)

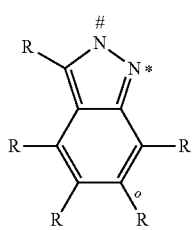
(CyD-14a)

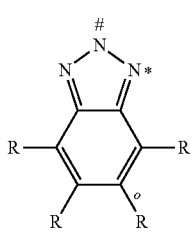
(CyD-14b)

where the symbols used have the definitions given above and, when the bridge of the formula (2) or (3) or the preferred embodiments is bonded to CyD, one R radical is not present and the bridge of the formula (2) or (3) or the preferred embodiments is bonded to the corresponding carbon atom, and additionally with the proviso that, when Z is bonded to CyD, one R radical is not present and Z is bonded to the corresponding carbon atom. When the CyD group is bonded to the bridge of the formula (2) or (3) or the preferred embodiments, the bond is preferably via the position marked by "o" in the formulae depicted above, and so the R radical in this position in that case is preferably absent. The above-depicted structures which do not contain any carbon atom marked by "o" are preferably not bonded directly to the bridge of the formula (2) or (3) or the preferred embodiments. In addition, when Z is bonded to CyD, one position is not substituted by an R radical and Z is bonded to this carbon atom.

Preferred groups among the (CyD-1) to (CyD-14) groups are the (CyD-1), (CyD-2), (CyD-3), (CyD-4), (CyD-5) and (CyD-6) groups, especially (CyD-1), (CyD-2) and (CyD-3), and particular preference is given to the (CyD-1a), (CyD-2a), (CyD-3a), (CyD-4a), (CyD-5a) and (CyD-6a) groups, especially (CyD-1a), (CyD-2a) and (CyD-3a).

In a preferred embodiment of the present invention, CyC is an aryl or heteroaryl group having 6 to 13 aromatic ring atoms, and at the same time CyD is a heteroaryl group having 5 to 13 aromatic ring atoms. More preferably, CyC is an aryl or heteroaryl group having 6 to 10 aromatic ring atoms, and at the same time CyD is a heteroaryl group having 5 to 10 aromatic ring atoms. Most preferably, CyC is an aryl or heteroaryl group having 6 aromatic ring atoms, especially phenyl, and CyD is a heteroaryl group having 6 to 10 aromatic ring atoms. At the same time, CyC and CyD may be substituted by one or more R radicals.

The abovementioned preferred (CyC-1) to (CyC-20) and (CyD-1) to (CyD-14) groups may be combined with one another as desired in the sub-ligands of the formulae (L-1) and (L-2), provided that at least one of the CyC or CyD groups has a suitable attachment site to the bridge of the formula (2) or (3) or the preferred embodiments, suitable attachment sites being signified by "o" in the formulae given above. It is especially preferable when the CyC and CyD groups specified above as particularly preferred, i.e. the groups of the formulae (CyC-1a) to (CyC-20a) and the groups of the formulae (CyD1-a) to (CyD-14b), are combined with one another, provided that at least one of the preferred CyC or CyD groups has a suitable attachment site to the bridge of the formula (2) or (3) or the preferred embodiments, suitable attachment sites being signified by "o" in the formulae given above. Combinations in which neither CyC nor CyD has such a suitable attachment site for the bridge of the formula (2) or (3) or the preferred embodiments are therefore not preferred.

It is very particularly preferable when one of the (CyC-1), (CyC-3), (CyC-8), (CyC-10), (CyC-12), (CyC-13) and (CyC-16) groups and especially the (CyC-1a), (CyC-3a), (CyC-8a), (CyC-10a), (CyC-12a), (CyC-13a) and (CyC-16a) groups is combined with one of the (CyD-1), (CyD-2) and (CyD-3) groups and especially with one of the (CyD-1a), (CyD-2a) and (CyD-3a) groups.

Preferred sub-ligands (L-1) are the structures of the following formulae (L-1-1) and (L-1-2), and preferred sub-ligands (L-2) are the structures of the following formulae (L-2-1) to (L-2-3):

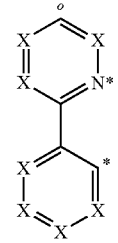
(L-1-1)

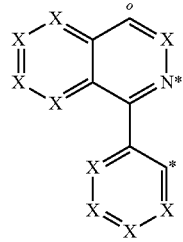
(L-1-2)

(L-2-1)
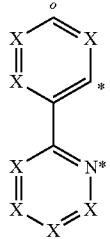

(L-2-2)
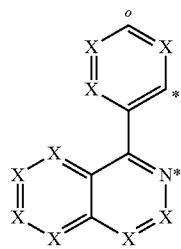

(L-2-3)
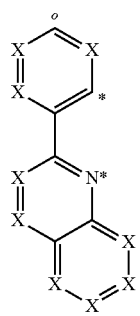

where the symbols used have the definitions given above, * indicates the position of coordination to the iridium and "o" represents the position of the bond to the bridge of the formula (2) or (3) or the preferred embodiments, and with the proviso that, when Z is bonded to the sub-ligand, one symbol X is C and Z is bonded to this carbon atom.

Particularly preferred sub-ligands (L-1) are the structures of the following formulae (L-1-1a) and (L-1-2b), and particularly preferred sub-ligands (L-2) are the structures of the following formulae (L-2-1a) to (L-2-3a):

(L-1-1a)
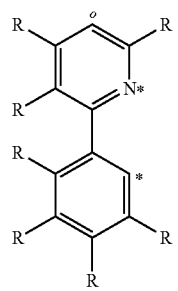

(L-1-2a)

![Structure L-1-2a]

(L-2-1a)

![Structure L-2-1a]

(L-2-2a)

![Structure L-2-2a]

(L-2-3a)

![Structure L-2-3a]

where the symbols used have the definitions given above and "o" represents the position of the bond to the bridge of the formula (2) or (3) or the preferred embodiments, and with the proviso that, when Z is bonded to the sub-ligand, one R radical is not present and Z is bonded to this carbon atom.

It is likewise possible for the abovementioned preferred CyD groups in the sub-ligands of the formula (L-3) to be combined with one another as desired, it being preferable to combine an uncharged CyD group, i.e. a (CyD-1) to (CyD-10), (CyD-13) or (CyD-14) group, with an anionic CyD group, i.e. a (CyD-11) or (CyD-12) group, provided that at least one of the preferred CyD groups has a suitable attachment site to the bridge of the formula (2) or (3) or the preferred embodiments, suitable attachment sites being signified by "o" in the formulae given above.

When two R radicals, one of them bonded to CyC and the other to CyD in the formulae (L-1) and (L-2) or one of them bonded to one CyD group and the other to the other CyD group in formula (L-3), form an aromatic ring system with one another, this may result in bridged sub-ligands and also in sub-ligands which represent a single larger heteroaryl group overall, for example benzo[h]quinoline, etc. The ring formation between the substituents on CyC and CyD in the formulae (L-1) and (L-2) or between the substituents on the two CyD groups in formula (L-3) is preferably via a group according to one of the following formulae (39) to (48):

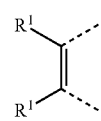
Formula (39)

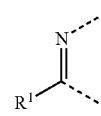
Formula (40)

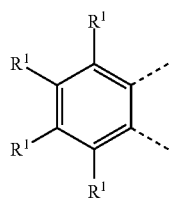
Formula (41)

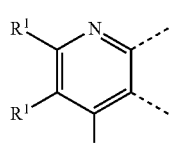
Formula (42)

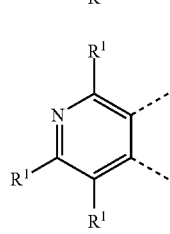
Formula (43)

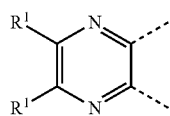
Formula (44)

Formula (45)

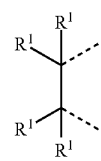
Formula (46)

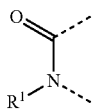
Formula (47)

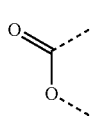
Formula (48)

where $R^1$ has the definitions given above and the dotted bonds signify the bonds to CyC or CyD. At the same time, the unsymmetric groups among those mentioned above may be incorporated in each of the two possible orientations; for example, in the group of the formula (48), the oxygen atom may bind to the CyC group and the carbonyl group to the CyD group, or the oxygen atom may bind to the CyD group and the carbonyl group to the CyC group. In addition, Z may also bind to these groups.

At the same time, the group of the formula (45) is preferred particularly when this results in ring formation to give a six-membered ring, as shown below, for example, by the formulae (L-22) and (L-23).

Preferred ligands which arise through ring formation between two R radicals in the different cycles are the structures of the formulae (L-4) to (L-31) shown below:

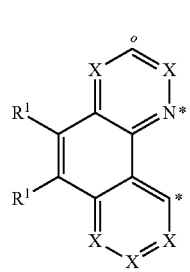
(L-4)

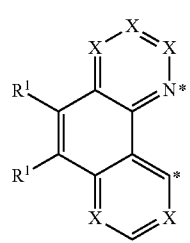
(L-5)

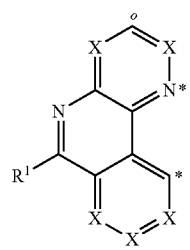
(L-6)

-continued
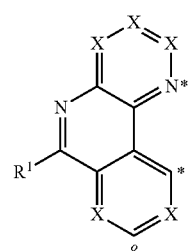
(L-7)
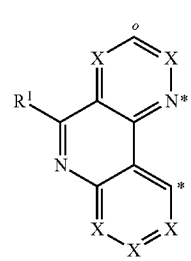
(L-8)
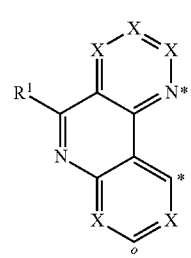
(L-9)
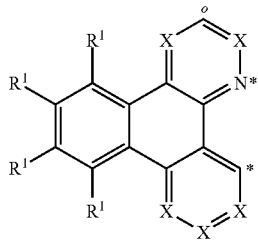
(L-10)
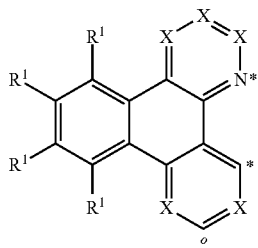
(L-11)
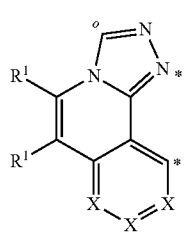
(L-12)
-continued
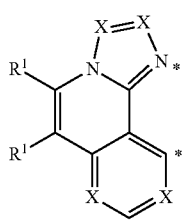
(L-13)
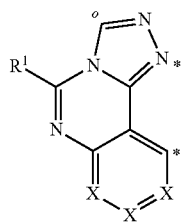
(L-14)
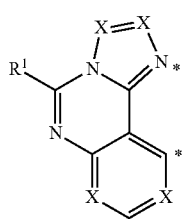
(L-15)
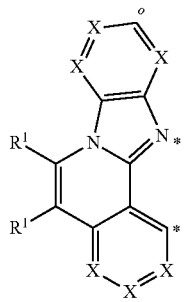
(L-16)
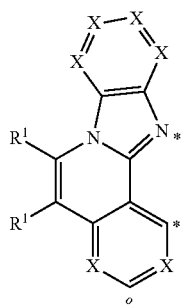
(L-17)

(L-18)
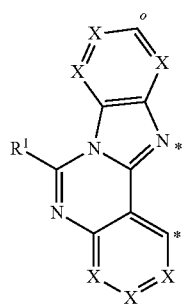
(L-19)
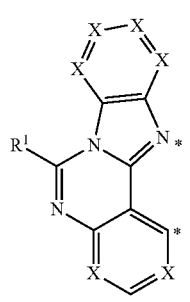
(L-20)
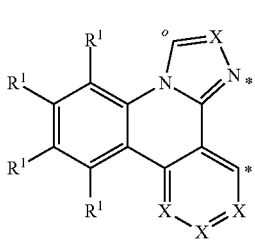
(L-21)
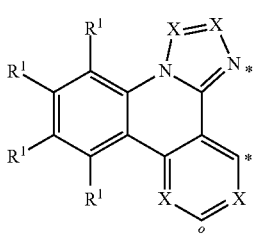
(L-22)
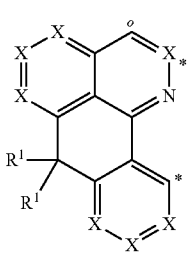
(L-23)
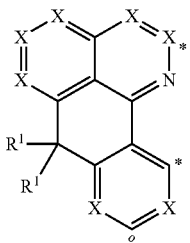
(L-24)
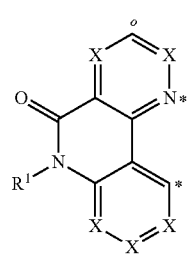
(L-25)
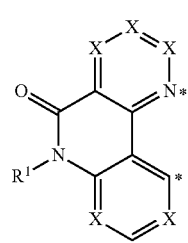
(L-26)
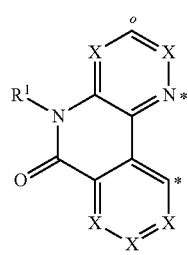
(L-27)
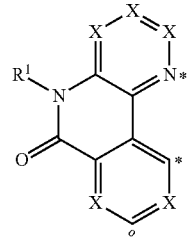
(L-28)
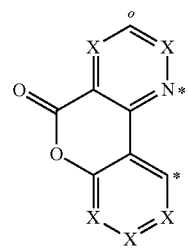
(L-29)
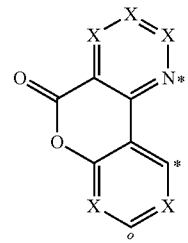

(L-30)

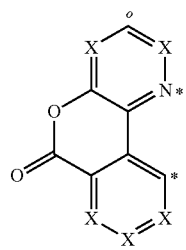

(L-31)

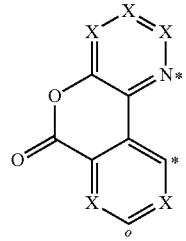

where the symbols used have the definitions given above and "o" indicates the position where this sub-ligand is bonded to the group of the formula (2) or (3) or the preferred embodiments, and with the proviso that, when Z is bonded to this sub-ligand, one symbol X is C and Z is bonded to this carbon atom.

In a preferred embodiment of the sub-ligands of the formulae (L-4) to (L-31), overall, one symbol X is N and the other symbols X are CR, or all symbols X are CR, with the proviso that, when Z is bonded to this sub-ligand, one symbol X is C and Z is bonded to this carbon atom.

In a further embodiment of the invention, it is preferable if, in the groups (CyC-1) to (CyC-20) or (CyD-1) to (CyD-14) or in the sub-ligands (L-1-1) to (L-2-3), (L-4) to (L-31), one of the atoms X is N when an R group bonded as a substituent adjacent to this nitrogen atom is not hydrogen or deuterium. This applies analogously to the preferred structures (CyC-1a) to (CyC-20a) or (CyD-1a) to (CyD-14b) in which a substituent bonded adjacent to a non-coordinating nitrogen atom is preferably an R group which is not hydrogen or deuterium. This substituent R is preferably a group selected from $CF_3$, $OCF_3$, alkyl or alkoxy groups having 1 to 10 carbon atoms, especially branched or cyclic alkyl or alkoxy groups having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

A further suitable bidentate sub-ligand is the sub-ligand of the following formula (L-32) or (L-33)

(L-32)

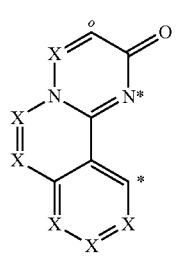

(L-33)

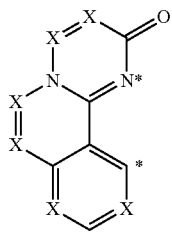

where R has the definitions given above, * represents the position of coordination to the metal, "o" represents the position of linkage of the sub-ligand to the group of the formulae (2) or (3) or the preferred embodiments and the other symbols used are as follows:

X is the same or different at each instance and is CR or N, with the proviso that not more than one symbol X per cycle is N, and with the additional proviso that one symbol X is C and the group of the formula (2) or (3) or the preferred embodiments are bonded to this carbon atom, and with the additional proviso that, when Z is bonded to this sub-ligand, one symbol X is C and Z is bonded to this carbon atom.

When two R radicals bonded to adjacent carbon atoms in the sub-ligands (L-32) and (L-33) form an aromatic cycle with one another, this cycle together with the two adjacent carbon atoms is preferably a structure of the following formula (49):

Formula (49)

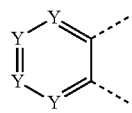

where the dotted bonds symbolize the linkage of this group within the sub-ligand and Y is the same or different at each instance and is $CR^1$ or N and preferably not more than one symbol Y is N. In addition, Z may also be bonded to this group.

In a preferred embodiment of the sub-ligand (L-32) or (L-33), not more than one group of the formula (49) is present. The sub-ligands are thus preferably sub-ligands of the following formulae (L-34) to (L-39):

(L-34)

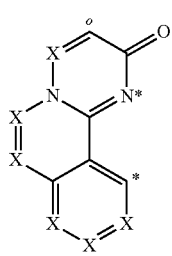

-continued

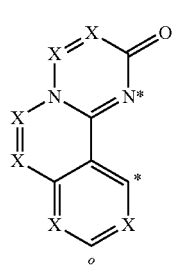
(L-35)

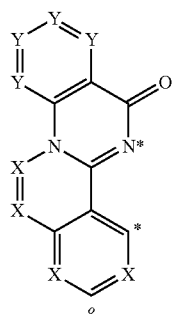
(L-36)

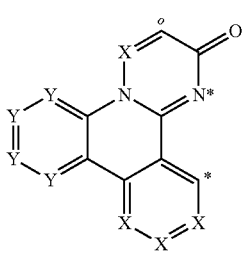
(L-37)

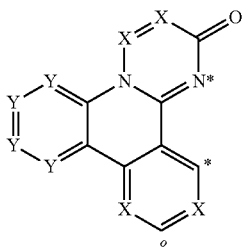
(L-38)

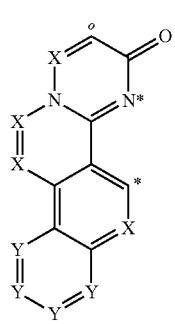
(L-39)

where X is the same or different at each instance and is CR or N, but the R radicals together do not form an aromatic or heteroaromatic ring system and the further symbols have the definitions given above, with the proviso that, when Z is bonded to this sub-ligand, one symbol X is C and Z is bonded to this carbon atom.

In a preferred embodiment of the invention, in the sub-ligand of the formulae (L-32) to (L-39), a total of 0, 1 or 2 of the symbols X and, if present, Y are N. More preferably, a total of 0 or 1 of the symbols X and, if present, Y are N.

Preferred embodiments of the formulae (L-34) to (L-39) are the structures of the following formulae (L-34a) to (L-39f):

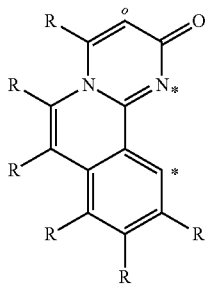
(L-34a)

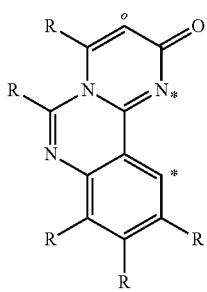
(L-34b)

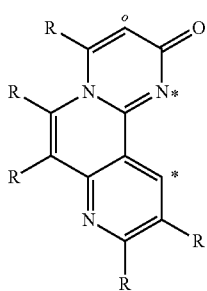
(L-34c)

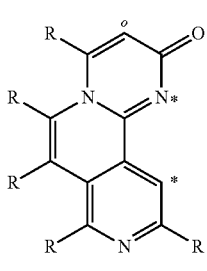
(L-34d)

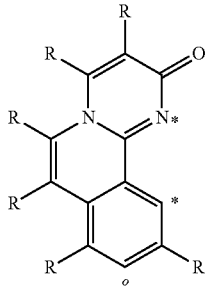
(L-35a)

(L-35b)
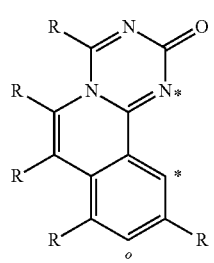
(L-35c)
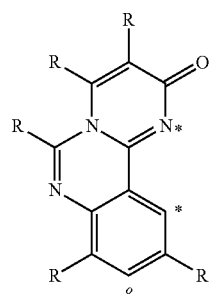
(L-35d)
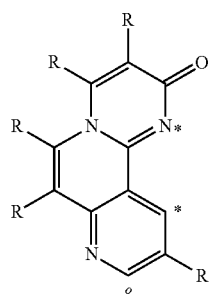
(L-36a)
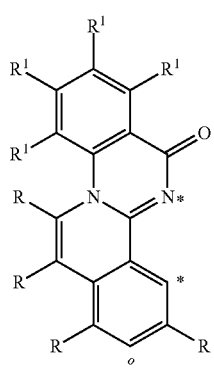
(L-36b)
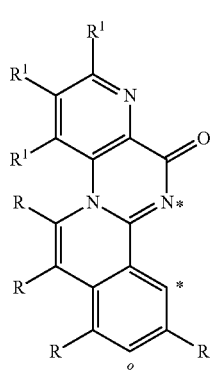
(L-36c)
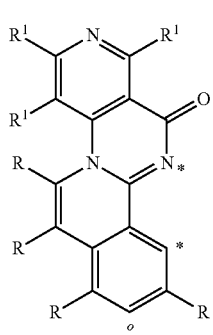
(L-36d)
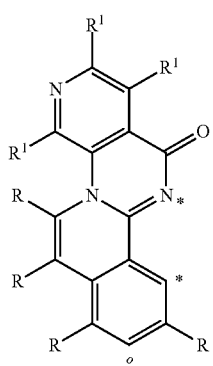
(L-36e)
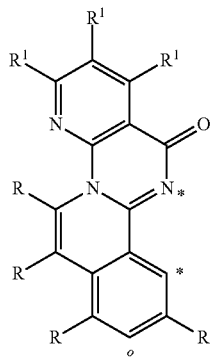
(L-36f)
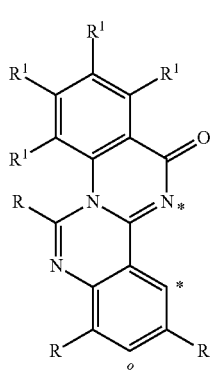

-continued
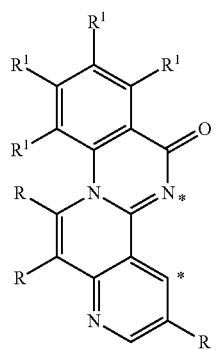
(L-36g)
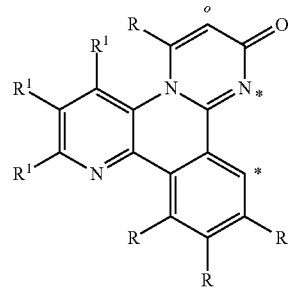
(L-37e)
(L-37a)
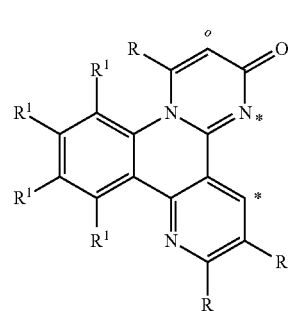
(L-37f)
(L-37b)
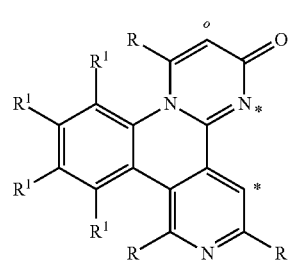
(L-37g)
(L-37c)
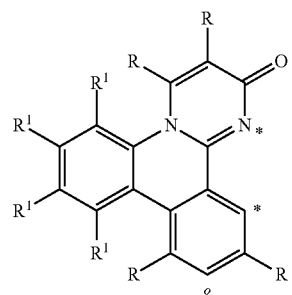
(L-38a)
(L-37d)
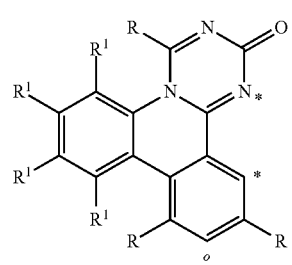
(L-38b)

-continued
(L-38c)
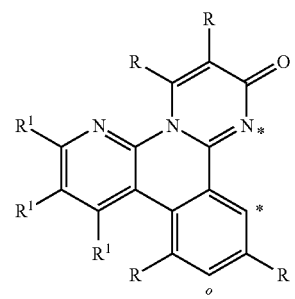
(L-38d)
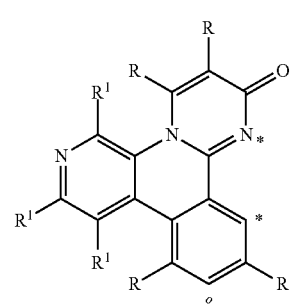
(L-38e)
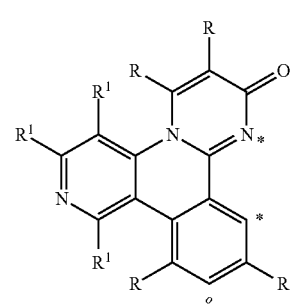
(L-38f)
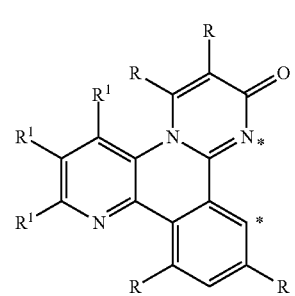
(L-38g)
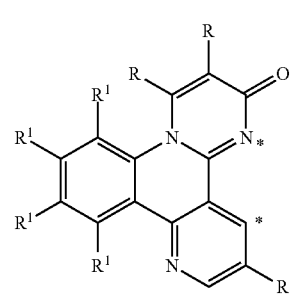
-continued
(L-39a)
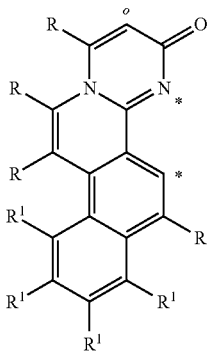
(L-39b)
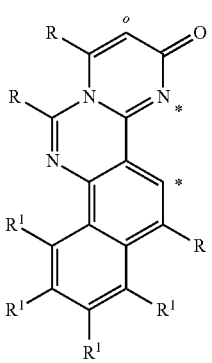
(L-39c)
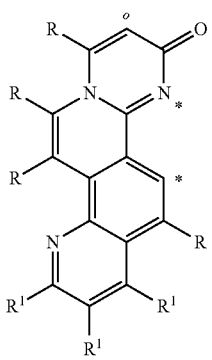
(L-39d)
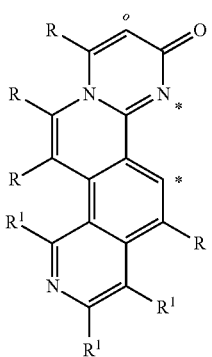

(L-39e)

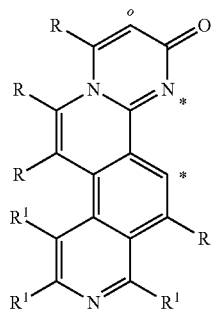

(L-39f)

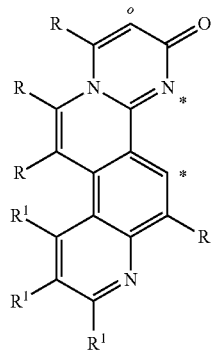

where the symbols used have the definitions given above and "o" indicates the position of the linkage to the group of the formula (2) or (3) or the preferred embodiments, with the proviso that, when Z is bonded to this sub-ligand, one R radical is not present and Z is bonded to the corresponding carbon atom.

In a preferred embodiment of the invention, the X group in the ortho position to the coordination to the metal is CR. In this radical, R bonded in the ortho position to the coordination to the metal is preferably selected from the group consisting of H, D, F and methyl.

In a further embodiment of the invention, it is preferable, if one of the atoms X or, if present, Y is N, when a substituent bonded adjacent to this nitrogen atom is an R group which is not hydrogen or deuterium. This substituent R is preferably a group selected from $CF_3$, $OCF_3$, alkyl or alkoxy groups having 1 to 10 carbon atoms, especially branched or cyclic alkyl or alkoxy groups having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

Further suitable bidentate sub-ligands are the structures of the following formulae (L-40) to (L-44), where preferably not more than one of the three bidentate sub-ligands is one of the structures, (L-40)

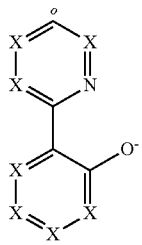

(L-41)

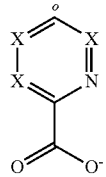

(L-42)

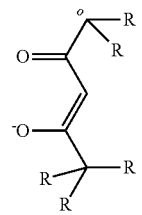

(L-43)

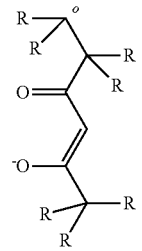

(L-44)

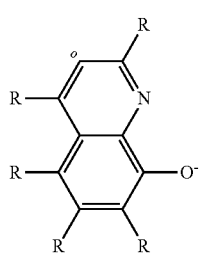

where the sub-ligands (L-40) to (L-42) each coordinate to the metal via the nitrogen atom explicitly shown and the negatively charged oxygen atom, and the sub-ligands (L-43) and (L-44) coordinate to the metal via the two oxygen atoms, X has the definitions given above and "o" indicates the position via which the sub-ligand is joined to the group of the formula (2) or (3) or the preferred embodiments, with the proviso that, when Z is bonded to this sub-ligand, one symbol X is C and Z is bonded to this carbon atom.

The above-recited preferred embodiments of X are also preferred for the sub-ligands of the formulae (L-40) to (L-42). Preferred sub-ligands of the formulae (L-40) to (L-42) are therefore the sub-ligands of the following formulae (L-40a) to (L-42a):

(L-40a)

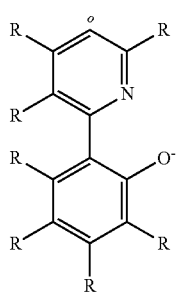

(L-41a)

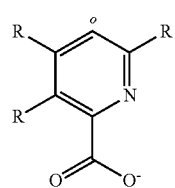

(L-42a)

where the symbols used have the definitions given above and "o" indicates the position via which the sub-ligand is joined to the group of the formula (2) or (3) or the preferred embodiments, with the proviso that, when Z is bonded to this sub-ligand, one R radical is not present and Z is bonded to the corresponding carbon atom.

More preferably, in these formulae, R is hydrogen, where "o" indicates the position via which the sub-ligand is joined to the group of the formula (2) or (3) or the preferred embodiments, and so the structures are those of the following formulae (L-40b) to (L-42b):

(L-40b)

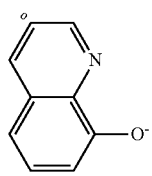

(L-41b)

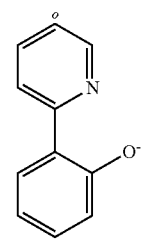

(L-42b)

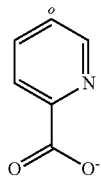

where the symbols used have the definitions given above.

The metal complexes M' are described hereinafter. According to the invention, M' is the same or different at each instance and is M or an iridium complex in which three bidentate ligands which may be the same or different coordinate to one iridium atom, or a platinum complex in which two bidentate ligands which may be the same or different coordinate or a tetradentate ligand coordinates to one platinum atom. In general, it is possible here to use all iridium or platinum complexes as typically used for organic electroluminescent devices.

In a preferred embodiment of the invention, M' is the same or different and is M, i.e. an iridium complex containing a hexadentate tripodal ligand in which three bidentate sub-ligands which may be the same or different coordinate to one iridium atom and the three bidentate sub-ligands are joined via a bridge in the above-elucidated formula (2) or formula (3), or an iridium complex in which three bidentate ligands which may be the same or different coordinate to one iridium atom. When M' is an iridium complex in which three bidentate ligands coordinate to one iridium atom, Z binds to one of the three bidentate ligands. The corresponding ligand to which Z binds is still referred to as bidentate ligand in the context of this invention even though it is a sub-ligand as a result of the linkage to Z-M.

When M' is an iridium complex in which three bidentate ligands which may be the same or different coordinate to one iridium atom, these bidentate ligands are preferably selected from the structures of the following formulae (L-1') and (L-3'):

$$\begin{array}{c} \text{CyD} \\ | \\ \text{CyC} \end{array}$$ Formula (L-1')

$$\begin{array}{c} \text{CyD} \\ | \\ \text{CyD} \end{array}$$ Formula (L-3')

where the symbols have the definitions given above.

In this context, the same preferences as described above for the sub-ligands (L-1), (L-2) and (L-3) apply to the ligands of the formulae (L-1') and (L-3'), with the difference that the ligands of the formulae (L-1') and (L-3') are not bonded to a bridge of the formula (2) or (3).

In a preferred embodiment of the invention, M' is the same or different and is M, where the same preferences as described above for M are also applicable. Preferably, M and M' are thus iridium complexes with tripodal hexadentate ligands.

In a preferred embodiment of the invention, M and M' are identical. This can have advantages on account of the easier synthetic accessibility of the complexes.

In a further preferred embodiment, M and M' are different and especially also have different emission colours. For example, the combination of a red-emitting complex M or M' with a yellow- or green-emitting complex M' or M can lead to co-doping within the same molecule.

There follows a description of preferred substituents as may be present on the above-described sub-ligands and ligands, but also on the bivalent arylene or heteroarylene group in the structure of the formula (4).

In a preferred embodiment of the invention, the metal complex of the invention contains two R substituents which are bonded to adjacent carbon atoms and together form an aliphatic ring according to one of the formulae described hereinafter. In this case, the two R substituents which form this aliphatic ring may be present on the bridge of the formulae (2) or (3) or the preferred embodiments and/or on one or more of the bidentate sub-ligands. The aliphatic ring which is formed by the ring formation by two R substituents together is preferably described by one of the following formulae (50) to (56):

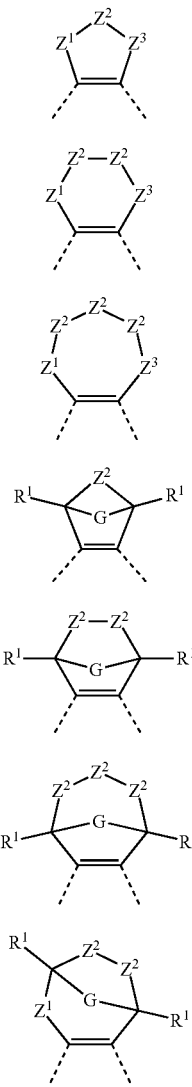

where $R^1$ and $R^2$ have the definitions given above, the dotted bonds signify the linkage of the two carbon atoms in the ligand and, in addition:

$Z^1$, $Z^3$ is the same or different at each instance and is $C(R^3)_2$, O, S, $NR^3$ or $C(=O)$;

$Z^2$ is $C(R^1)_2$, O, S, $NR^3$ or $C(=O)$;

G is an alkylene group which has 1, 2 or 3 carbon atoms and may be substituted by one or more $R^2$ radicals, —$CR^2$=$CR^2$— or an ortho-bonded arylene or heteroarylene group which has 5 to 14 aromatic ring atoms and may be substituted by one or more $R^2$ radicals;

$R^3$ is the same or different at each instance and is H, F, a straight-chain alkyl or alkoxy group having 1 to 10 carbon atoms, a branched or cyclic alkyl or alkoxy group having 3 to 10 carbon atoms, where the alkyl or alkoxy group may be substituted in each case by one or more $R^2$ radicals, where one or more nonadjacent $CH_2$ groups may be replaced by $R^2C=CR^2$, $C\equiv C$, $Si(R^2)_2$, $C=O$, $NR^2$, O, S or $CONR^2$, or an aromatic or heteroaromatic ring system which has 5 to 24 aromatic ring atoms and may be substituted in each case by one or more $R^2$ radicals, or an aryloxy or heteroaryloxy group which has 5 to 24 aromatic ring atoms and may be substituted by one or more $R^2$ radicals; at the same time, two $R^3$ radicals bonded to the same carbon atom together may form an aliphatic or aromatic ring system and thus form a spiro system; in addition, $R^3$ with an adjacent R or $R^1$ radical may form an aliphatic ring system;

with the proviso that no two heteroatoms in these groups are bonded directly to one another and no two C=O groups are bonded directly to one another.

In a preferred embodiment of the invention, $R^3$ is not H.

In the above-depicted structures of the formulae (50) to (56) and the further embodiments of these structures specified as preferred, a double bond is depicted in a formal sense between the two carbon atoms. This is a simplification of the chemical structure when these two carbon atoms are incorporated into an aromatic or heteroaromatic system and hence the bond between these two carbon atoms is formally between the bonding level of a single bond and that of a double bond. The drawing of the formal double bond should thus not be interpreted so as to limit the structure; instead, it will be apparent to the person skilled in the art that this is an aromatic bond.

When adjacent radicals in the structures of the invention form an aliphatic ring system, it is preferable when the latter does not have any acidic benzylic protons. Benzylic protons are understood to mean protons which bind to a carbon atom bonded directly to the ligand. This can be achieved by virtue of the carbon atoms in the aliphatic ring system which bind directly to an aryl or heteroaryl group being fully substituted and not containing any bonded hydrogen atoms. Thus, the absence of acidic benzylic protons in the formulae (50) to (52) is achieved by virtue of $Z^1$ and $Z^3$, when they are $C(R^3)_2$, being defined such that $R^3$ is not hydrogen. This can additionally also be achieved by virtue of the carbon atoms in the aliphatic ring system which bind directly to an aryl or heteroaryl group being the bridgeheads in a bi- or polycyclic structure. The protons bonded to bridgehead carbon atoms, because of the spatial structure of the bi- or polycycle, are significantly less acidic than benzylic protons on carbon atoms which are not bonded within a bi- or polycyclic structure, and are regarded as non-acidic protons in the context of the present invention. Thus, the absence of acidic benzylic protons in formulae (53) to (56) is achieved by virtue of this being a bicyclic structure, as a result of which $R^1$, when it is H, is much less acidic than benzylic protons since the corresponding anion of the bicyclic structure is not mesomerically stabilized. Even when $R^1$ in formulae (53) to (56) is H, this is therefore a non-acidic proton in the context of the present application.

In a preferred embodiment of the structure of the formulae (50) to (56), not more than one of the $Z^1$, $Z^2$ and $Z^3$ groups is a heteroatom, especially O or $NR^3$, and the other groups are $C(R^3)_2$ or $C(R^1)_2$, or $Z^1$ and $Z^3$ are the same or different at each instance and are O or $NR^3$ and $Z^2$ is $C(R^1)_2$. In a particularly preferred embodiment of the invention, $Z^1$ and $Z^3$ are the same or different at each instance and are $C(R^3)_2$, and $Z^2$ is $C(R^1)_2$ and more preferably $C(R^3)_2$ or $CH_2$.

Preferred embodiments of the formula (50) are thus the structures of the formulae (50-A), (50-B), (50-C) and (50-D), and a particularly preferred embodiment of the formula (50-A) is the structures of the formulae (50-E) and (50-F):

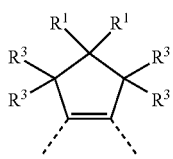
Formula (50-A)

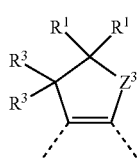
Formula (50-B)

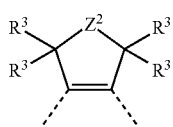
Formula (50-C)

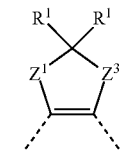
Formula (50-D)

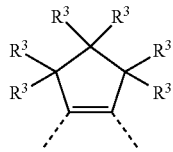
Formula (50-E)

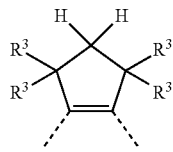
Formula (50-F)

where $R^1$ and $R^3$ have the definitions given above and $Z^1$, $Z^2$ and $Z^3$ are the same or different at each instance and are O or $NR^3$.

Preferred embodiments of the formula (51) are the structures of the following formulae (51-A) to (51-F):

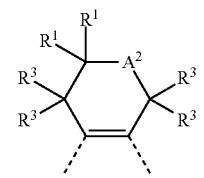
Formula (51-A)

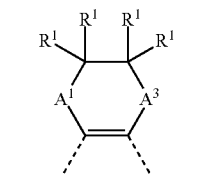
Formula (51-B)

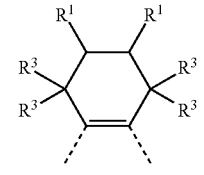
Formula (51-C)

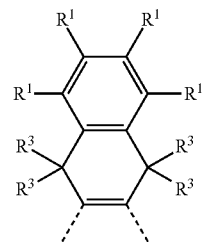
Formula (51-D)

Formula (51-E)

Formula (51-F)

where $R^1$ and $R^3$ have the definitions given above and $Z^1$, $Z^2$ and $Z^3$ are the same or different at each instance and are O or $NR^3$.

Preferred embodiments of the formula (52) are the structures of the following formulae (52-A) to (52-E):

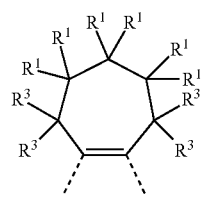
Formula (52-A)

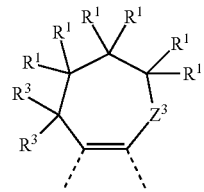
Formula (52-B)

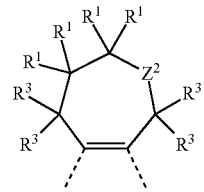
Formula (52-C)

Formula (52-D)

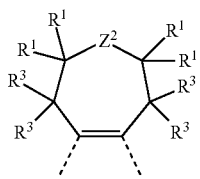

Formula (52-E)

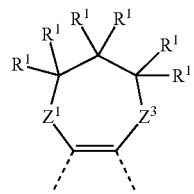

where $R^1$ and $R^3$ have the definitions given above and $Z^1$, $Z^2$ and $Z^3$ are the same or different at each instance and are O or $NR^3$.

In a preferred embodiment of the structure of formula (53), the $R^1$ radicals bonded to the bridgehead are H, D, F or $CH_3$. Further preferably, $Z^2$ is $C(R^1)_2$ or O, and more preferably $C(R^3)_2$. Preferred embodiments of the formula (53) are thus structures of the formulae (53-A) and (53-B), and a particularly preferred embodiment of the formula (53-A) is a structure of the formula (53-C):

Formula (53-A)

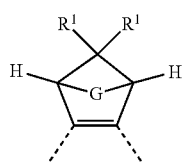

Formula (53-B)

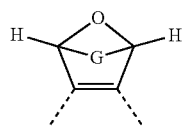

Formula (53-C)

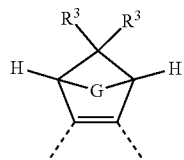

where the symbols used have the definitions given above.

In a preferred embodiment of the structure of formulae (54), (55) and (56), the $R^1$ radicals bonded to the bridgehead are H, D, F or $CH_3$. Further preferably, $Z^2$ is $C(R^1)_2$. Preferred embodiments of the formula (54), (55) and (56) are thus the structures of the formulae (54-A), (55-A) and (56-A):

Formula (54-A)

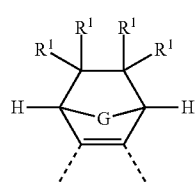

Formula (55-A)

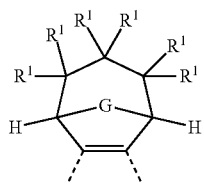

Formula (56-A)

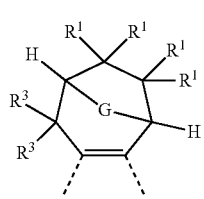

where the symbols used have the definitions given above.

Further preferably, the G group in the formulae (53), (53-A), (53-B), (53-C), (54), (54-A), (55), (55-A), (56) and (56-A) is a 1,2-ethylene group which may be substituted by one or more $R^2$ radicals, where $R^2$ is preferably the same or different at each instance and is H or an alkyl group having 1 to 4 carbon atoms, or an ortho-arylene group which has 6 to 10 carbon atoms and may be substituted by one or more $R^2$ radicals, but is preferably unsubstituted, especially an ortho-phenylene group which may be substituted by one or more $R^2$ radicals, but is preferably unsubstituted.

In a further preferred embodiment of the invention, $R^3$ in the groups of the formulae (50) to (56) and in the preferred embodiments is the same or different at each instance and is F, a straight-chain alkyl group having 1 to 10 carbon atoms or a branched or cyclic alkyl group having 3 to 20 carbon atoms, where one or more nonadjacent $CH_2$ groups in each case may be replaced by $R^2C=CR^2$ and one or more hydrogen atoms may be replaced by D or F, or an aromatic or heteroaromatic ring system which has 5 to 14 aromatic ring atoms and may be substituted in each case by one or more $R^2$ radicals; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

In a particularly preferred embodiment of the invention, $R^3$ in the groups of the formulae (50) to (56) and in the preferred embodiments is the same or different at each instance and is F, a straight-chain alkyl group having 1 to 3 carbon atoms, especially methyl, or an aromatic or heteroaromatic ring system which has 5 to 12 aromatic ring atoms and may be substituted in each case by one or more $R^2$ radicals, but is preferably unsubstituted; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

Examples of particularly suitable groups of the formula (50) are the groups depicted below:

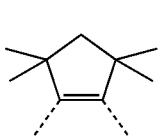 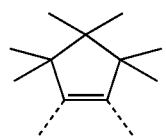 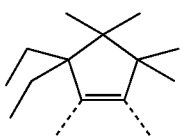

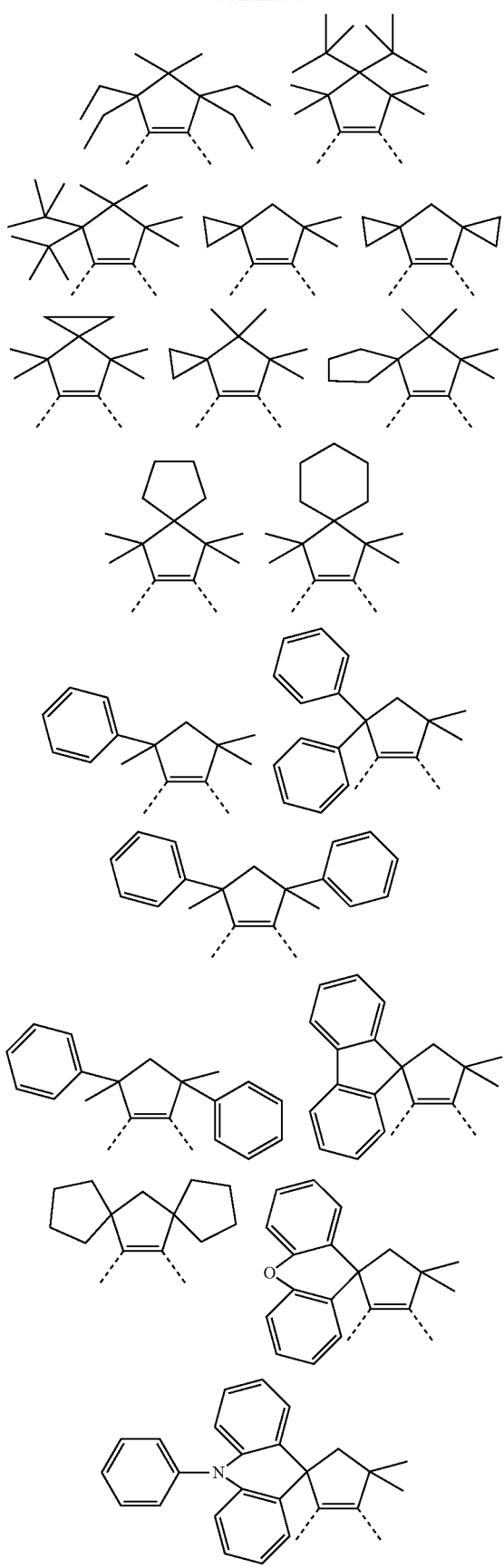
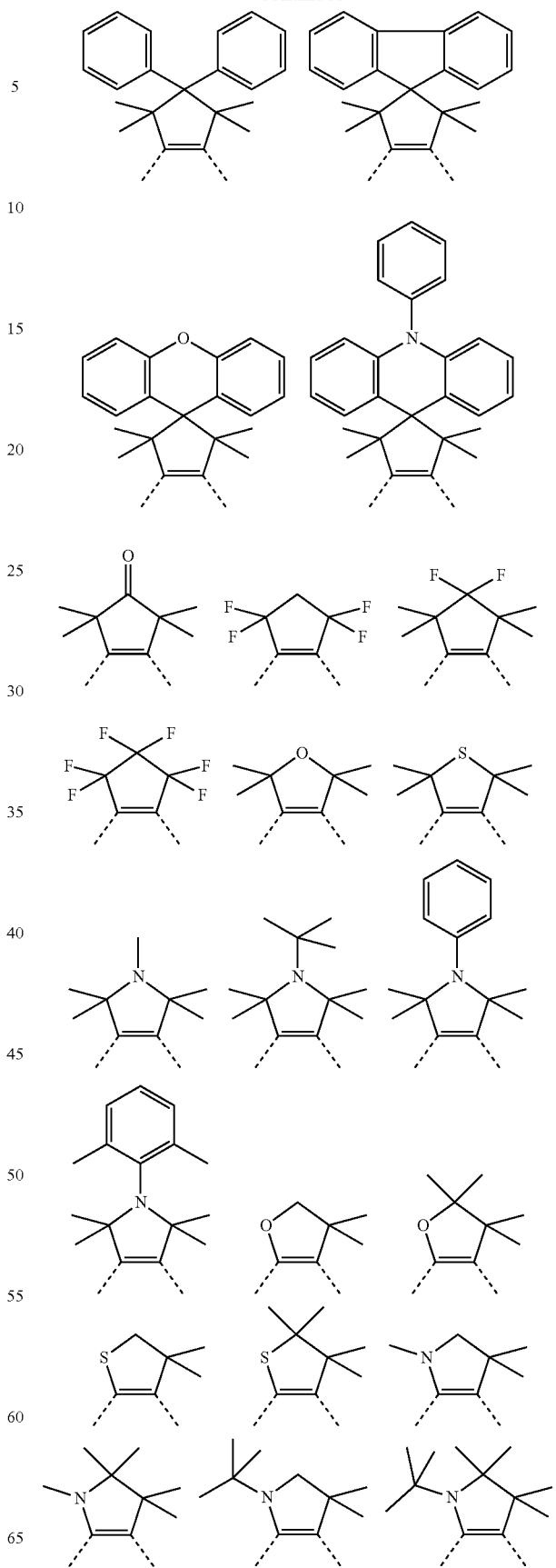

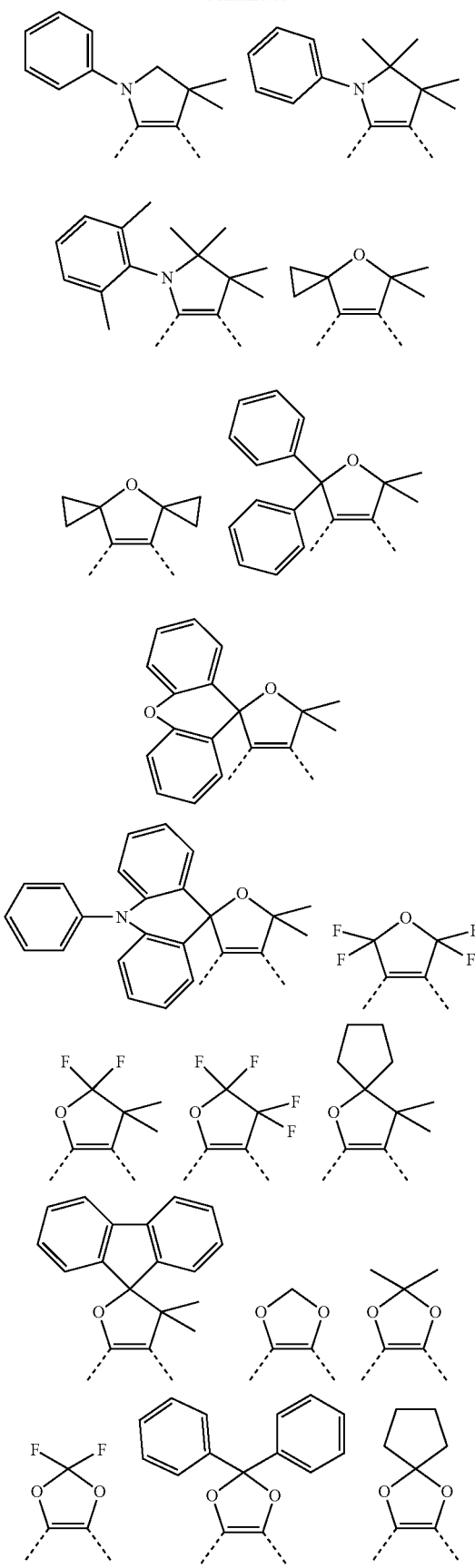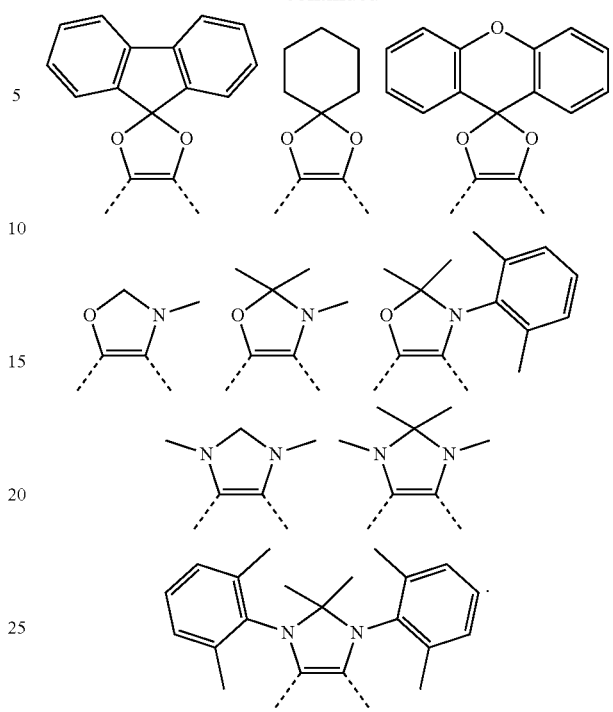
Examples of particularly suitable groups of the formula (51) are the groups depicted below:
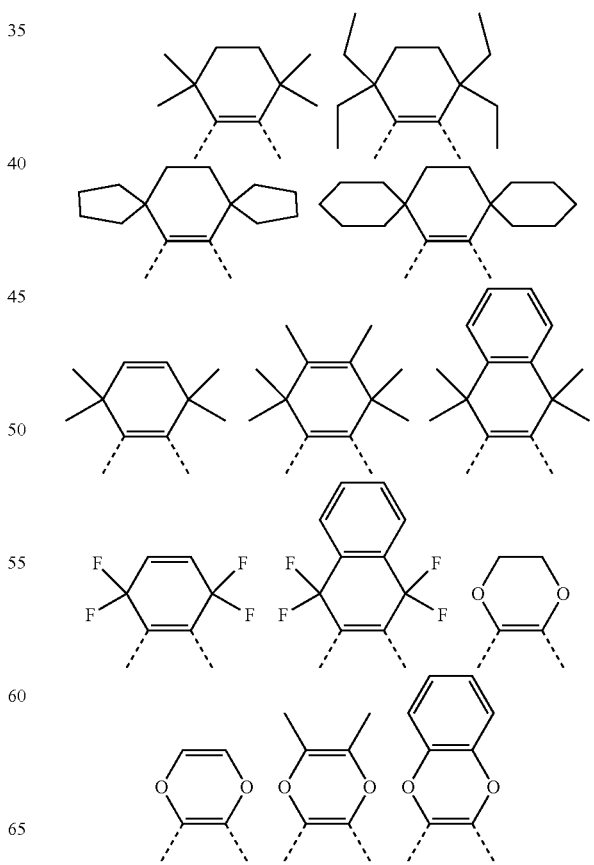

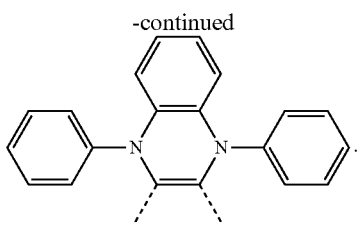

Examples of particularly suitable groups of the formulae (52), (55) and (56) are the groups depicted below:

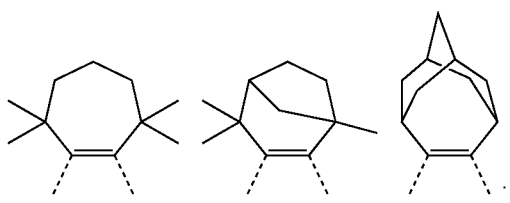

Examples of particularly suitable groups of the formula (53) are the groups depicted below:

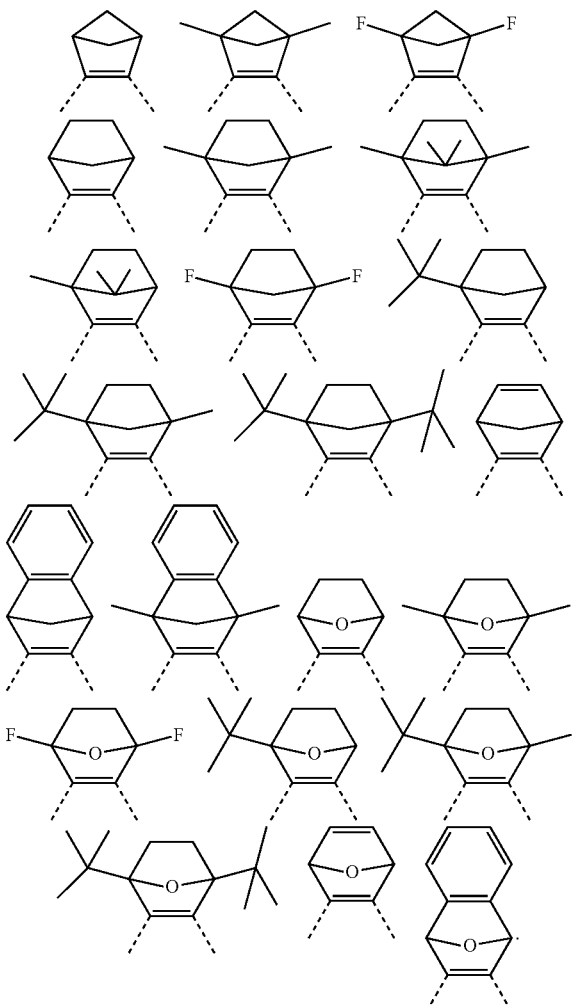

Examples of particularly suitable groups of the formula (54) are the groups depicted below:

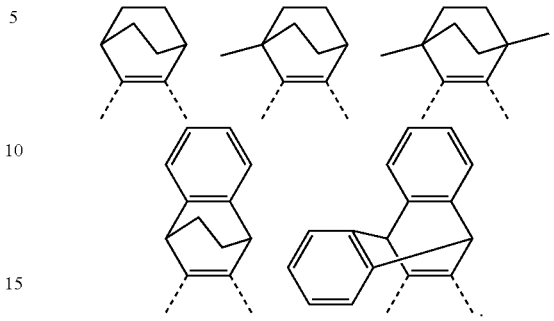

When R radicals are bonded within the bidentate sub-ligands or ligands or within the bivalent arylene or heteroarylene groups of the formula (4) bonded within the formulae (2) or (3) or the preferred embodiments, these R radicals are the same or different at each instance and are preferably selected from the group consisting of H, D, F, Br, I, $N(R^1)_2$, CN, $Si(R^1)_3$, $B(OR^1)_2$, $C(=O)R^1$, a straight-chain alkyl group having 1 to 10 carbon atoms or an alkenyl group having 2 to 10 carbon atoms or a branched or cyclic alkyl group having 3 to 10 carbon atoms, where the alkyl or alkenyl group may be substituted in each case by one or more $R^1$ radicals, or an aromatic or heteroaromatic ring system which has 5 to 30 aromatic ring atoms and may be substituted in each case by one or more $R^1$ radicals; at the same time, two adjacent R radicals together or R together with $R^1$ may also form a mono- or polycyclic, aliphatic or aromatic ring system. More preferably, these R radicals are the same or different at each instance and are selected from the group consisting of H, D, F, $N(R^1)_2$, a straight-chain alkyl group having 1 to 6 carbon atoms or a branched or cyclic alkyl group having 3 to 10 carbon atoms, where one or more hydrogen atoms may be replaced by D or F, or an aromatic or heteroaromatic ring system which has 5 to 24 aromatic ring atoms, especially 6 to 13 aromatic ring atoms, and may be substituted in each case by one or more $R^1$ radicals; at the same time, two adjacent R radicals together or R together with $R^1$ may also form a mono- or polycyclic, aliphatic or aromatic ring system.

Preferred $R^1$ radicals bonded to R are the same or different at each instance and are H, D, F, $N(R^2)_2$, CN, a straight-chain alkyl group having 1 to 10 carbon atoms or an alkenyl group having 2 to 10 carbon atoms or a branched or cyclic alkyl group having 3 to 10 carbon atoms, where the alkyl group may be substituted in each case by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a mono- or polycyclic aliphatic ring system. Particularly preferred $R^1$ radicals bonded to R are the same or different at each instance and are H, F, CN, a straight-chain alkyl group having 1 to 5 carbon atoms or a branched or cyclic alkyl group having 3 to 5 carbon atoms, each of which may be substituted by one or more $R^2$ radicals, or an aromatic or heteroaromatic ring system which has 5 to 13 aromatic ring atoms, especially 6 to 13 aromatic ring atoms, and may be substituted in each case by one or more $R^2$ radicals; at the same time, two or more adjacent $R^1$ radicals together may form a mono- or polycyclic aliphatic ring system.

Preferred R² radicals are the same or different at each instance and are H, F or an aliphatic hydrocarbyl radical having 1 to 5 carbon atoms or an aromatic hydrocarbyl radical having 6 to 12 carbon atoms; at the same time, two or more R² substituents together may also form a mono- or polycyclic aliphatic ring system.

The compounds of the invention are chiral structures. According to the exact structure of the complexes and ligands, the formation of diastereomers and of several pairs of enantiomers is possible.

The complexes of the invention include both the mixtures of the different diastereomers or the corresponding racemates and the individual isolated diastereomers or enantiomers.

If mononuclear complex synthesis units are used to form the polynuclear complexes of the invention, these are typically used in the form of a racemate of the Δ and Λ isomers.

example, to selectively prepare Δ,Δ or Λ,Λ or (meso)-Δ,Λ forms for dinuclear complexes. The same also applies to trinuclear and higher polynuclear complexes of the invention.

The Δ or Λ isomers of mononuclear complex synthesis units needed for the purpose can be obtained as follows. If $C_3$- or $C_{3v}$-symmetric ligands are used in the synthesis of the mononuclear complex synthesis units, what is typically obtained is a racemic mixture of the $C_3$-symmetric complexes, i.e. of the Δ enantiomer and the Λ enantiomer. These may be separated by standard methods (chromatography on chiral materials/columns or optical resolution by crystallization). This is shown in the scheme which follows using the example of a $C_3$-symmetric ligand bearing three phenylpyridine sub-ligands and also applies analogously to all other $C_3$- or $C_{3v}$-symmetric ligands.

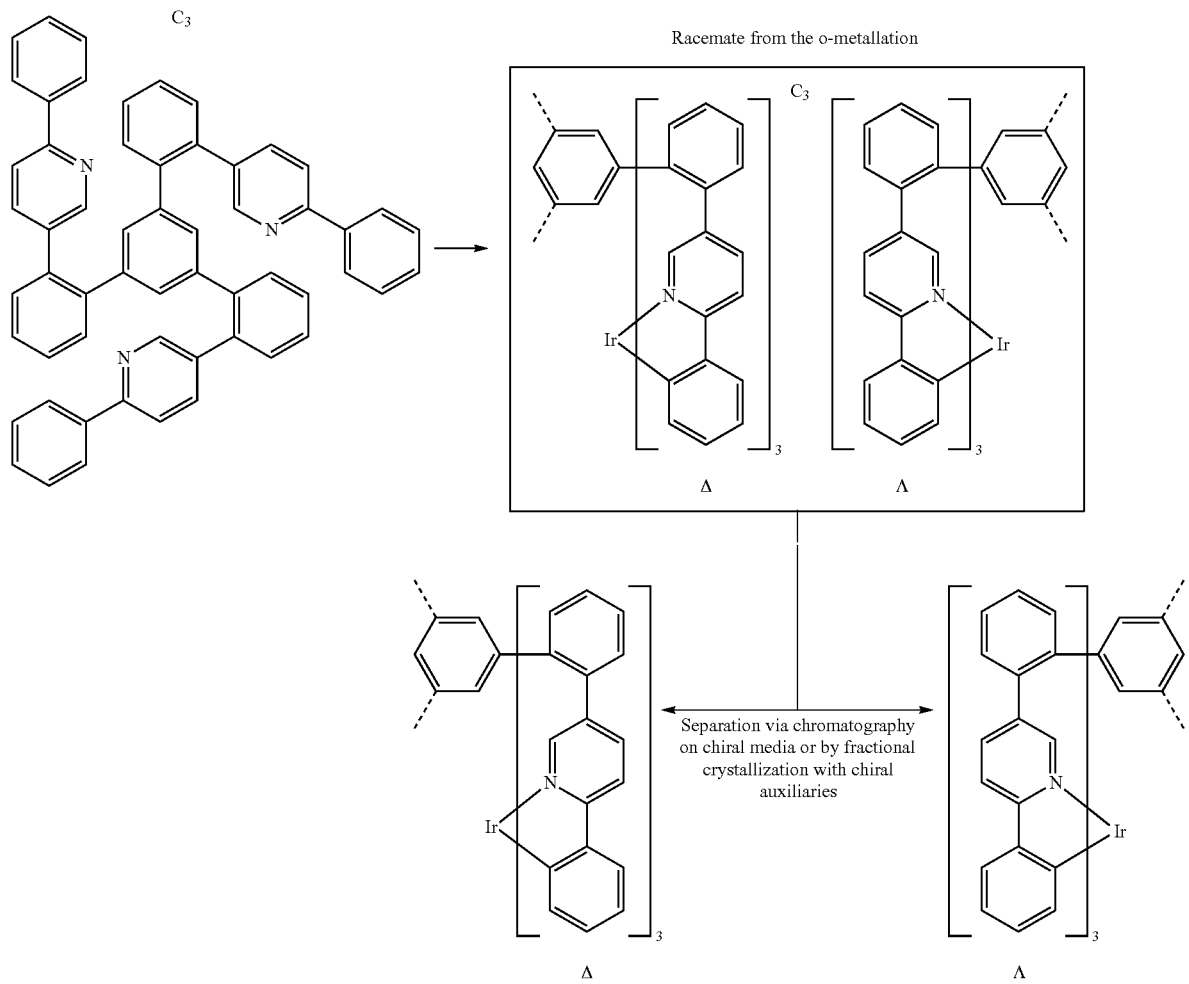

This leads to diastereomer mixtures in the polynuclear compounds of the invention, for example to Δ,Δ/Λ,Λ and (meso)-Δ,Λ forms for dinuclear compounds. Unless stated otherwise, these are converted or used further as a diastereomer mixture. In addition, it is possible to separate these by chromatographic methods or by fractional crystallization.

If the enantiomerically pure Δ or Λ isomers of mononuclear complex synthesis units are used to form the polynuclear complexes of the invention, it is possible, for Optical resolution via fractional crystallization of diastereomeric salt pairs can be effected by customary methods. One option for this purpose is to oxidize the uncharged Ir(III) complexes (for example with peroxides or $H_2O_2$ or by electrochemical means), add the salt of an enantiomerically pure monoanionic base (chiral base) to the cationic Ir(IV) complexes thus produced, separate the diastereomeric salts thus produced by fractional crystallization, and then reduce them with the aid of a reducing agent (e.g. zinc, hydrazine hydrate, ascorbic acid, etc.) to give the enantiomerically pure uncharged complex, as shown schematically below:

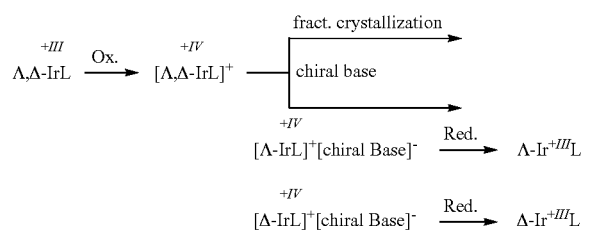

In addition, an enantiomerically pure or enantiomerically enriching synthesis is possible by complexation in a chiral medium (e.g. R- or S-1,1-binaphthol).

Analogous processes can also be conducted with complexes of $C_s$-symmetric ligands.

If $C_1$-symmetric ligands are used in the complexation, what is typically obtained is a diastereomer mixture of the complexes which can be separated by standard methods (chromatography, crystallization).

Enantiomerically pure $C_3$-symmetric complexes can also be synthesized selectively, as shown in the scheme which follows. For this purpose, an enantiomerically pure $C_3$-symmetric ligand is prepared and complexed, the diastereomer mixture obtained is separated and then the chiral group is detached.

The Δ or Λ isomers of mononuclear complex synthesis units thus obtained can finally be functionalized, for example halogenated or borylated, and then joined by coupling reactions, for example Suzuki coupling, to give polynuclear complexes of the invention.

The abovementioned preferred embodiments can be combined with one another as desired. In a particularly preferred embodiment of the invention, the abovementioned preferred embodiments apply simultaneously.

The complexes of the invention can especially be prepared by two routes. Firstly, the 12-dentate, 18-dentate, 24-dentate, etc., ligand can be prepared and then coordinated to the metals by an o-metallation reaction. In general, for this purpose, an iridium salt is reacted with the corresponding free ligand.

Therefore, the present invention further provides a process for preparing the compound of the invention by reacting the corresponding free ligands with metal alkoxides of the formula (57), with metal ketoketonates of the formula (58), with metal halides of the formula (59) or with metal carboxylates of the formula (60)

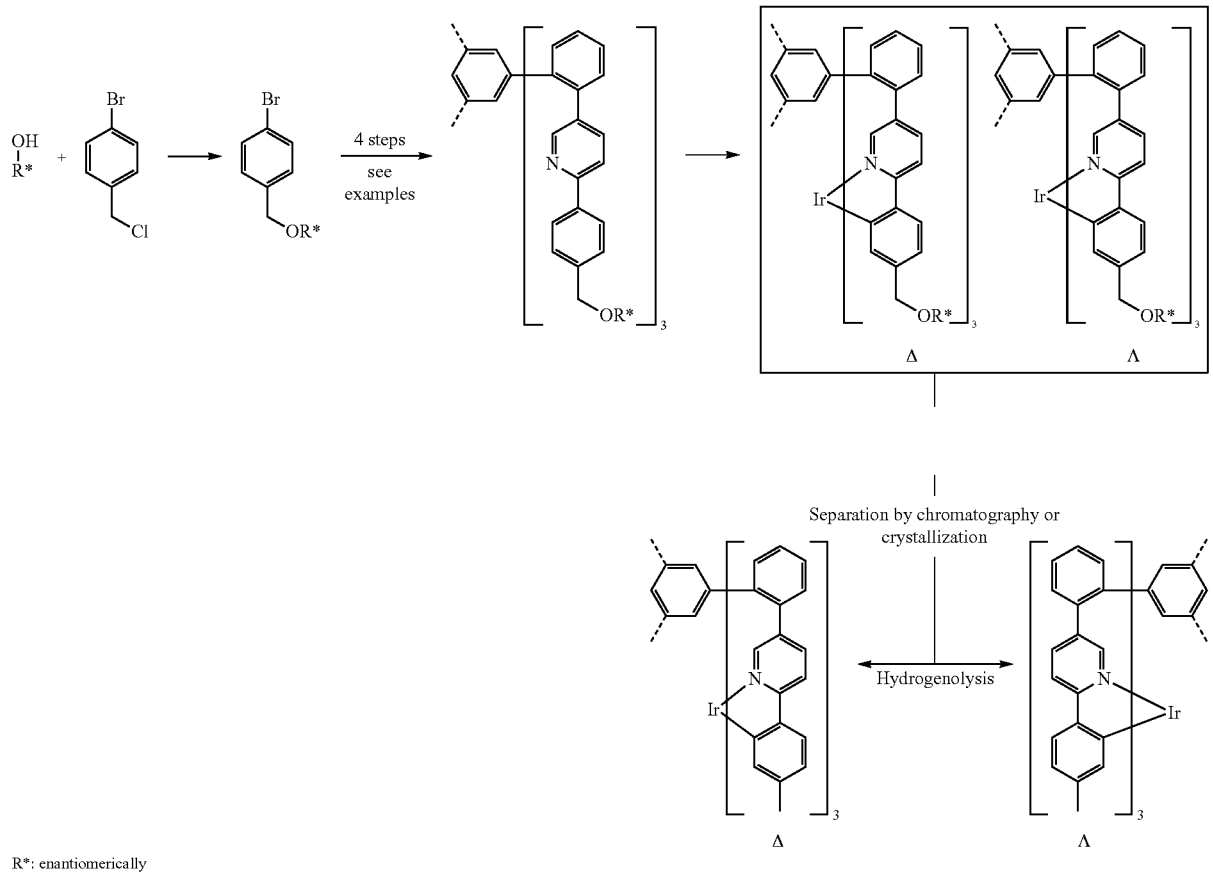

R*: enantiomerically pure radical

Ir(OR)₃  Formula (57)

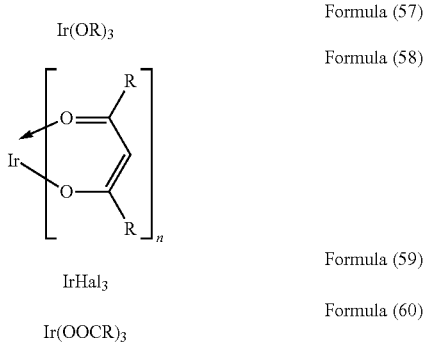

Formula (58)

IrHal₃  Formula (59)

Ir(OOCR)₃  Formula (60)

where R has the definitions given above, Hal=F, Cl, Br or I and the iridium reactants may also take the form of the corresponding hydrates. R here is preferably an alkyl group having 1 to 4 carbon atoms.

It is likewise possible to use iridium compounds bearing both alkoxide and/or halide and/or hydroxyl and ketoketonate radicals. These compounds may also be charged. Corresponding iridium compounds of particular suitability as reactants are disclosed in WO 2004/085449. Particularly suitable are [IrCl₂(acac)₂]⁻, for example Na[IrCl₂(acac)₂], metal complexes with acetylacetonate derivatives as ligand, for example Ir(acac)₃ or tris(2,2,6,6-tetramethylheptane-3,5-dionato)iridium, and IrCl₃.xH₂O where x is typically a number from 2 to 4.

The synthesis of the complexes is preferably conducted as described in WO 2002/060910 and in WO 2004/085449. In this case, the synthesis can, for example, also be activated by thermal or photochemical means and/or by microwave radiation. In addition, the synthesis can also be conducted in an autoclave at elevated pressure and/or elevated temperature.

The reactions can be conducted without addition of solvents or melting aids in a melt of the corresponding ligands to be o-metallated. It is optionally possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulphoxides (DMSO) or sulphones (dimethyl sulphone, sulpholane, etc.). Suitable melting aids are compounds that are in solid form at room temperature but melt when the reaction mixture is heated and dissolve the reactants, so as to form a homogeneous melt. Particularly suitable are biphenyl, m-terphenyl, triphenyls, R- or S-binaphthol or else the corresponding racemate, 1,2-, 1,3- or 1,4-bisphenoxybenzene, triphenylphosphine oxide, 18-crown-6, phenol, 1-naphthol, hydroquinone, etc. Particular preference is given here to the use of hydroquinone.

Secondly, two or more metal complexes functionalized with halogen or boronic acid or boronic ester groups can be reacted with one another or with appropriate aryl/heteroaryl halides or aryl/heteroarylboronic acids or-boronic esters in coupling reactions, preferably a Suzuki coupling, to give the compound of the invention. The manner in which such a synthesis can be performed can be inferred from the examples.

It is possible by these processes, if necessary followed by purification, for example recrystallization or sublimation, to obtain the inventive compounds of formula (1) in high purity, preferably more than 99% (determined by means of ¹H NMR and/or HPLC).

The metal complexes of the invention may also be rendered soluble by suitable substitution, for example by comparatively long alkyl groups (about 4 to 20 carbon atoms), especially branched alkyl groups, or optionally substituted aryl groups, for example xylyl, mesityl or branched terphenyl or quaterphenyl groups. Another particular method that leads to a distinct improvement in the solubility of the metal complexes is the use of fused-on aliphatic groups, as shown, for example, by the formulae (50) to (56) disclosed above. Such compounds are then soluble in sufficient concentration at room temperature in standard organic solvents, for example toluene or xylene, to be able to process the complexes from solution. These soluble compounds are of particularly good suitability for processing from solution, for example by printing methods.

For the processing of the metal complexes of the invention from the liquid phase, for example by spin-coating or by printing methods, formulations of the metal complexes of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexamethylindane, 2-methylbiphenyl, 3-methylbiphenyl, 1-methylnaphthalene, 1-ethylnaphthalene, ethyl octanoate, diethyl sebacate, octyl octanoate, heptylbenzene, menthyl isovalerate, cyclohexyl hexanoate or mixtures of these solvents.

The present invention therefore further provides a formulation comprising at least one iridium complex of the invention and at least one further compound. The further compound may, for example, be a solvent, especially one of the abovementioned solvents or a mixture of these solvents. The further compound may alternatively be a further organic or inorganic compound which is likewise used in the electronic device, for example a matrix material. This further compound may also be polymeric.

The above-described metal complex of the invention or the preferred embodiments detailed above can be used as active component or as oxygen sensitizers in the electronic device. The present invention thus further provides for the use of a compound of the invention in an electronic device or as oxygen sensitizer or as photocatalyst. The present invention still further provides an electronic device comprising at least one compound of the invention.

An electronic device is understood to mean any device comprising anode, cathode and at least one layer, said layer comprising at least one organic or organometallic compound. The electronic device of the invention thus comprises anode, cathode and at least one layer containing at least one metal complex of the invention. Preferred electronic devices are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), the latter being understood to mean both purely organic solar cells and dye-sensitized solar cells, organic optical detectors, organic photoreceptors, organic field-quench devices (O-FQDs), light-emitting electrochemical cells (LECs), oxygen sensors and organic laser diodes (O-lasers), comprising at least one metal complex of the invention in at least one layer. Particular preference is given to organic electroluminescent devices. Active components are generally the organic or inorganic materials introduced between the anode and cathode, for example charge injection, charge transport or charge blocker materials, but especially emission materials and matrix materials. The compounds of the invention exhibit particularly good properties as emission material in organic electroluminescent devices. A preferred embodiment of the invention is therefore organic electroluminescent devices. In addition, the compounds of the invention can be used for production of singlet oxygen or in photocatalysis.

Especially when the metal is ruthenium, preference is given to use as a photosensitizer in a dye-sensitized solar cell ("Grätzel cell").

The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. At the same time, it is possible that one or more hole transport layers are p-doped, for example with metal oxides such as $MoO_3$ or $WO_3$ or with (per)fluorinated electron-deficient aromatic systems, and/or that one or more electron transport layers are n-doped. It is likewise possible for interlayers to be introduced between two emitting layers, these having, for example, an exciton-blocking function and/or controlling the charge balance in the electroluminescent device. However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are three-layer systems where the three layers exhibit blue, green and orange or red emission (for the basic construction see, for example, WO 2005/011013), or systems having more than three emitting layers. The system may also be a hybrid system wherein one or more layers fluoresce and one or more other layers phosphoresce. A preferred embodiment for white-emitting OLEDs is tandem OLEDs. White-emitting organic electroluminescent devices may be used for lighting applications or else with colour filters for full-colour displays.

In a preferred embodiment of the invention, the organic electroluminescent device comprises the metal complex of the invention as emitting compound in one or more emitting layers.

When the metal complex of the invention is used as emitting compound in an emitting layer, it is preferably used in combination with one or more matrix materials. The mixture of the metal complex of the invention and the matrix material contains between 0.1% and 99% by weight, preferably between 1% and 90% by weight, more preferably between 3% and 40% by weight and especially between 5% and 25% by weight of the metal complex of the invention, based on the overall mixture of emitter and matrix material. Correspondingly, the mixture contains between 99.9% and 1% by weight, preferably between 99% and 10% by weight, more preferably between 97% and 60% by weight and especially between 95% and 75% by weight of the matrix material, based on the overall mixture of emitter and matrix material.

The matrix material used may generally be any materials which are known for the purpose according to the prior art. The triplet level of the matrix material is preferably higher than the triplet level of the emitter.

Suitable matrix materials for the compounds of the invention are ketones, phosphine oxides, sulphoxides and sulphones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example according to WO 2007/063754 or WO 2008/056746, indenocarbazole derivatives, for example according to WO 2010/136109 or WO 2011/000455, azacarbazoles, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, diazasilole derivatives, for example according to WO 2010/054729, diazaphosphole derivatives, for example according to WO 2010/054730, triazine derivatives, for example according to WO 2010/015306, WO 2007/063754 or WO 2008/056746, zinc complexes, for example according to EP 652273 or WO 2009/062578, dibenzofuran derivatives, for example according to WO 2009/148015 or WO 2015/169412, or bridged carbazole derivatives, for example according to US 2009/0136779, WO 2010/050778, WO 2011/042107 or WO 2011/088877.

It may also be preferable to use a plurality of different matrix materials as a mixture, especially at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex of the invention. Preference is likewise given to the use of a mixture of a charge-transporting matrix material and an electrically inert matrix material having no significant involvement, if any, in the charge transport, as described, for example, in WO 2010/108579. Preference is likewise given to the use of two electron-transporting matrix materials, for example triazine derivatives and lactam derivatives, as described, for example, in WO 2014/094964.

It is further preferable to use a mixture of two or more triplet emitters together with a matrix. In this case, the triplet emitter having the shorter-wave emission spectrum serves as co-matrix for the triplet emitter having the longer-wave emission spectrum. For example, it is possible to use the metal complexes of the invention as co-matrix for longer-wave-emitting triplet emitters, for example for green- or red-emitting triplet emitters. In this case, it may also be preferable when both the shorter-wave- and the longer-wave-emitting metal complexes are a compound of the invention.

The metal complexes of the invention can also be used in other functions in the electronic device, for example as hole transport material in a hole injection or transport layer, as charge generation material, as electron blocker material, as hole blocker material or as electron transport material, for example in an electron transport layer. It is likewise possible to use the metal complexes of the invention as matrix material for other phosphorescent metal complexes in an emitting layer.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O-SC) or the emission of light (OLED/PLED, O-laser). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WP_3$, or (per)fluorinated electron-deficient aromatic systems. Further suitable p-dopants are HAT-CN (hexacyanohexaazatriphenylene) or the compound NPD9 from Novaled.

Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

The device is correspondingly (according to the application) structured, contact-connected and finally hermetically sealed, since the lifetime of such devices is severely shortened in the presence of water and/or air.

Additionally preferred is an organic electroluminescent device, characterized in that one or more layers are coated by a sublimation process. In this case, the materials are applied by vapour deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example, M. S. Arnold et al., *Appl. Phys. Lett.* 2008, 92, 053301).

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution. In a preferred embodiment of the invention, the layer comprising the compound of the invention is applied from solution.

The organic electroluminescent device can also be produced as a hybrid system by applying one or more layers from solution and applying one or more other layers by vapour deposition. For example, it is possible to apply an emitting layer comprising a metal complex of the invention and a matrix material from solution, and to apply a hole blocker layer and/or an electron transport layer thereto by vapour deposition under reduced pressure.

These methods are known in general terms to those skilled in the art and can be applied by those skilled in the art without difficulty to organic electroluminescent devices comprising compounds of formula (1) or the above-detailed preferred embodiments.

The electronic devices of the invention, especially organic electroluminescent devices, are notable for one or more of the following surprising advantages over the prior art:

1. The metal complexes of the invention can be synthesized in very high yield and very high purity with exceptionally short reaction times and at comparatively low reaction temperatures.
2. The metal complexes of the invention have excellent thermal stability.
3. The metal complexes of the invention, when both M and M' are complexes with a tripodal hexadentate ligand, exhibit neither thermal nor photochemical fac/mer isomerization nor mer/fac isomerization, which leads to advantages in the use of these complexes.

4. Some of the metal complexes of the invention have a very narrow emission spectrum, which leads to a high colour purity in the emission, as is desirable particularly for display applications.
5. Organic electroluminescent devices comprising the metal complexes of the invention as emitting materials have a very good lifetime.
6. Organic electroluminescent devices comprising the metal complexes of the invention as emitting materials have excellent efficiency.

These abovementioned advantages are not accompanied by a deterioration in the further electronic properties.

The invention is illustrated in detail by the examples which follow, without any intention of restricting it thereby. The person skilled in the art will be able to use the details given, without exercising inventive skill, to produce further electronic devices of the invention and hence to execute the invention over the entire scope claimed.

EXAMPLES

The syntheses which follow, unless stated otherwise, are conducted under a protective gas atmosphere in dried solvents. The metal complexes are additionally handled with exclusion of light or under yellow light. The solvents and reagents can be purchased, for example, from Sigma-ALDRICH or ABCR. The respective figures in square brackets or the numbers quoted for individual compounds relate to the CAS numbers of the compounds known from the literature.

1. Synthons LS Known from the Literature

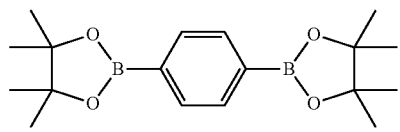

99770-93-1

LS1

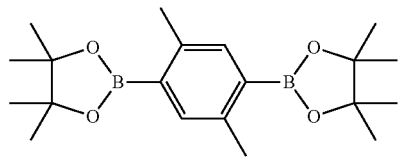

303006-89-5

LS2

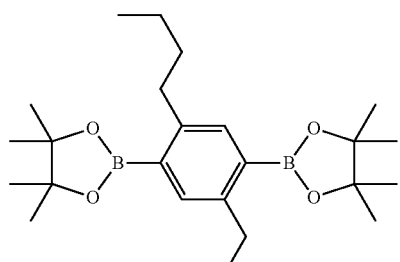

1462818-64-9

LS3

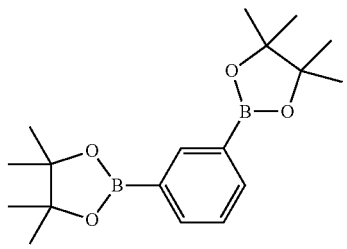

196212-27-8

LS4

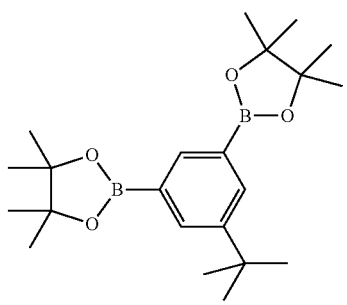

254101-32-1

LS5

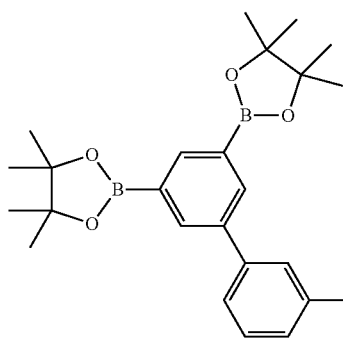

1182371-94-3

LS6

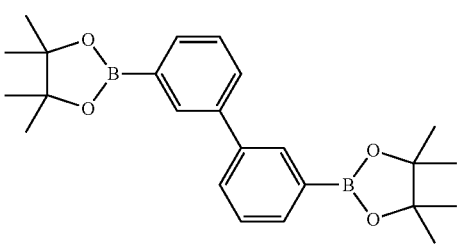

850264-92-5

LS7

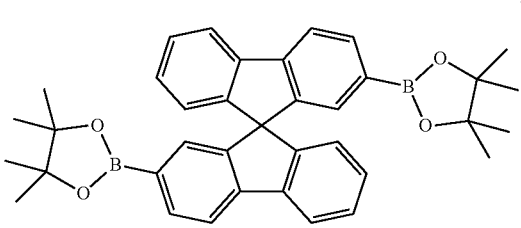

676168-63-1

LS8

-continued
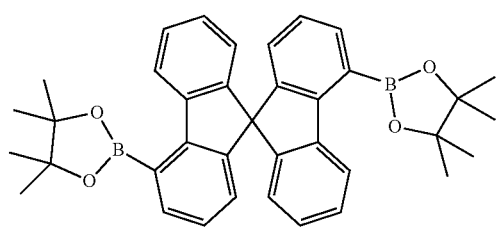
1257321-47-3
LS9
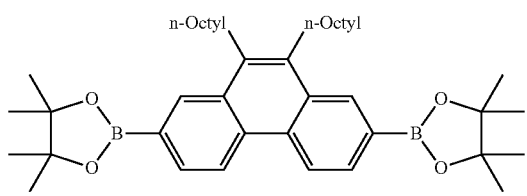
1332339-96-4
LS10
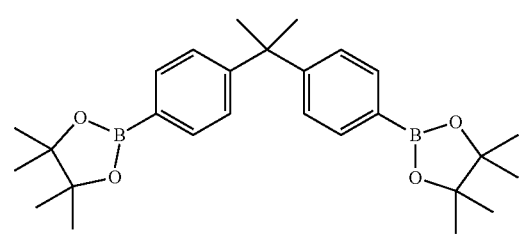
736138-28-6
LS11
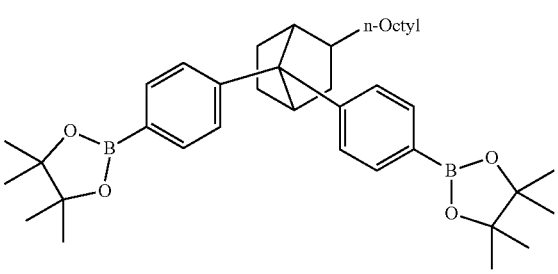
1187437-46-2
LS12
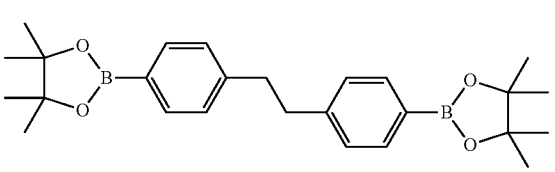
1422172-96-0
LS13
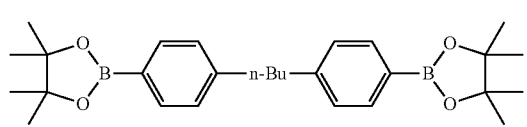
1346850-65-4
LS14
-continued
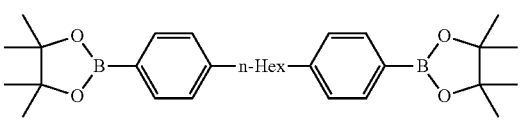
1257064-91-7
LS15
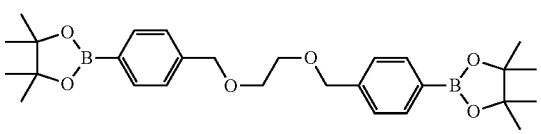
1257064-90-6
LS16
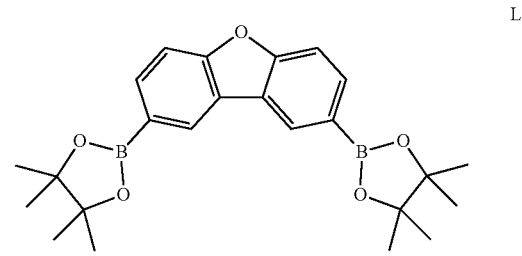
1197989-83-5
LS17
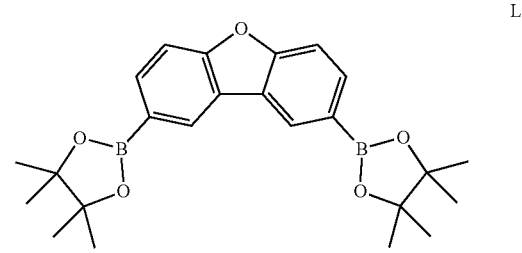
552855-12-6
LS18
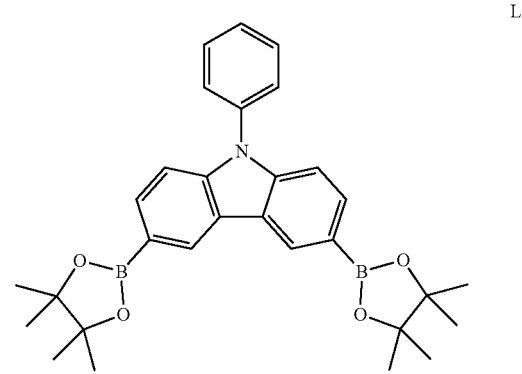
618442-57-2
LS19
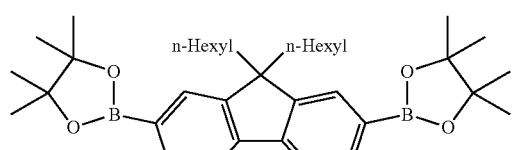
254755-24-3
LS20

-continued
LS21
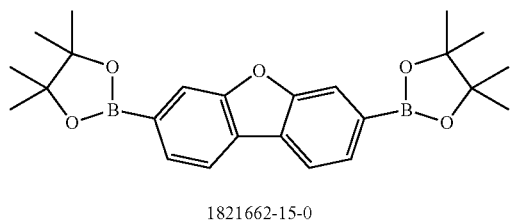
1821662-15-0
LS22
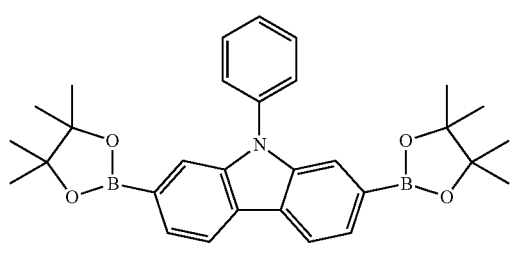
1035631-57-2
LS23
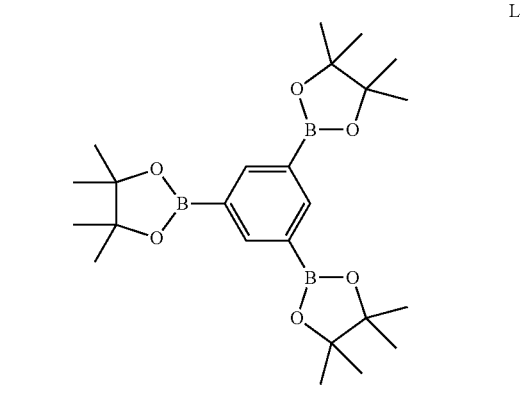
365564-05-2
LS24
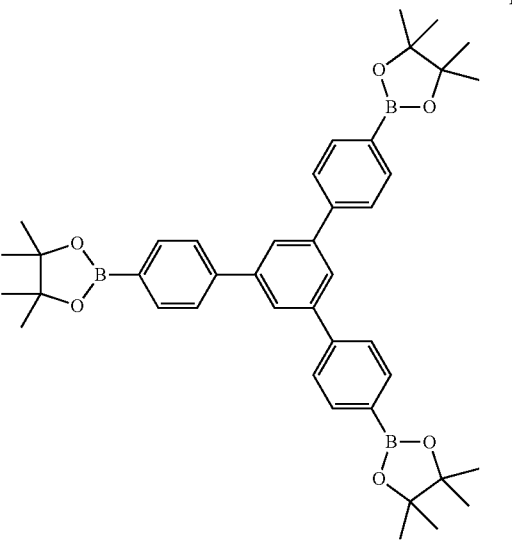
1017967-97-3
-continued
LS25
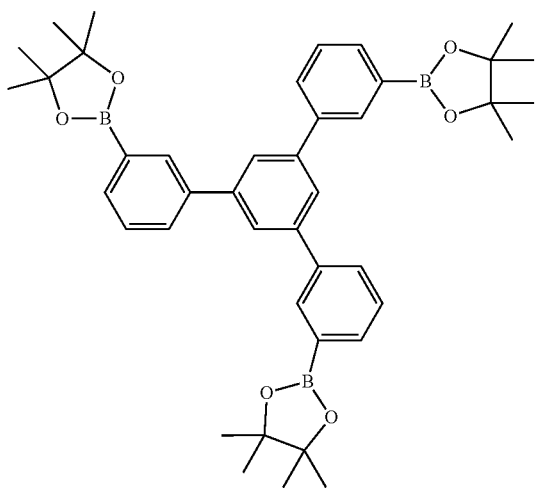
1573170-54-3
LS26
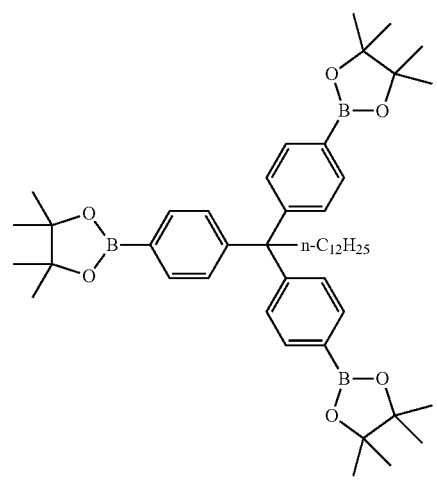
1374411-54-7
LS27
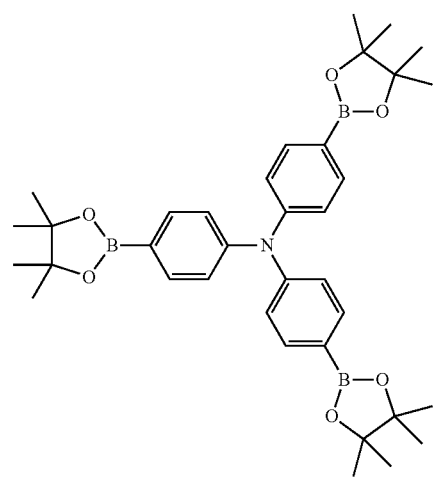
267221-90-9

-continued
LS28
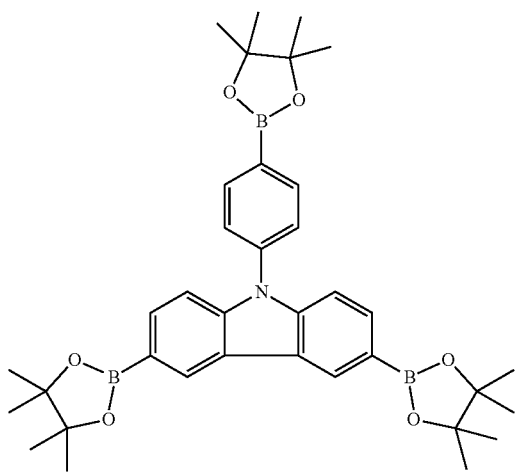
1415223-65-2
LS29
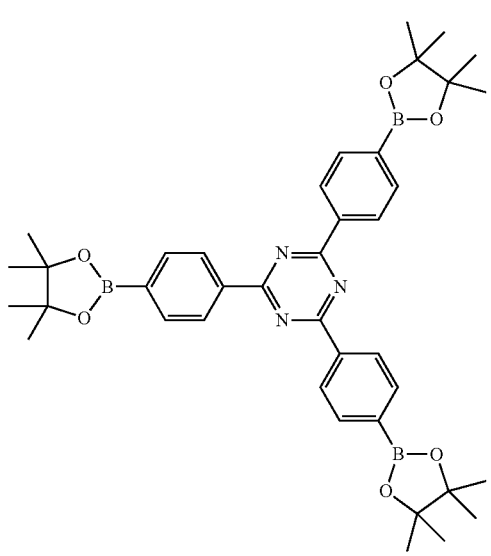
1447947-87-6
LS30
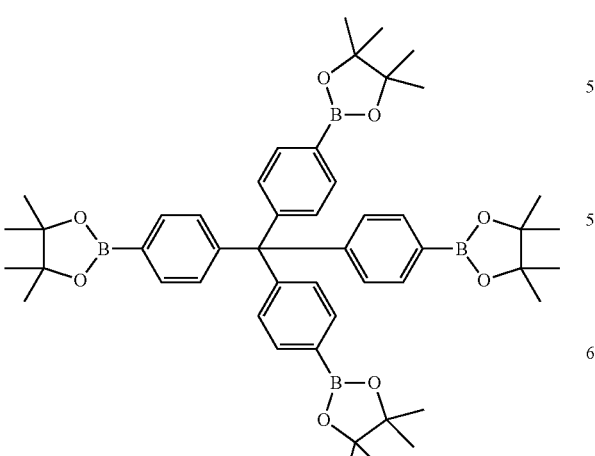
875772-13-7
-continued
LS31
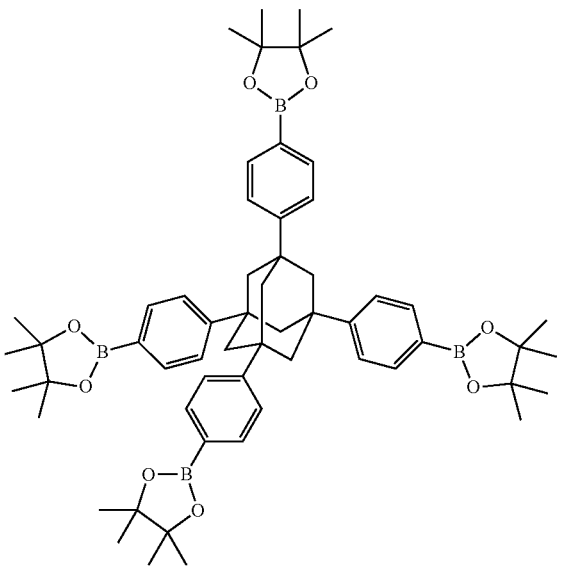
1636119-48-6
LS100
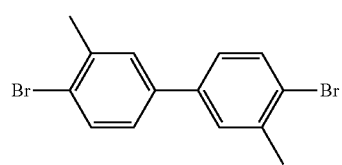
61794-96-5
LS101
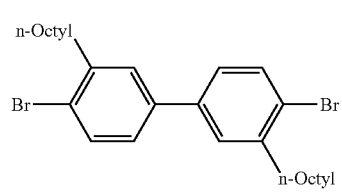
450398-41-1
LS102
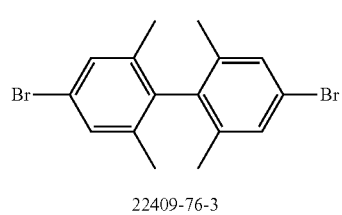
22409-76-3
LS103
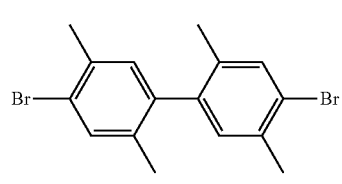
492434-55-6

-continued
LS104
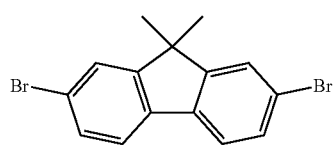
28320-32-3
LS105
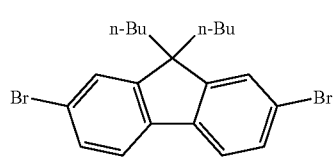
188200-91-1
LS106
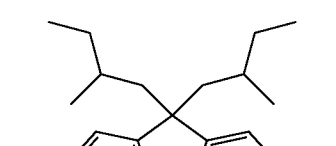
500343-25-9
LS107
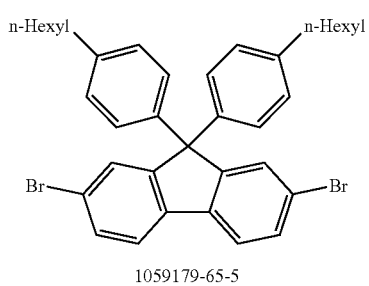
1059179-65-5
LS108
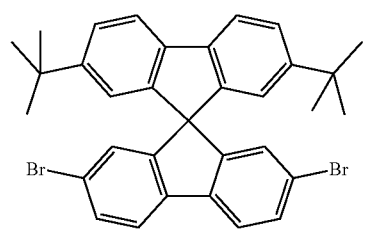
439791-57-8
LS109
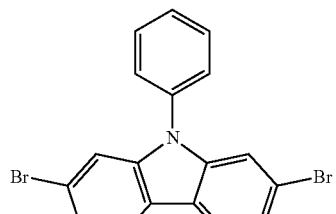
444796-09-2
-continued
LS110
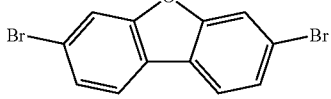
67019-91-4
LS111
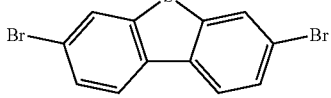
83834-10-0
LS112
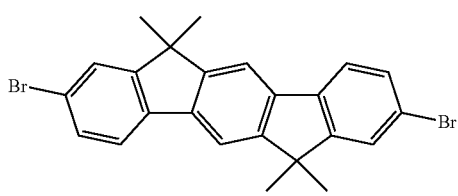
822705-64-1
LS113
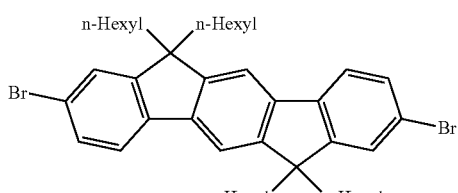
822705-69-6
2. Preparation of the Organic and Organometallic Synthons
2.1 Preparation of the Organic Synthons S
Example S1: 1,3,5-Tris(6-bromo-1,1,3,3-tetramethylindan-5-yl)benzene
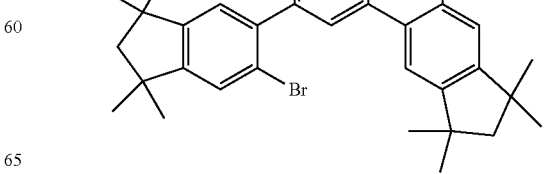

a) 1-(6-Bromo-1,1,3,3-tetramethylindan-5-yl)ethanone

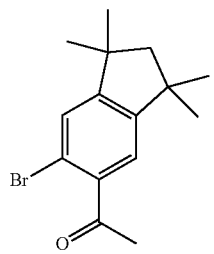 [SMILES: CC(=O)c1cc2c(cc1Br)C(C)(C)CC2(C)C]

Procedure according to I. Pravst et al., Tetrahedron Lett., 2006, 47, 4707. A mixture of 21.6 g (100 mmol) of 1-(1,1,3,3-tetramethylindan-5-yl)ethanone [17610-14-9], 39.2 g (220 mmol) of N-bromosuccinimide, 1.6 g (2.5 mmol) of [Cp*RhCl$_2$]2 [12354-85-7], 3.4 g (10 mmol) of silver(I) hexafluoroantimonate [26042-64-8], 20.0 g (110 mmol) of copper(II) acetate [142-71-2] and 500 ml of 1,2-dichloroethane is stirred at 120° C. for 20 h. After cooling, the solids are filtered off using a silica gel bed, the solvent is removed under reduced pressure and the residue is recrystallized three times from acetonitrile. Yield: 12.1 g (41 mmol), 41%. Purity: about 97% by $^1$H NMR.

b) 1,3,5-Tris(6-bromo-1,1,3,3-tetramethylindan-5-yl)benzene, S1

A mixture of 12.1 g (41 mmol) of 1-(6-bromo-1,1,3,3-tetramethylindan-5-yl)ethanone and 951 mg (5 mmol) of toluenesulphonic acid monohydrate [6192-52-5] (or trifluoromethanesulphonic acid, Variant B) is stirred on a water separator at 150° C. for 48 h. After cooling, the residue is taken up in 300 ml of ethyl acetate, washed three times with 100 ml each time of water and once with 100 ml of saturated sodium chloride solution, and then dried over magnesium sulphate. The crude product is chromatographed on silica gel with n-heptane:ethyl acetate (5:1). Yield: 4.3 g (5 mmol), 38%. Purity: about 97% by $^1$H NMR.

In an analogous manner, it is possible to prepare the following compounds:

| Ex. | Ketone or bromoketone Variant | Product | Yield |
|---|---|---|---|
| S2 | 147438-85-5 B | | 33% |
| S3 | 628735-63-7 B | | 60% |

-continued

| Ex. | Ketone or bromoketone Variant | Product | Yield |
|---|---|---|---|
| S4 | 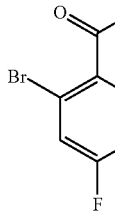 1006-39-9 | 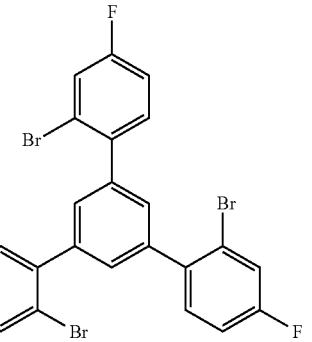 | 63% |

The following compounds known from the literature can be used as synthons:

| Synthon |
|---|
| 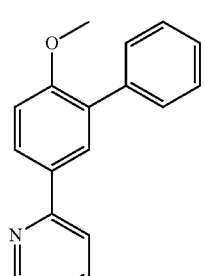 380626-56-2 S5 |

Example S6

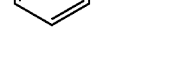

a) S6a

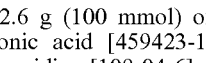

A mixture of 22.6 g (100 mmol) of (6-methoxy-[1,1'-biphenyl]-3-yl)boronic acid [459423-16-6], 16.6 g (105 mmol) of 2-bromopyridine [109-04-6], 21.2 g (200 mmol) of sodium carbonate, 1.2 g (1 mmol) of tetrakis(triphenylphosphino)palladium [14221-01-3], 300 ml of toluene, 100 ml of ethanol, 300 ml of water is heated under reflux with good stirring for 18 h. After cooling, the organic phase is removed, washed twice with 300 ml each time of water and once with 300 ml of saturated sodium chloride solution, and dried over magnesium sulphate. The oil obtained after concentration of the organic phase is dried on an oil-pump vacuum at 80° C. and converted without further purification. Yield: 25.6 g (98 mmol), 98%; purity: about 95% by $^1$H NMR.

b) S6b

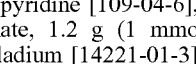

A mixture of 26.1 g (100 mmol) of S6a and 81.9 g (700 mmol) of pyridinium hydrochloride is heated to 190° C. for 3 h. After cooling, the reaction mixture is poured into 500 ml of water and extracted five times with 200 ml each time of dichloromethane, the organic phase is washed twice with 200 ml of water and once with 200 ml of saturated NaCl solution, the solvent is removed under reduced pressure, 300 ml of toluene are added for azeotropic drying and the latter is distilled off completely under reduced pressure. The viscous oil thus obtained is converted without further purification. Yield: 21.0 g (85 mmol), 85%; purity: about 95% by $^1$H NMR.

c) S6

To a solution, cooled to 0° C., of 24.7 g (100 mmol) of S6b in a mixture of 300 ml of dichloromethane and 80 ml of pyridine are added dropwise, with good stirring, 34 ml (200 mmol) of trifluoromethanesulphonic anhydride [358-23-6]. The reaction mixture is allowed to warm up to RT and stirred for a further 16 h, poured into 1000 ml of ice-water while stirring and then extracted three times with 300 ml of dichloromethane. The combined organic phases are washed twice with 300 ml each time of ice-water and once with 500 ml of saturated NaCl solution and then dried over sodium sulphate. The wax that remains after removal of the dichloromethane under reduced pressure is recrystallized from acetonitrile. Yield: 32.6 g (86 mmol), 86%; purity: about 95% by $^1$H NMR.

It is possible to obtain S7 in an analogous manner, except using 2-bromo-4-tert-butylpyridine [50488-34-1] in place of 2-bromopyridine:

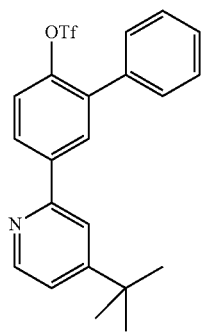 [SMILES: CC(C)(C)c1ccnc(-c2ccc(OS(=O)(=O)C(F)(F)F)c(-c3ccccc3)c2)c1]

Example S10: 5-Bromo-2-[1,1,2,2,3,3-hexamethyl-indan-5-yl]pyridine

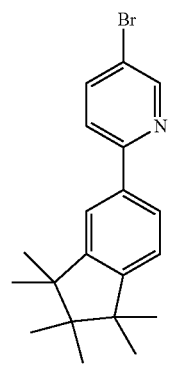 [SMILES: CC1(C)c2ccc(-c3ccc(Br)cn3)cc2C(C)(C)C1(C)C]

A mixture of 164.2 g (500 mmol) of 2-(1,1,2,2,3,3-hexamethylindan-5-yl)-4,4,5,5-tetramethyl-[1,3,2]dioxaborolane [152418-16-9] (it is analogously possible to use boronic acids), 142.0 g (500 mmol) of 5-bromo-2-iodopyridine [223463-13-6], 159.0 g (1.5 mol) of sodium carbonate, 5.8 g (5 mmol) of tetrakis(triphenylphosphino)palladium(0), 700 ml of toluene, 300 ml of ethanol and 700 ml of water is heated under reflux with good stirring for 16 h. After cooling, 1000 ml of toluene are added, the organic phase is removed and the aqueous phase is re-extracted with 300 ml of toluene. The combined organic phases are washed once with 500 ml of saturated sodium chloride solution. After the organic phase has been dried over sodium sulphate and the solvent has been removed under reduced pressure, the crude product is recrystallized twice from about 300 ml of EtOH. Yield: 130.8 g (365 mmol), 73%. Purity: about 95% by $^1$H NMR.

In an analogous manner, it is possible to prepare the following compounds:

| Ex. | Boronic acid/ester Pyridine | Product | Yield |
|---|---|---|---|
| S11 | 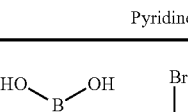 98-80-6/1381937-40-1 | 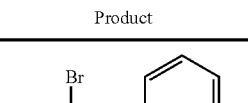 | 73% |

Example S20

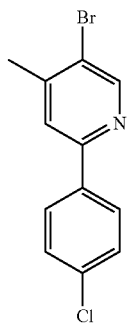

A mixture of 25.1 g (100 mmol) of 2,5-dibromo-4-methylpyridine [3430-26-0], 15.6 g (100 mmol) of 4-chlorophenylboronic acid [1679-18-1], 27.6 g (200 mmol) of potassium carbonate, 1.57 g (6 mmol) of triphenylphosphine [603-35-0], 676 mg (3 mmol) of palladium(II) acetate [3375-31-3], 200 g of glass beads (diameter 3 mm), 200 ml of acetonitrile and 100 ml of ethanol is heated under reflux for 48 h. After cooling, the solvents are removed under reduced pressure, 500 ml of toluene are added, the mixture is washed twice with 300 ml each time of water and once with 200 ml of saturated sodium chloride solution, dried over magnesium sulphate and filtered through a silica gel bed in the form of a slurry, which is washed with 300 ml of toluene. After the toluene has been removed under reduced pressure, it is recrystallized once from methanol/ethanol (1:1 v/v) and once from n-heptane. Yield: 17.3 g (61 mmol), 61%. Purity: about 95% by $^1$H NMR.

Example S21

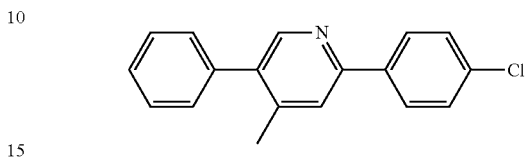

A mixture of 28.3 g (100 mmol) of S20, 12.8 g (105 mmol) of phenylboronic acid, 31.8 g (300 mmol) of sodium carbonate, 787 mg (3 mmol) of triphenylphosphine, 225 mg (1 mmol) of palladium(II) acetate, 300 ml of toluene, 150 ml of ethanol and 300 ml of water is heated under reflux for 48 h. After cooling, the mixture is extended with 300 ml of toluene, and the organic phase is removed, washed once with 300 ml of water and once with 200 ml of saturated sodium chloride solution and dried over magnesium sulphate. After the solvent has been removed, the residue is chromatographed on silica gel (toluene/ethyl acetate, 9:1 v/v). Yield: 17.1 g (61 mmol), 61%. Purity: about 97% by $^1$H NMR.

In an analogous manner, it is possible to synthesize the following compounds:

| Ex. | Boronic ester | Product | Yield |
|---|---|---|---|
| S22 | | | 56% |
| S23 | | | 61% |

| Ex. | Boronic ester | Product | Yield |
|---|---|---|---|
| S24 | 1264513-60-1 | | 70% |

1205748-61-3

Example S30: 2-[1,1,2,2,3,3-Hexamethylindan-5-yl]-5-(4,4,5,5-tetramethyl-[1,3,2]dioxaborolan-2-yl)pyridine Variant A:

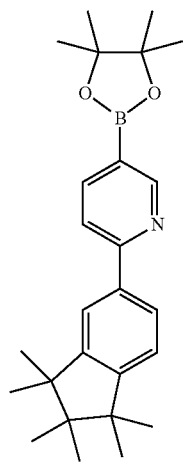

A mixture of 35.8 g (100 mmol) of S10, 25.4 g (100 mmol) of bis(pinacolato)diborane [73183-34-3], 49.1 g (500 mmol) of potassium acetate, 1.5 g (2 mmol) of 1,1-bis(diphenylphosphino)ferrocenedichloropalladium(II) complex with DCM [95464-05-4], 200 g of glass beads (diameter 3 mm), 700 ml of 1,4-dioxane and 700 ml of toluene is heated under reflux for 16 h. After cooling, the suspension is filtered through a Celite bed and the solvent is removed under reduced pressure. The black residue is digested with 1000 ml of hot cyclohexane and filtered through a Celite bed while still hot, then concentrated to about 200 ml, in the course of which the product begins to crystallize. The crystallization is completed in a refrigerator overnight, and the crystals are filtered off and washed with a little n-heptane. A second product fraction can be obtained from the mother liquor. Yield: 31.6 g (78 mmol) 78%. Purity: about 95% by $^1$H NMR.

Variant B: Conversion of Aryl Chlorides

As variant A, except that, rather than 1,1-bis(diphenylphosphino)-ferrocenedichloropalladium(II) complex with DCM, 1.5 mmol of SPhos [657408-07-6] and 1.0 mmol of palladium(II) acetate are used.

In an analogous manner, it is possible to prepare the following compounds, and it is also possible to use cyclohexane, toluene, acetonitrile, ethyl acetate or mixtures of said solvents for purification rather than n-heptane:

| Ex. | Bromide/triflate- Variant A<br>Chloride- Variant B | Product | Yield |
|---|---|---|---|
| S31 | 1246851-70-6 | | 88% |
| S32 | S11 | | 70% |
| S33 | S21 | | 86% |
| S34 | S22 | | 79% |
| S35 | S22 | | 77% |
| S36 | S6 | | 64% |
| S37 | S7 | | 69% |

-continued

| Ex. | Bromide/triflate- Variant A<br>Chloride- Variant B | Product | Yield |
|---|---|---|---|
| S38 | ![S24 structure] S24 | ![product structure] | 74% |

Example S100

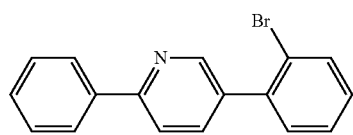 [SMILES: Brc1ccccc1-c1ccc(-c2ccccc2)nc1]

A mixture of 28.1 g (100 mmol) of 2-phenyl-5-[4,4,5,5-tetramethyl-1,3,2-dioxaborolan-2-yl)pyridine [879291-27-7], 28.2 g (100 mmol) of 1-bromo-2-iodobenzene [583-55-1], 31.8 g (300 mmol) of sodium carbonate, 787 mg (3 mmol) of triphenylphosphine, 225 mg (1 mmol) of palladium(II) acetate, 300 ml of toluene, 150 ml of ethanol and 300 ml of water is heated under reflux for 24 h. After cooling, the mixture is extended with 500 ml of toluene, and the organic phase is removed, washed once with 500 ml of water and once with 500 ml of saturated sodium chloride solution and dried over magnesium sulphate. After the solvent has been removed, the residue is recrystallized from ethyl acetate/n-heptane or chromatographed on silica gel (toluene/ethyl acetate, 9:1 v/v). Yield: 22.7 g (73 mmol), 73%. Purity: about 97% by $^1$H NMR.

In an analogous manner, it is possible to synthesize the following compounds:

| Ex. | Boronic ester | Product | Yield |
|---|---|---|---|
| S101 | ![S30 structure] S30 | ![product structure] | 70% |
| S102 | ![S31 structure] S31 | ![product structure] | 70% |

-continued

| Ex. | Boronic ester | Product | Yield |
|---|---|---|---|
| S103 | S32 | | 75% |
| S104 | S33 | | 69% |
| S105 | S34 | | 67% |
| S106 | | | 63% |
| S107 | S36 | | 73% |
| S108 | S37 | | 70% |

| Ex. | Boronic ester | Product | Yield |
|---|---|---|---|
| S109 | (structure, labeled S38) | (structure) | 66% |

Example S200

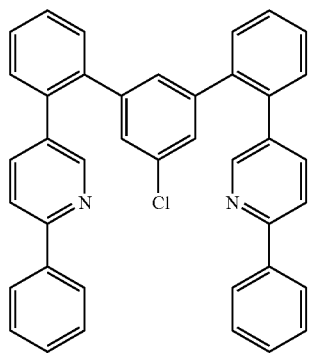

A well-stirred mixture of 36.5 g (100 mmol) of 2,2'-[5-(chloro)-1,3-phenylene]bis[4,4,5,5-tetramethyl-1,3,2-dioxaborolane [1417036-49-7], 65.2 g (210 mmol) of S100, 42.4 g (400 mmol) of sodium carbonate, 1.57 g (6 mmol) of triphenylphosphine, 500 mg (2 mmol) of palladium(II) acetate, 500 ml of toluene, 200 ml of ethanol and 500 ml of water is heated under reflux for 48 h. After cooling, the mixture is extended with 500 ml of toluene, and the organic phase is removed, washed once with 500 ml of water and once with 500 ml of saturated sodium chloride solution, dried over magnesium sulphate and then filtered through a Celite bed in the form of a toluene slurry. After the solvent has been removed under reduced pressure, the residue is recrystallized from acetonitrile, optionally with addition of ethyl acetate. Yield: 39.4 g (69 mmol), 69%. Purity: about 95% by $^1$H NMR.

The crude products can be purified by chromatography (Torrent Combi Flash from Axel Semrau).

In an analogous manner, it is possible to synthesize the following compounds:

| Ex. | Bromide |
|---|---|
| S201 | (structure, labeled S101) |

-continued
S202
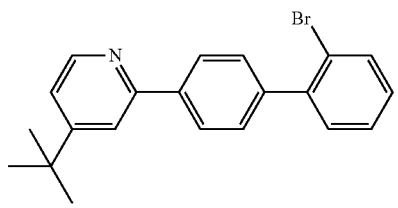 [SMILES: CC(C)(C)c1ccnc(-c2ccc(-c3ccccc3Br)cc2)c1]
S102
S203
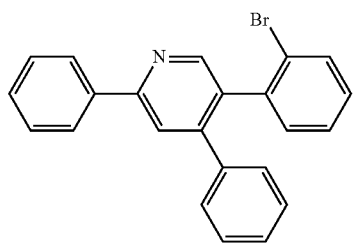 [SMILES: Brc1ccccc1-c1cnc(-c2ccccc2)cc1-c1ccccc1]
S103
S204
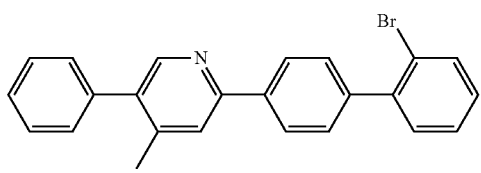 [SMILES: Cc1cc(-c2ccc(-c3ccccc3Br)cc2)ncc1-c1ccccc1]
S104
S205
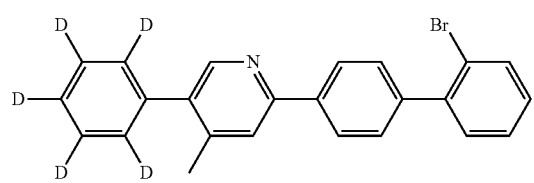 [SMILES: [2H]c1c([2H])c([2H])c(-c2cnc(-c3ccc(-c4ccccc4Br)cc3)cc2C)c([2H])c1[2H]]
S105
S206
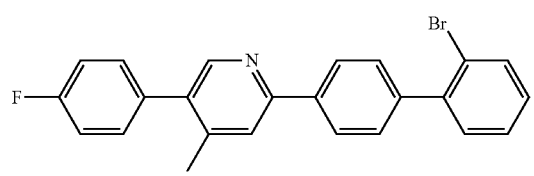 [SMILES: Cc1cc(-c2ccc(-c3ccccc3Br)cc2)ncc1-c1ccc(F)cc1]
S106
S207
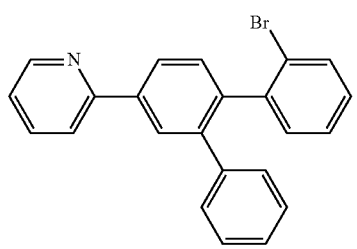 [SMILES: Brc1ccccc1-c1ccc(-c2ccccn2)cc1-c1ccccc1]
S107

S208
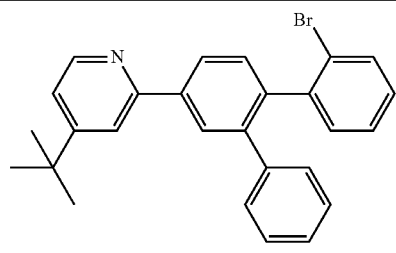
S108
S209
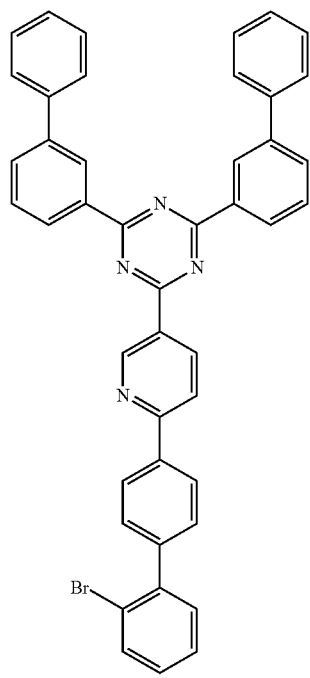 [SMILES: Brc1ccccc1-c1ccc(-c2ccc(-c3nc(-c4cccc(-c5ccccc5)c4)nc(-c4cccc(-c5ccccc5)c4)n3)cn2)cc1]
S109
| Ex. | Product | Yield |
|---|---|---|
| S201 | 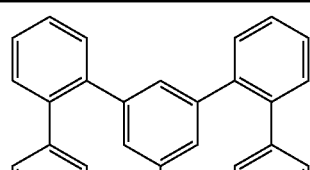 | 70% |

-continued
S202 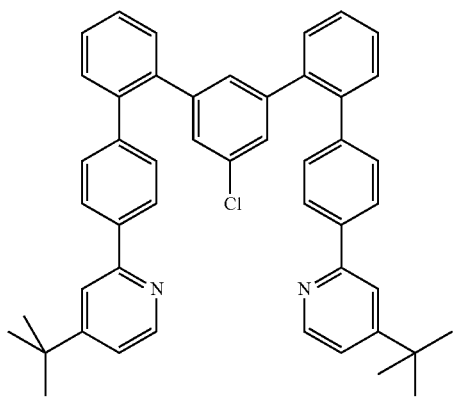 [SMILES: CC(C)(C)c1ccnc(-c2ccc(-c3ccccc3-c3cc(Cl)cc(-c4ccccc4-c4ccc(-c5cc(C(C)(C)C)ccn5)cc4)c3)cc2)c1] 68.5
S203 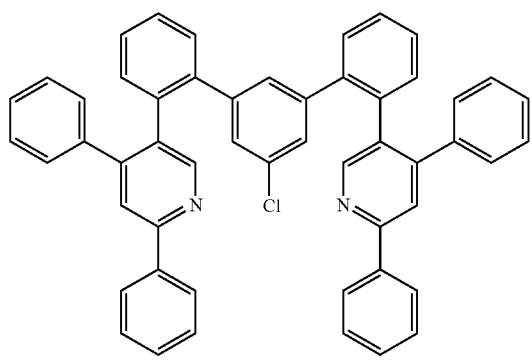 [SMILES: Clc1cc(-c2ccccc2-c2cnc(-c3ccccc3)cc2-c2ccccc2)cc(-c2ccccc2-c2cnc(-c3ccccc3)cc2-c2ccccc2)c1] 74%
S204 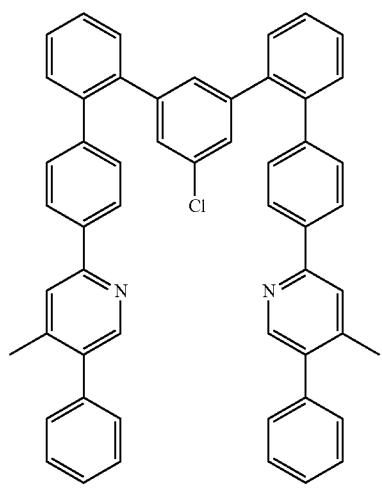 70%

-continued
S205 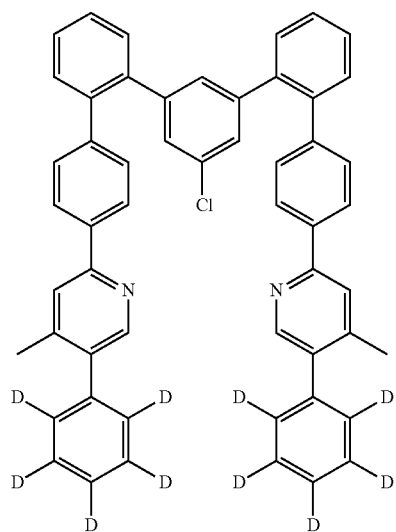 [SMILES: [2H]c1c([2H])c([2H])c(-c2cnc(-c3ccc(-c4ccccc4-c4cc(Cl)cc(-c5ccccc5-c5ccc(-c6cc(C)c(-c7c([2H])c([2H])c([2H])c([2H])c7[2H])cn6)cc5)c4)cc3)cc2C)c([2H])c1[2H]] 69%
S206 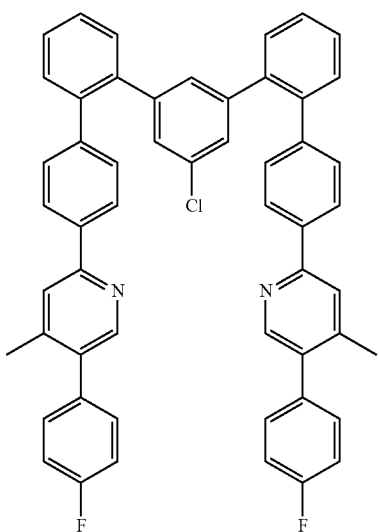 65%
S207 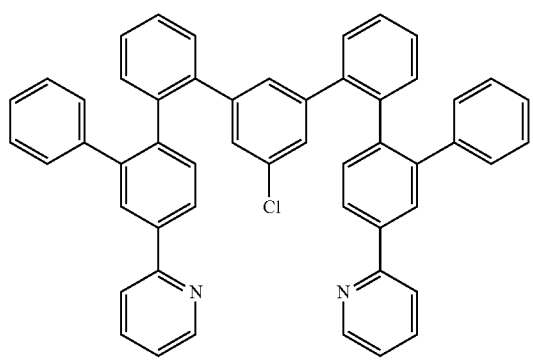 77%

| | |
|---|---|
| S208 | 73% |

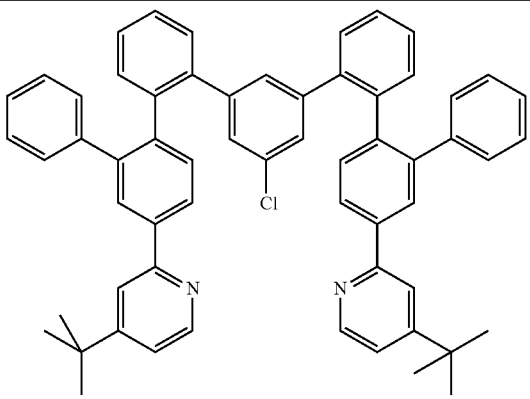

| | |
|---|---|
| S209 | 69% |

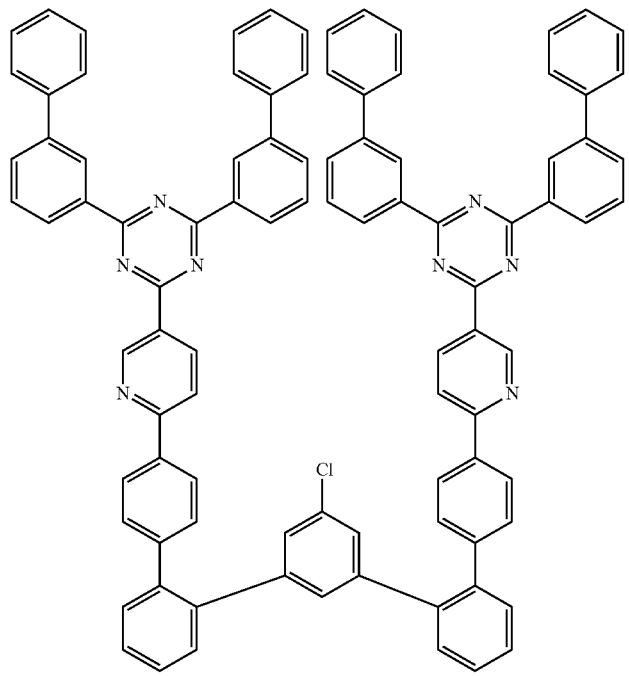

Example S300

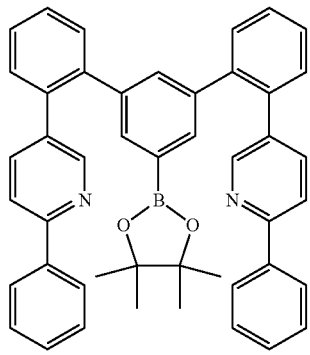

A mixture of 57.1 g (100 mmol) of S200, 27.9 g (110 mmol) of bis(pinacolato)diborane [73183-34-3], 29.4 g (300 mmol) of potassium acetate, 534 mg (1.3 mmol) of SPhos [657408-07-6], 225 mg (1 mmol) of palladium(II) acetate, 100 g of glass beads (diameter 3 mm) and 500 ml of 1,4-dioxane is heated under reflux for 16 h. After cooling, the suspension is freed of the 1,4-dioxane under reduced pressure, and the residue is taken up in 500 ml of ethyl acetate, washed twice with 300 ml of water and once with 200 ml of saturated sodium chloride solution, dried over magnesium sulphate and then filtered through a Celite bed in the form of a slurry, which is washed through with a little ethyl acetate. The filtrate is concentrated to dryness and then recrystallized from ethyl acetate/methanol. Yield: 53.7 g (81 mmol), 81%. Purity: about 97% by $^1$H NMR.

In an analogous manner, it is possible to synthesize the following compounds:

| Ex. | Reactant |
|---|---|
| S301 | S201 |
| S302 | S202 |
| S303 | S203 |

S304
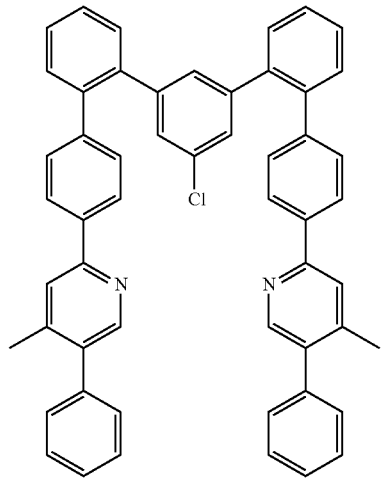
S204
S305
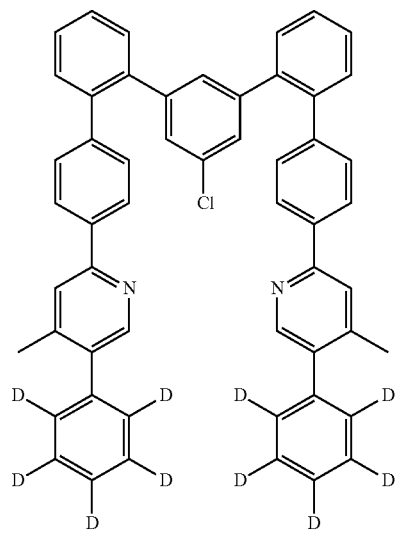
S205
S306
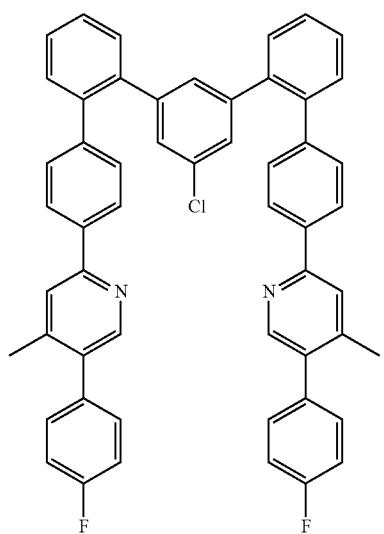
S206

-continued
S307
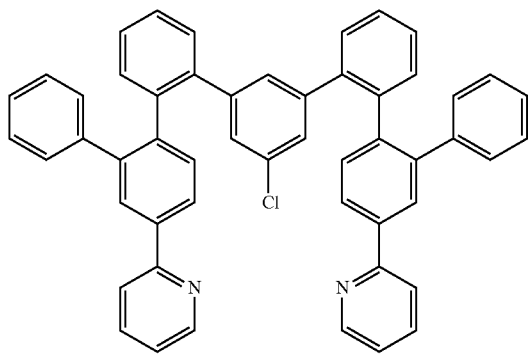 [SMILES: Clc1cc(-c2ccccc2-c2ccc(-c3ccccn3)cc2-c2ccccc2)cc(-c2ccccc2-c2ccc(-c3ccccn3)cc2-c2ccccc2)c1]
S207
S308
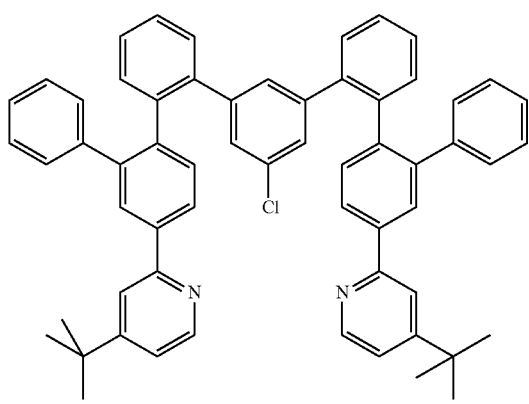 [SMILES: CC(C)(C)c1ccnc(-c2ccc(-c3ccccc3-c3cc(Cl)cc(-c4ccccc4-c4ccc(-c5cc(C(C)(C)C)ccn5)cc4-c4ccccc4)c3)c(-c3ccccc3)c2)c1]
S208
S309
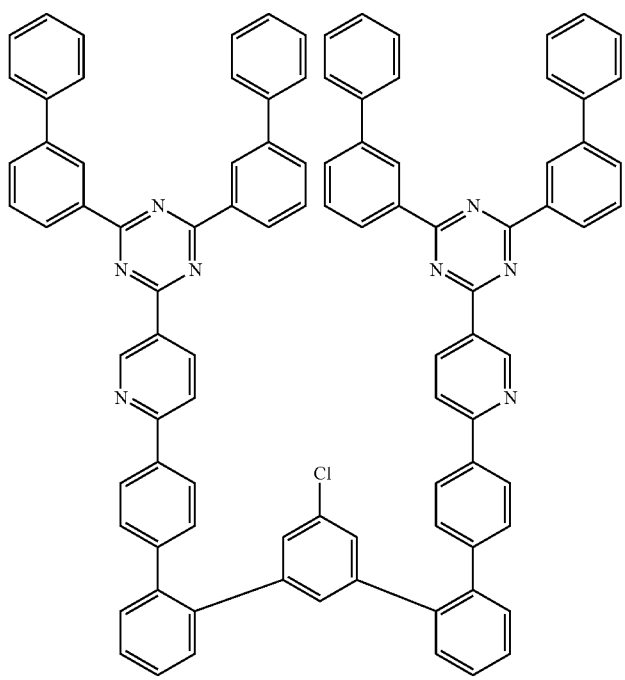 [SMILES: Clc1cc(-c2ccccc2-c2ccc(-c3ccc(-c4nc(-c5cccc(-c6ccccc6)c5)nc(-c5cccc(-c6ccccc6)c5)n4)cn3)cc2)cc(-c2ccccc2-c2ccc(-c3ccc(-c4nc(-c5cccc(-c6ccccc6)c5)nc(-c5cccc(-c6ccccc6)c5)n4)cn3)cc2)c1]
S209

-continued
| Ex. | Product | Yield |
|---|---|---|
| S301 | 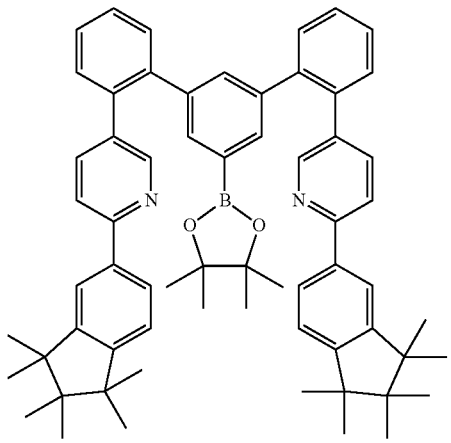 | 83% |
| S302 | 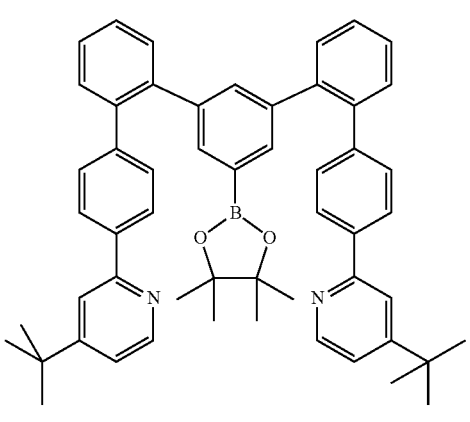 [SMILES: CC(C)(C)c1ccnc(-c2ccc(-c3ccccc3-c3cc(B4OC(C)(C)C(C)(C)O4)cc(-c4ccccc4-c4ccc(-c5cc(C(C)(C)C)ccn5)cc4)c3)cc2)c1] | 87% |
| S303 | 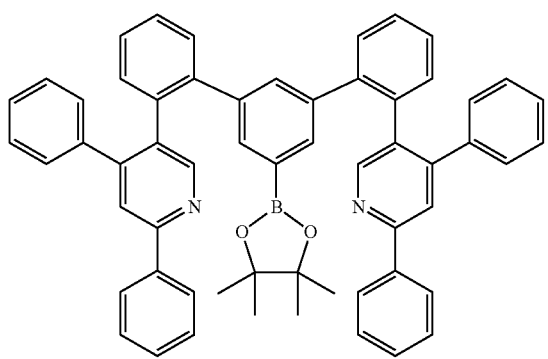 [SMILES: CC1(C)OB(c2cc(-c3ccccc3-c3cnc(-c4ccccc4)cc3-c3ccccc3)cc(-c3ccccc3-c3cnc(-c4ccccc4)cc3-c3ccccc3)c2)OC1(C)C] | 85% |

S304 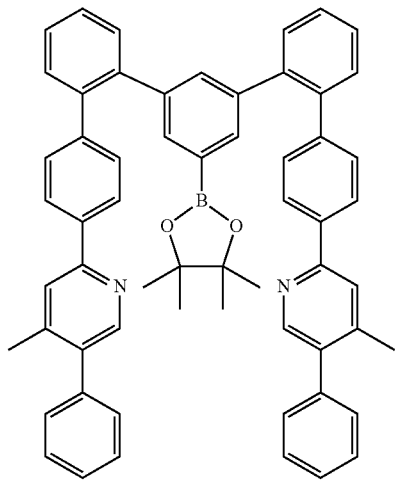 80%
S305 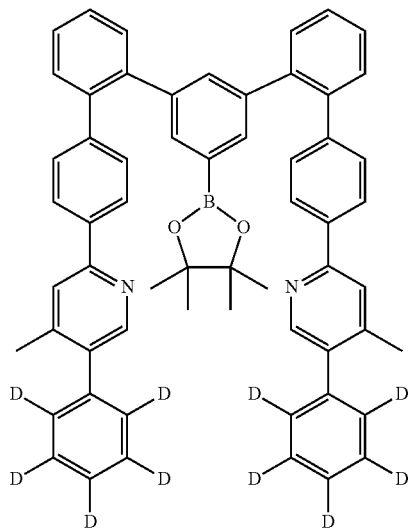 [SMILES: [2H]c1c([2H])c([2H])c(-c2cnc(-c3ccc(-c4ccccc4-c4cc(B5OC(C)(C)C(C)(C)O5)cc(-c5ccccc5-c5ccc(-c6cc(C)c(-c7c([2H])c([2H])c([2H])c([2H])c7[2H])cn6)cc5)c4)cc3)cc2C)c([2H])c1[2H]] 82%
S306 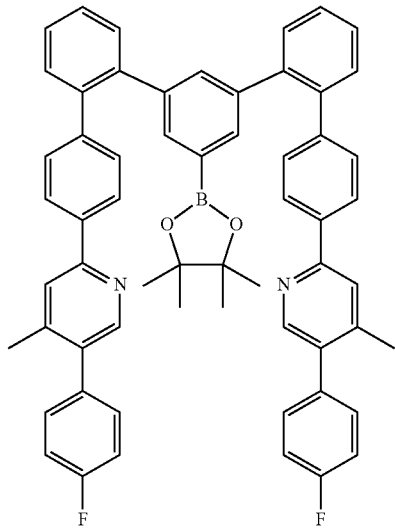 77%

S307 88%
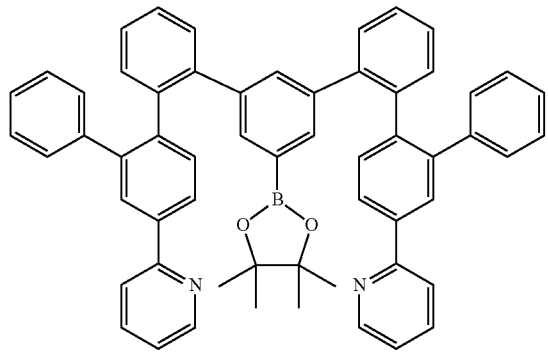 [SMILES: CC1(C)OB(c2cc(-c3ccccc3-c3ccc(-c4ccccn4)cc3-c3ccccc3)cc(-c3ccccc3-c3ccc(-c4ccccn4)cc3-c3ccccc3)c2)OC1(C)C]
S308 84%
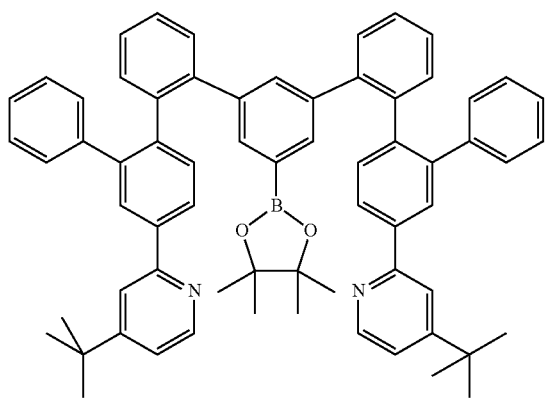 [SMILES: CC(C)(C)c1ccnc(-c2ccc(-c3ccccc3-c3cc(B4OC(C)(C)C(C)(C)O4)cc(-c4ccccc4-c4ccc(-c5cc(C(C)(C)C)ccn5)cc4-c4ccccc4)c3)c(-c3ccccc3)c2)c1]
S309 89%
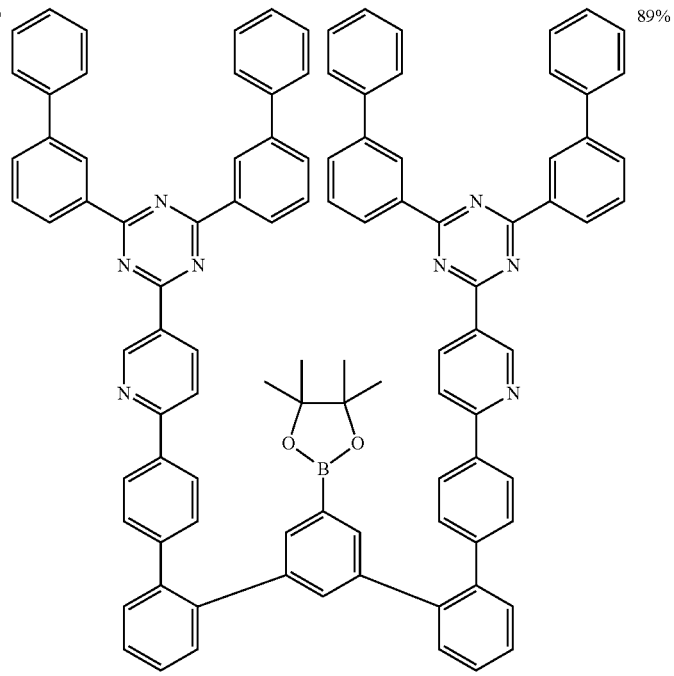

2.2 Preparation of the Hexadentate Ligands L

Example L1

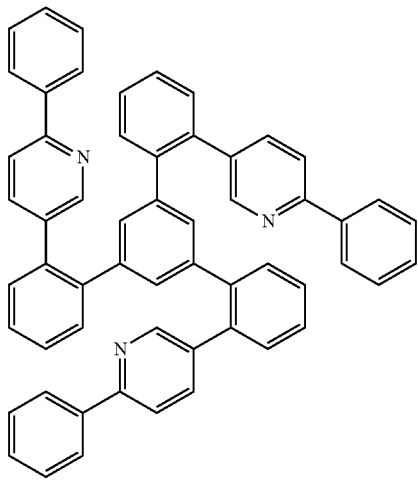 [SMILES: c1ccc(-c2ccc(-c3ccccc3-c3cc(-c4ccccc4-c4ccc(-c5ccccc5)nc4)cc(-c4ccccc4-c4ccc(-c5ccccc5)nc4)c3)cn2)cc1]

A mixture of 54.1 g (100 mmol) of 1,3,5-tris(2-bromophenyl)benzene [380626-56-2], 98.4 g (350 mmol) of 2-phenyl-5-(4,4,5,5-tetramethyl-[1,3,2]dioxaborolan-2-yl)-pyridine, 106.0 g (1 mol) of sodium carbonate, 5.8 g (5 mmol) of tetrakis(triphenylphosphino)palladium(0), 750 ml of toluene, 200 ml of ethanol and 500 ml of water is heated under reflux with very good stirring for 24 h. After 24 h, 300 ml of 5% by weight aqueous acetylcysteine solution are added, the mixture is stirred under reflux for a further 16 h and allowed to cool, the aqueous phase is removed and the organic phase is concentrated to dryness. After the organic phase from the Suzuki coupling has been concentrated, the brown foam is taken up in 300 ml of a mixture of dichloromethane:ethyl acetate (8:1, v/v) and filtered through a silica gel bed in the form of a dichloromethane:ethyl acetate slurry (8:1, v/v) (diameter 15 cm, length 20 cm), in order to remove brown components. After concentration, the remaining foam is recrystallized from 800 ml of ethyl acetate with addition of 400 ml of methanol at boiling and then for a second time from 1000 ml of pure ethyl acetate and then subjected to Kugelrohr sublimation under high vacuum (p about $10^{-5}$ mbar, T 280° C.). Yield: 50.6 g (66 mmol), 66%. Purity: about 99.7% by $^1$H NMR.

In an analogous manner, it is possible to prepare the following compounds, where the purification can also be effected by chromatography (for example Torrent Combi-Flash from Axel Semrau):

| Ex. | Bromide Boronic ester | Product Variant | Yield |
|---|---|---|---|
| L2 | S1 S31 | | 63% |

-continued
| Ex. | Bromide Boronic ester | Product Variant | Yield |
|---|---|---|---|
| L3 | S2 S32 | 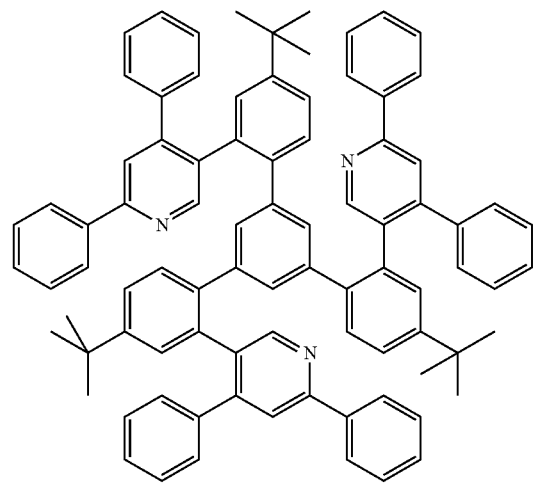 [SMILES: CC(C)(C)c1ccc(-c2cc(-c3ccc(C(C)(C)C)cc3-c3cnc(-c4ccccc4)cc3-c3ccccc3)cc(-c3ccc(C(C)(C)C)cc3-c3cnc(-c4ccccc4)cc3-c3ccccc3)c2)c(-c2cnc(-c3ccccc3)cc2-c2ccccc2)c1] | 70% |
| L4 | S3 S33 | 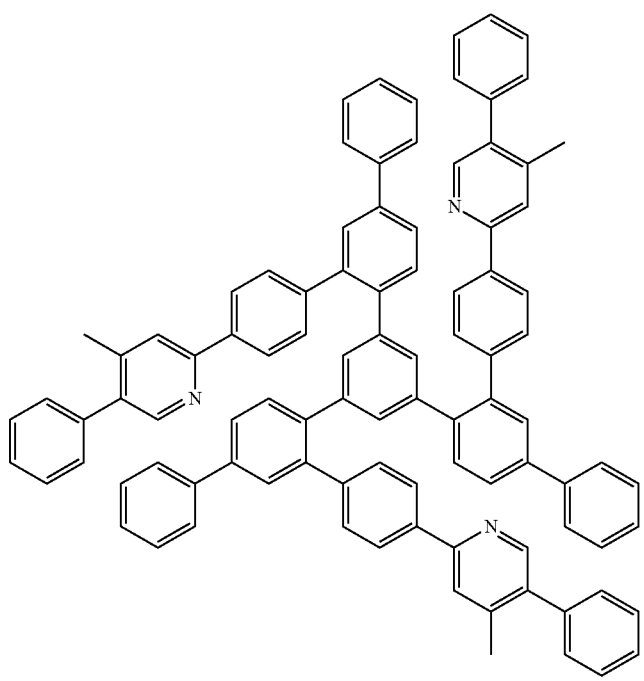 [SMILES: Cc1cc(-c2ccc(-c3cc(-c4ccccc4)ccc3-c3cc(-c4ccc(-c5ccccc5)cc4-c4ccc(-c5cc(C)c(-c6ccccc6)cn5)cc4)cc(-c4ccc(-c5ccccc5)cc4-c4ccc(-c5cc(C)c(-c6ccccc6)cn5)cc4)c3)cc2)ncc1-c1ccccc1] | 64% |

| Ex. | Bromide Boronic ester | Product Variant | Yield |
|---|---|---|---|
| L5 | S4 S35 | 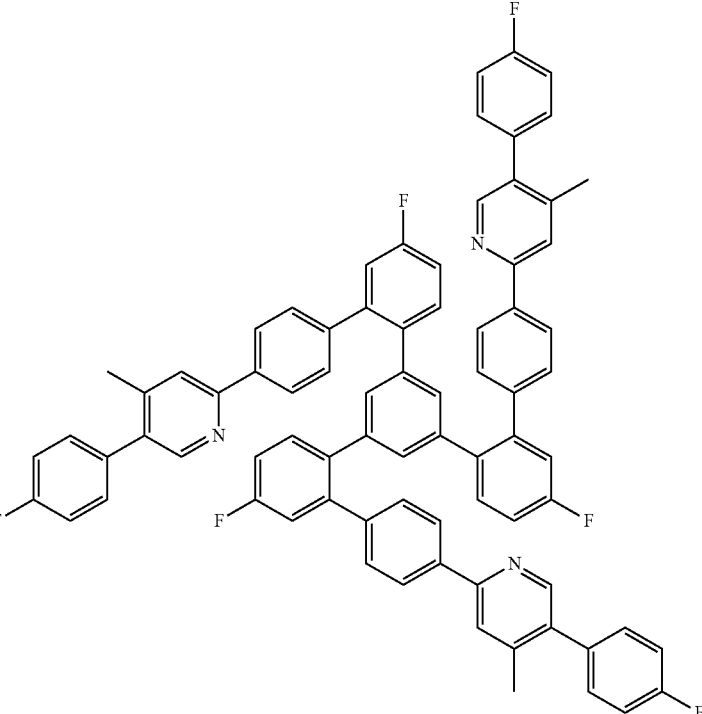 [SMILES: Cc1cc(-c2ccc(-c3cc(F)ccc3-c3cc(-c4ccc(F)cc4-c4ccc(-c5cc(C)c(-c6ccc(F)cc6)cn5)cc4)cc(-c4ccc(F)cc4-c4ccc(-c5cc(C)c(-c6ccc(F)cc6)cn5)cc4)c3)cc2)ncc1-c1ccc(F)cc1] | 58% |

Example L100

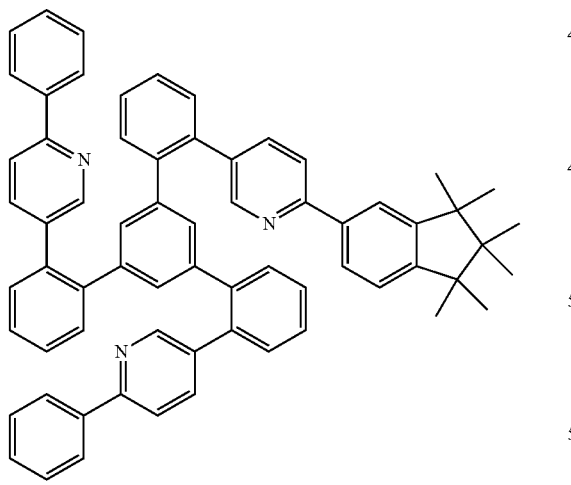

A mixture of 66.3 g (100 mmol) of S300, 43.4 g (105 mmol) of S101, 63.7 g (300 mmol) of tripotassium phosphate, 1.23 g (3 mmol) of SPhos [657408-07-6], 449 mg (2 mmol) of palladium(II) acetate, 500 ml of toluene, 300 ml of dioxane and 300 ml of water is heated under reflux for 6 h. After cooling, the organic phase is removed, washed twice with 300 ml of water and once with 200 ml of saturated sodium chloride solution, dried over magnesium sulphate and then filtered through a Celite bed in the form of a toluene slurry, which is washed through with toluene. The filtrate is concentrated to dryness and the residue is then recrystallized twice from ethyl acetate/methanol. Yield: 58.8 g (66 mmol), 66%. Purity: about 97% by $^1$H NMR.
In an analogous manner, it is possible to synthesize the following compounds:
| Ex. | Bromide | Boronic ester | Product | Yield |
|-----|---------|---------------|---------|-------|
| L101 | S301 S100 | | 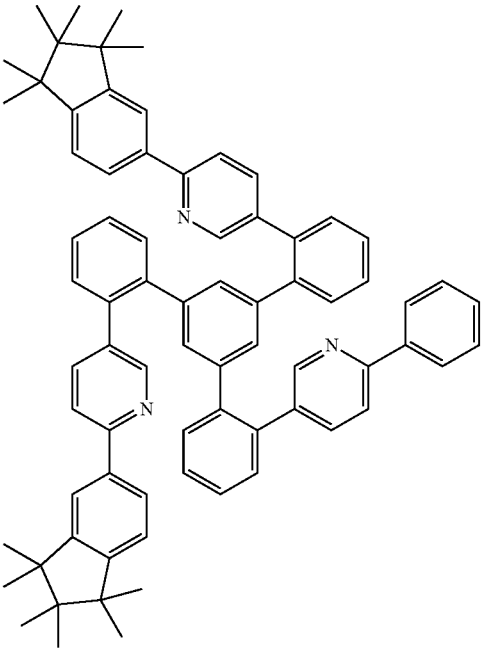 [SMILES: CC1(C)c2ccc(-c3ccc(-c4ccccc4-c4cc(-c5ccccc5-c5ccc(-c6ccccc6)nc5)cc(-c5ccccc5-c5ccc(-c6ccc7c(c6)C(C)(C)C(C)(C)C7(C)C)nc5)c4)cn3)cc2C(C)(C)C1(C)C] | 70% |
| L102 | S301 S103 | | 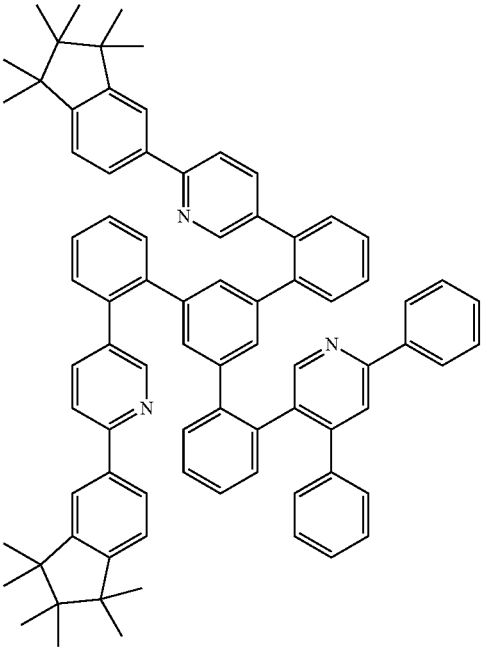 [SMILES: CC1(C)c2ccc(-c3ccc(-c4ccccc4-c4cc(-c5ccccc5-c5ccc(-c6ccc7c(c6)C(C)(C)C(C)(C)C7(C)C)nc5)cc(-c5ccccc5-c5cnc(-c6ccccc6)cc5-c5ccccc5)c4)cn3)cc2C(C)(C)C1(C)C] | 72% |

| Ex. | Boronic ester Bromide | Product | Yield |
|---|---|---|---|
| L103 | S302 S107 | 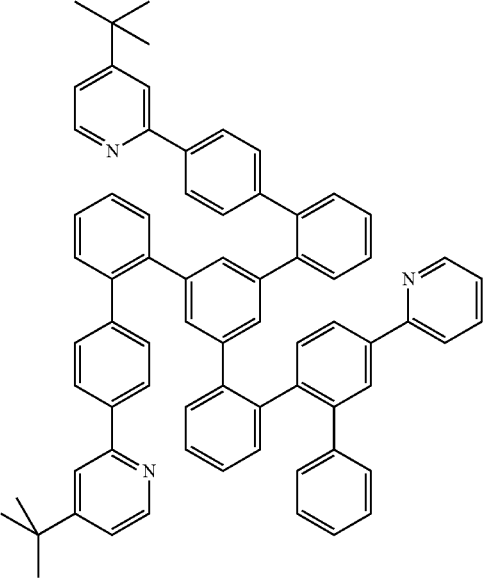 [SMILES: CC(C)(C)c1ccnc(-c2ccc(-c3ccccc3-c3cc(-c4ccccc4-c4ccc(-c5cc(C(C)(C)C)ccn5)cc4)cc(-c4ccccc4-c4ccc(-c5ccccn5)cc4-c4ccccc4)c3)cc2)c1] | 68% |
| L104 | S302 S108 | 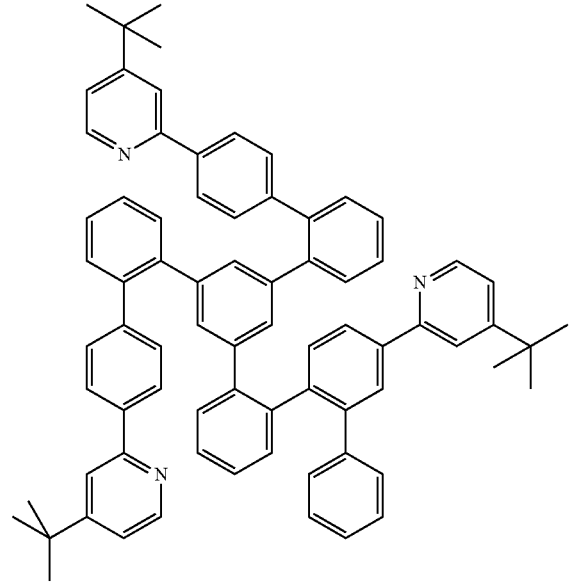 [SMILES: CC(C)(C)c1ccnc(-c2ccc(-c3ccccc3-c3cc(-c4ccccc4-c4ccc(-c5cc(C(C)(C)C)ccn5)cc4)cc(-c4ccccc4-c4ccc(-c5cc(C(C)(C)C)ccn5)cc4-c4ccccc4)c3)cc2)c1] | 79% |

-continued
| Ex. | Boronic ester Bromide | Product | Yield |
|---|---|---|---|
| L105 | S303 S101 | 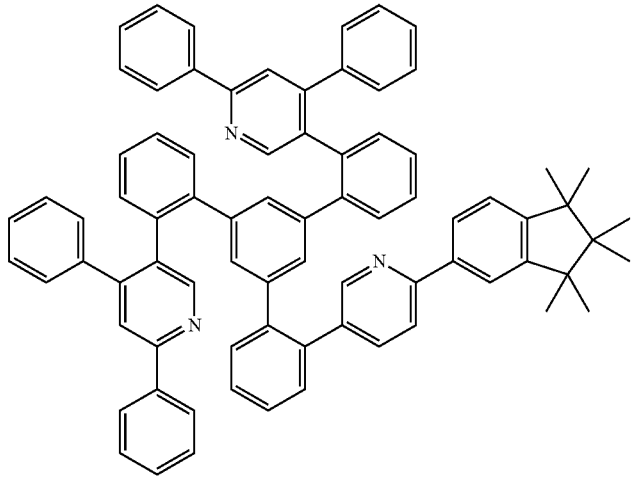 [SMILES: CC1(C)c2ccc(-c3ccc(-c4ccccc4-c4cc(-c5ccccc5-c5cnc(-c6ccccc6)cc5-c5ccccc5)cc(-c5ccccc5-c5cnc(-c6ccccc6)cc5-c5ccccc5)c4)cn3)cc2C(C)(C)C1(C)C] | 75% |
| L106 | S304 S108 | 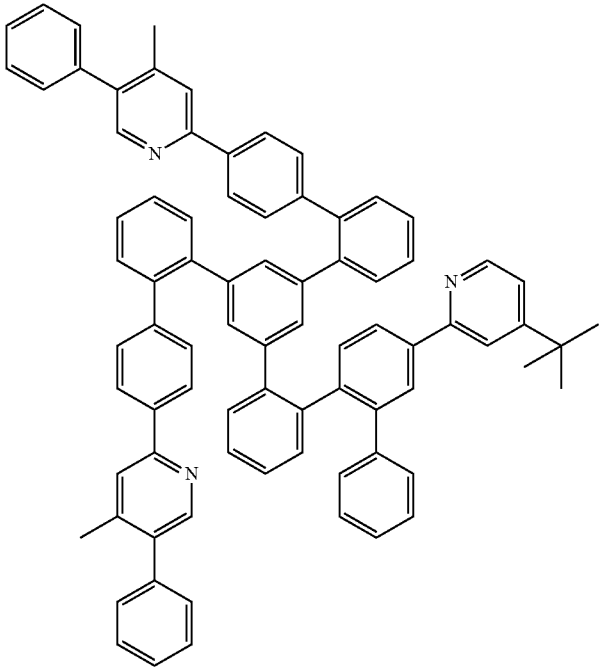 [SMILES: Cc1cc(-c2ccc(-c3ccccc3-c3cc(-c4ccccc4-c4ccc(-c5cc(C)c(-c6ccccc6)cn5)cc4)cc(-c4ccccc4-c4ccc(-c5cc(C(C)(C)C)ccn5)cc4-c4ccccc4)c3)cc2)ncc1-c1ccccc1] | 68% |

-continued

| Ex. | Boronic ester Bromide | Product | Yield |
|---|---|---|---|
| L107 | S305 S107 | | 67% |
| L108 | S306 S108 | | 70% |

-continued
| Ex. | Boronic ester Bromide | Product | Yield |
|---|---|---|---|
| L109 | S307 S104 | 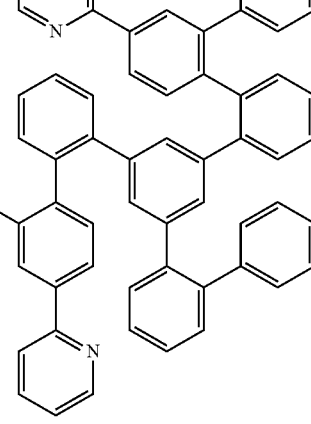 | 76% |
| L110 | S308 S106 | 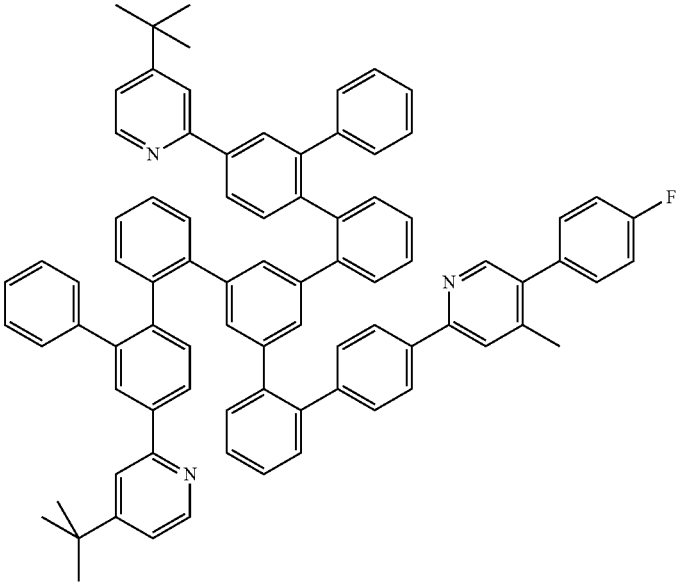 | 69% |

-continued

| Ex. | Bromide / Boronic ester | Product | Yield |
|---|---|---|---|
| L111 | S309 S108 | | 67% |
| L112 | S308 S109 | | |

2.3 Preparation of the Mononuclear Metal Complexes

Example Ir(L1)

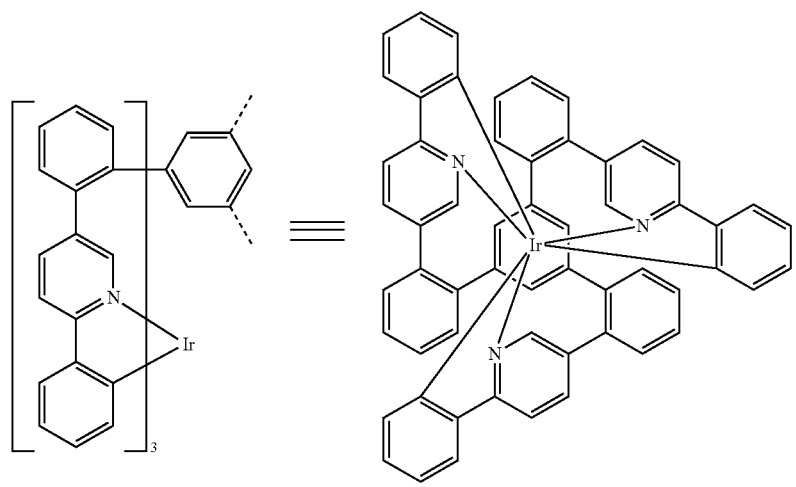

A mixture of 7.66 g (10 mmol) of ligand L1, 4.90 g (10 mmol) of trisacetylacetonatoiridium(III) [15635-87-7] and 120 g of hydroquinone [123-31-9] is initially charged in a 500 ml two-neck round-bottomed flask with a glass-sheathed magnetic core. The flask is provided with a water separator (for media of lower density than water) and an air condenser with argon blanketing. The flask is placed in a metal heating bath. The apparatus is purged with argon from the top via the argon blanketing system for 15 min, allowing the argon to flow out of the side neck of the two-neck flask. Through the side neck of the two-neck flask, a glass-sheathed Pt-100 thermocouple is introduced into the flask and the end is positioned just above the magnetic stirrer core. Then the apparatus is thermally insulated with several loose windings of domestic aluminium foil, the insulation being run up to the middle of the riser tube of the water separator. Then the apparatus is heated rapidly with a heated laboratory stirrer system to 250-260° C., measured with the Pt-100 thermal sensor which dips into the molten stirred reaction mixture. Over the next 1.5 h, the reaction mixture is kept at 250-260° C., in the course of which a small amount of condensate is distilled off and collects in the water separator. After cooling, the melt cake is mechanically comminuted and extracted by boiling with 500 ml of methanol. The beige suspension thus obtained is filtered through a double-ended frit, and the beige solid is washed once with 50 ml of methanol and then dried under reduced pressure. Crude yield: quantitative. The solid thus obtained is dissolved in 1500 ml of dichloromethane and filtered through about 1 kg of silica gel in the form of a dichloromethane slurry (column diameter about 18 cm) with exclusion of air in the dark, leaving dark-coloured components at the start. The core fraction is cut out and substantially concentrated on a rotary evaporator, with simultaneous continuous dropwise addition of MeOH until crystallization. After removal with suction, washing with a little MeOH and drying under reduced pressure, the yellow product is purified further by continuous hot extraction three times with toluene/acetonitrile (3:1, v/v) and hot extraction five times with toluene (amount initially charged in each case about 150 ml, extraction thimble: standard Soxhlet thimbles made from cellulose from Whatman) with careful exclusion of air and light. Yield: 8.52 g (8.9 mmol), 89%. Purity: >99.9% by HPLC.

In an analogous manner, it is possible to prepare the following compounds:
| Ex. | Ligand | Product<br>Reaction time*<br>Reaction temperature*<br>Extractant* | Yield |
|---|---|---|---|
| Ir(L2) | L2 | Ir(L2) | 87% |
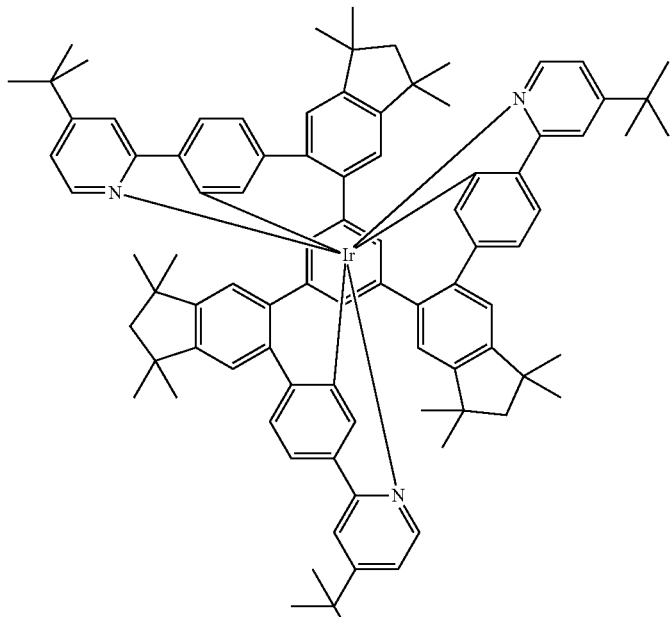
ethyl acetate/acetonitrile (1:2 v/v)
| Ir(L3) | L3 | Ir(L3) | 84% |
|---|---|---|---|
|  |  | toluene |  |
| Ir(L4) | L4 | Ir(L4) | 85% |
|  |  | butyl acetate |  |
| Ir(L5) | L5 | Ir(L5) | 80% |
|  |  | toluene |  |
| Ir(L100) | L100 | Ir(L100) | 61% |
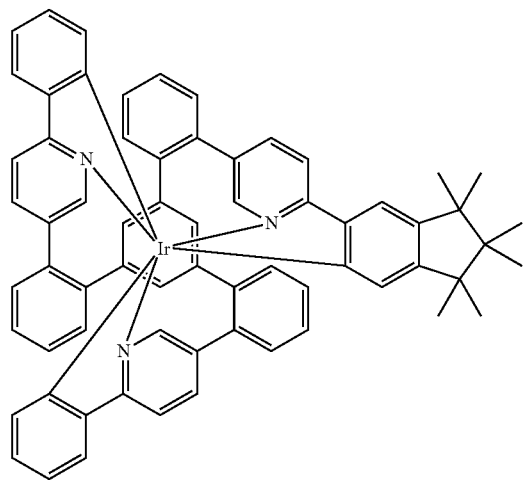
ethyl acetate
| Ir(L101) | L101 | ethyl acetate<br>Ir(L101)<br>butyl acetate | 63% |
|---|---|---|---|

| Ex. | Ligand | Product<br>Reaction time*<br>Reaction temperature*<br>Extractant* | Yield |
|---|---|---|---|
| Ir(L102) | L102 | Ir(L102)<br>as Ir(L101) | 49% |
| Ir(L103) | L103 | Ir(L103)<br>as Ir(L101) | 58% |
| Ir(L104) | L104 | Ir(L104)<br>as Ir(L101) | 71% |
| Ir(L105) | L105 | Ir(L105)<br>as Ir(L101) | 66% |
| Ir(L106) | L106 | Ir(L106)<br>as Ir(L101) | 70% |
| Ir(L107) | L107 | Ir(L107)<br>as Ir(L101) | 70% |
| Ir(L108) | L108 | Ir(L108)<br>as Ir(L101) | 67% |
| Ir(L109) | L109 | Ir(L109)<br>as Ir(L101) | 63% |
| Ir(L110) | L110 | Ir(L110)<br>as Ir(L101) | 65% |
| Ir(L111) | L111 | Ir(L111)<br>toluene | 61% |
| Ir(L112) | L112 | Ir(L112)<br>dichloromethane/acetonitrile<br>(1:3 v/v) | 57% |

*Stated if different from general method

2.4 Halogenation of the Mononuclear Metal Complexes

General Procedure:

To a solution or suspension of 10 mmol of a complex bearing A×C—H groups in the para position to the iridium in 500 ml to 2000 ml of dichloromethane according to the solubility of the metal complex is added, in the dark and with exclusion of air, at −30 to +30° C., A×10.5 mmol of N-halosuccinimide (halogen: Cl, Br, I; A=1 corresponds to monohalogenation, A=2 corresponds to dihalogenation, A=3 corresponds to trihalogenation), and the mixture is stirred for 20 h. Complexes of sparing solubility in DCM may also be converted in other solvents (TCE, THF, DMF, chlorobenzene, etc.) and at elevated temperature. Subsequently, the solvent is substantially removed under reduced pressure. The residue is extracted by boiling with 100 ml of methanol, and the solids are filtered off with suction, washed three times with about 30 ml of methanol and then dried under reduced pressure. Substoichiometric brominations, for example mono- and dibrominations of complexes having 3 C—H groups in the para position to iridium, usually proceed less selectively than the stoichiometric brominations. The crude products of these brominations can be separated by chromatography (CombiFlash Torrent from A. Semrau) or by fractional crystallization.

Example Ir(L1-3Br)

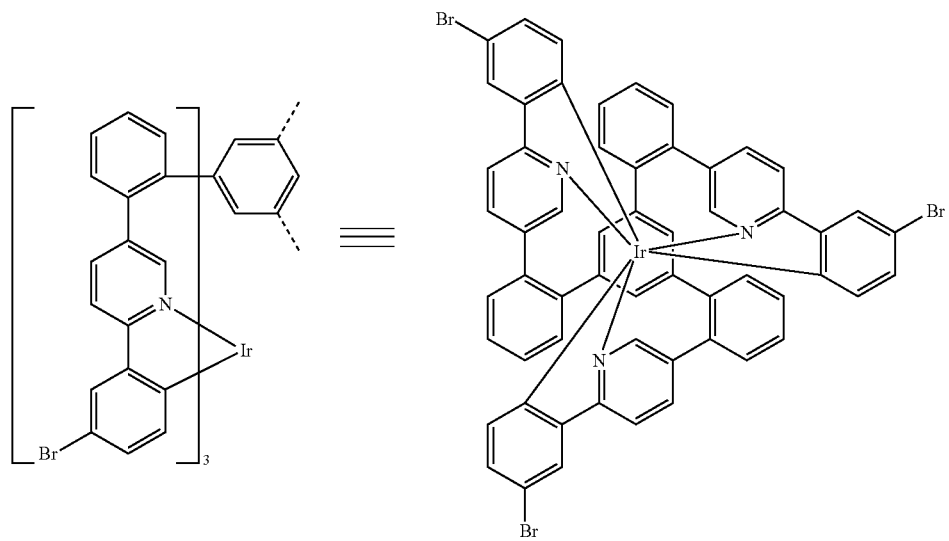

To a suspension, stirred at 0° C., of 9.6 g (10 mmol) of Ir(L1) in 2000 ml of dichloromethane (DCM) are added 5.6 g (31.5 mmol) of N-bromosuccinimide all at once and then the mixture is stirred for a further 20 h. After removing about 1900 ml of the DCM under reduced pressure, 100 ml of methanol are added to the yellow suspension, which is boiled while stirring, and the solids are filtered off with suction, washed three times with about 30 ml of methanol and then dried under reduced pressure. Yield: 11.3 g (9.5 mmol), 95%; purity: >99.0% by NMR.

In an analogous manner, it is possible to prepare the following complexes:

| Ex. | Reactant > brominated complex<br>Conditions (if different from general method) | Yield |
|---|---|---|
| Tribromination | | |
| Ir(L3-3Br) | | 92% |
| Ir(L4-3Br) | | 90% |

-continued
| Ex. | Reactant > brominated complex<br>Conditions (if different from general method) | Yield |
|---|---|---|
| | Dibromination | |
| Ir(L1-2Br) | 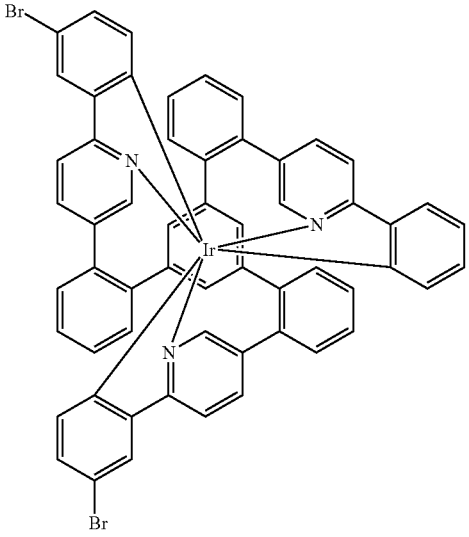<br>Ir(L1) + 21 mmol NBS > Ir(L100-2Br)<br>DMSO/60° C. | 33% |
| Ir(L100-2Br) | 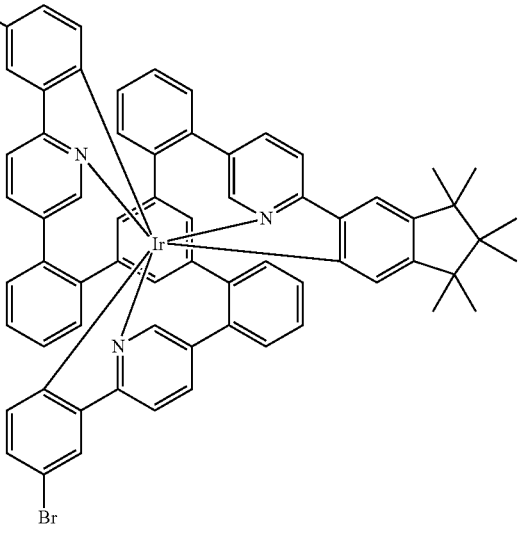<br>Ir(L100) + 21 mmol NBS > Ir(L100-2Br)<br>DCM | 95% |

| Ex. | Reactant > brominated complex<br>Conditions (if different from general method) | Yield |
|---|---|---|
| Ir(L103-2Br) | Ir(L103) + 21 mmol NBS > Ir(L103-2Br)<br>DCM | 93% |
| Ir(L104-2Br) | Ir(L104) + 21 mmol NBS > Ir(L104-2Br)<br>DCM | 94% |

-continued
| Ex. | Reactant > brominated complex<br>Conditions (if different from general method) | Yield |
|---|---|---|
| Ir(L105-2Br) | 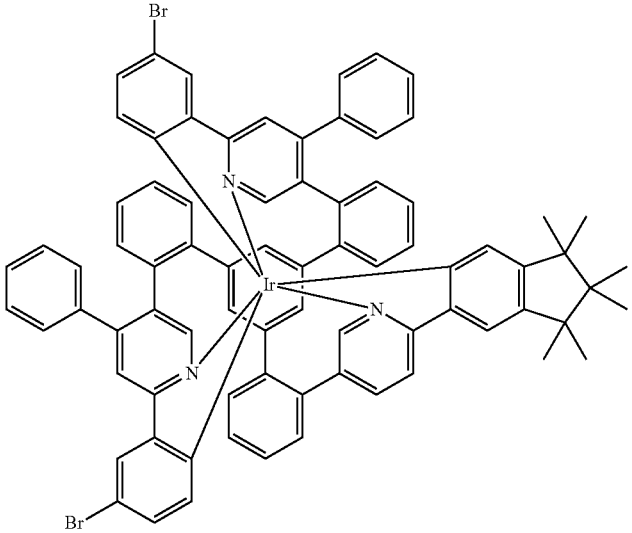<br>Ir(L105) + 21 mmol NBS > Ir(L105-2Br)<br>DCM | 93% |
| Ir(L106-2Br) | 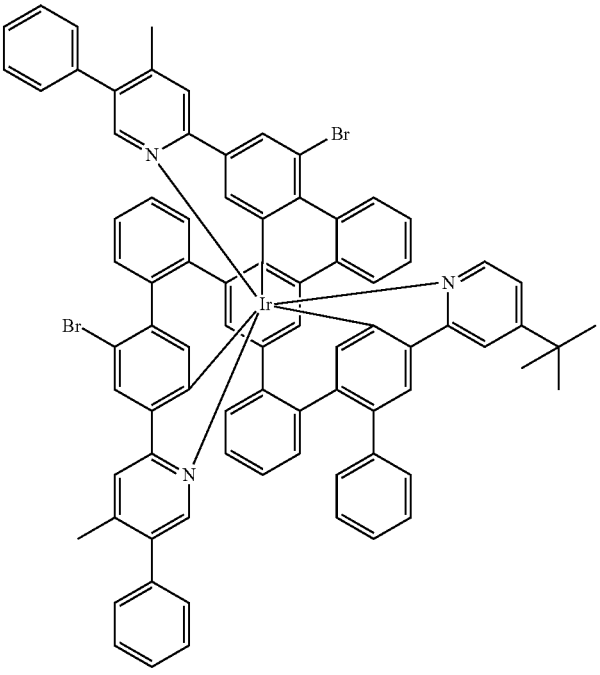<br>Ir(L106) + 21 mmol NBS > Ir(L106-2Br)<br>DCM | 91% |

| Ex. | Reactant > brominated complex Conditions (if different from general method) | Yield |
|---|---|---|
| Ir(L107-2Br) | 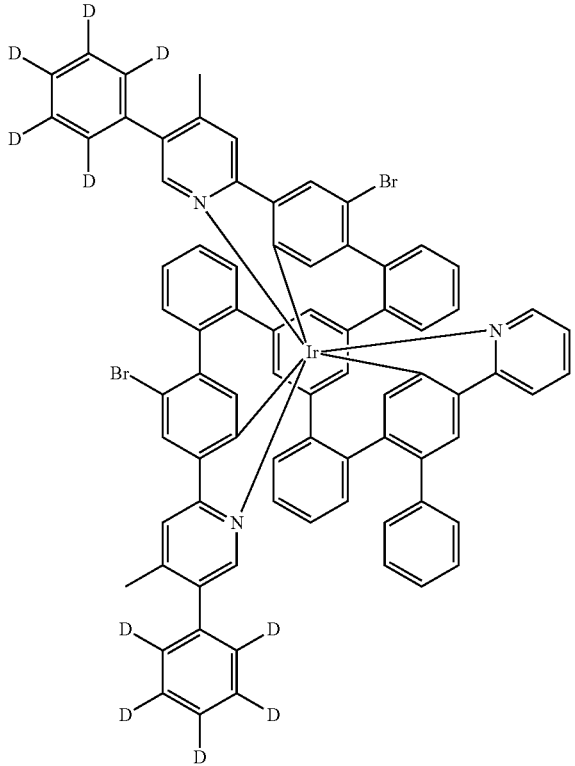 [SMILES: [2H]c1c([2H])c([2H])c(-c2cnc(-c3ccc(-c4ccccc4-c4cc(-c5ccccc5-c5ccc(-c6cc(C)c(-c7c([2H])c([2H])c([2H])c([2H])c7[2H])cn6)cc5)cc(-c5ccccc5-c5ccc(-c6ccccn6)cc5-c5ccccc5)c4)cc3)cc2C)c([2H])c1[2H]] Ir(L107) + 21 mmol NBS > Ir(L107-2Br) DCM | 90% |
| Ir(L108-2Br) | 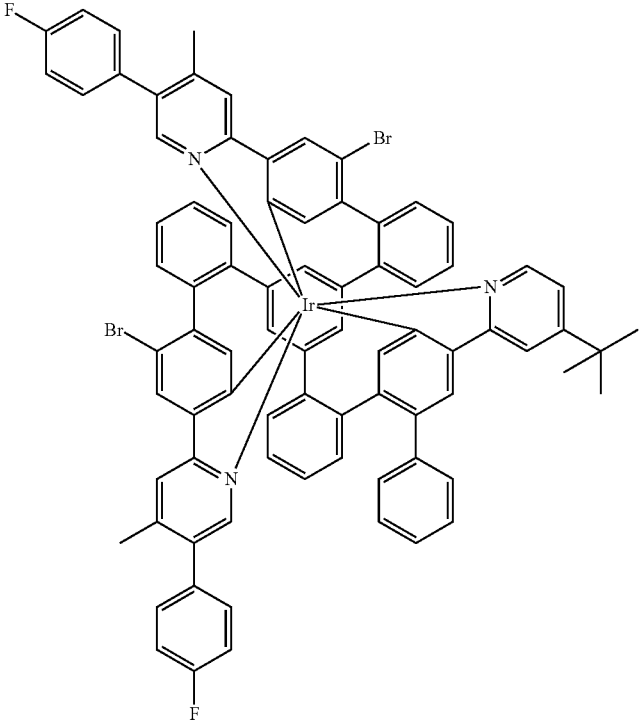 [SMILES: Cc1cc(-c2ccc(-c3ccccc3-c3cc(-c4ccccc4-c4ccc(-c5cc(C)c(-c6ccc(F)cc6)cn5)cc4)cc(-c4ccccc4-c4ccc(-c5cc(C(C)(C)C)ccn5)cc4-c4ccccc4)c3)cc2)ncc1-c1ccc(F)cc1] Ir(L108) + 21 mmol NBS > Ir(L108-2Br) DCM | 92% |

| Ex. | Reactant > brominated complex<br>Conditions (if different from general method) | Yield |
|---|---|---|
| Ir(L111-2Br) | 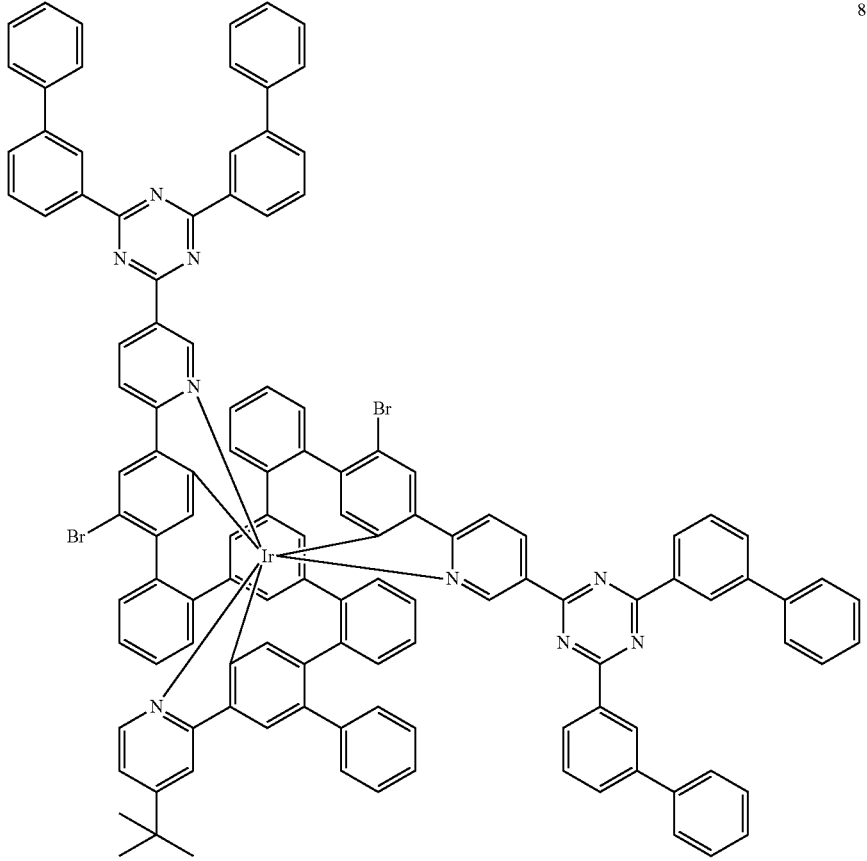<br>Ir(L111) + 21 mmol NBS > Ir(L111-2Br)<br>DCM | 87% |
| | Monobromination | |
| Ir(L1-1Br) | 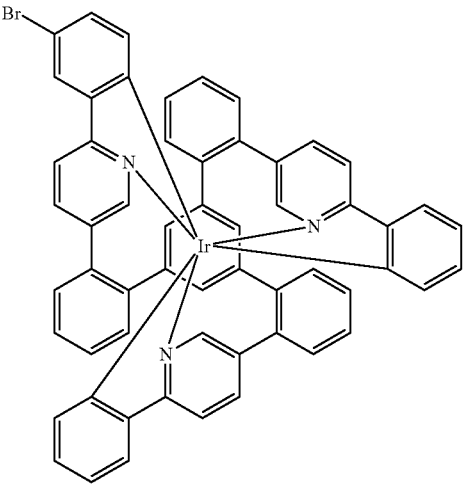<br>Ir(L1) + 10.5 mmol NBS > Ir(L1-1Br)<br>DMSO/60° C. | 24% |

| Ex. | Reactant > brominated complex<br>Conditions (if different from general method) | Yield |
|---|---|---|
| Ir(L2-1Br) | 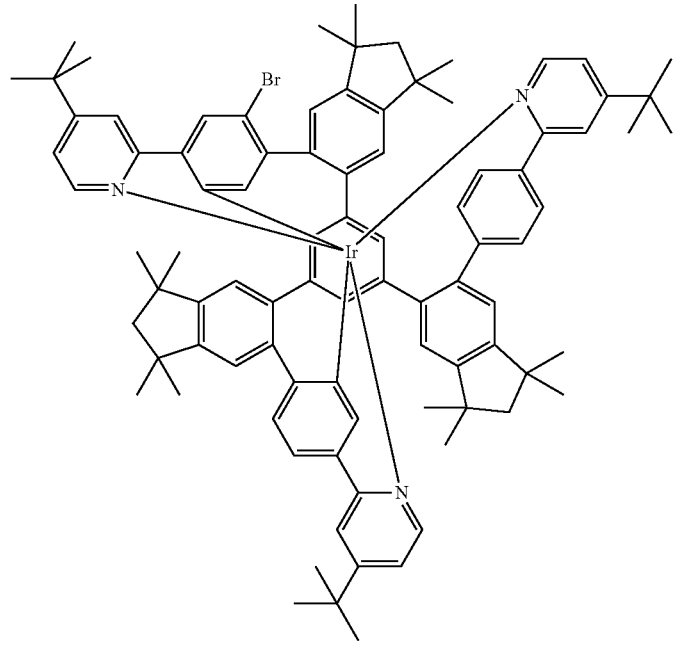<br>Ir(L2) + 10.5 mmol NBS > Ir(L2-1Br)<br>DCM | 33% |
| Ir(L3-1Br) | 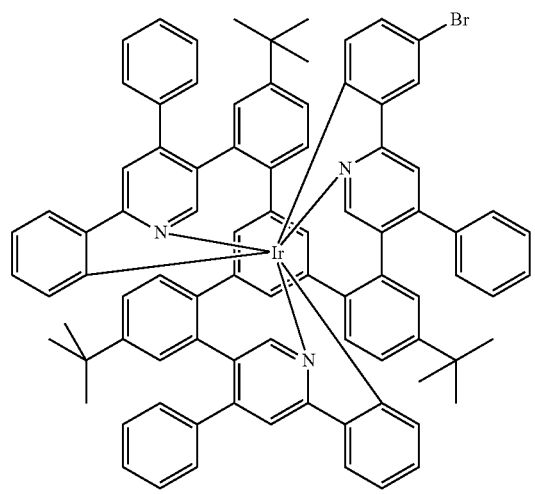<br>Ir(L3) + 10.5 mmol NBS > Ir(L3-1Br)<br>DCM | 30% |

| Ex. | Reactant > brominated complex<br>Conditions (if different from general method) | Yield |
|---|---|---|
| Ir(L4-1Br) | 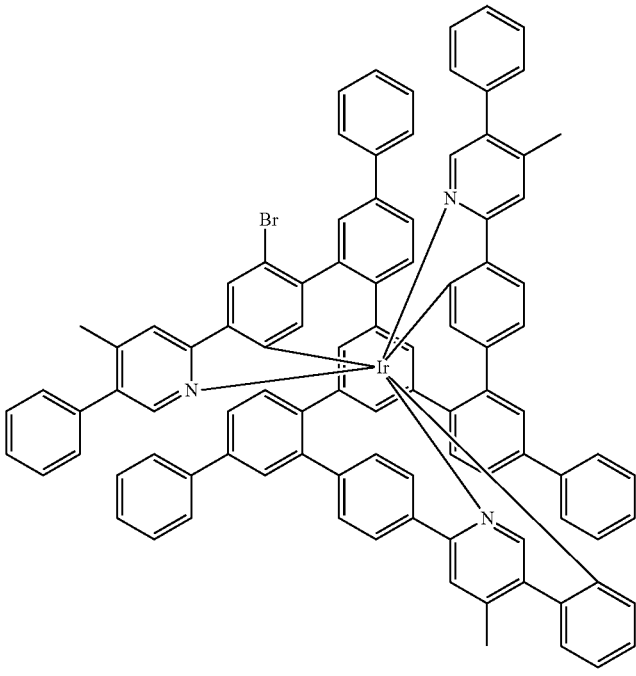<br>Ir(L4) + 10.5 mmol NBS > Ir(L4-1Br)<br>DCM | 30% |
| Ir(L5-1Br) | 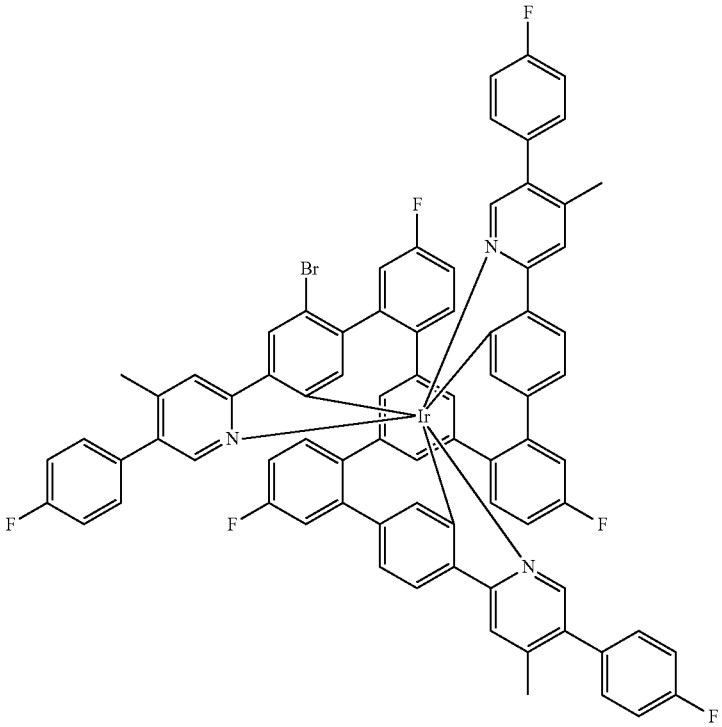<br>Ir(L5) + 10.5 mmol NBS > Ir(L5-1Br)<br>DCM | 29% |

-continued
| Ex. | Reactant > brominated complex<br>Conditions (if different from general method) | Yield |
|---|---|---|
| Ir(L100-1Br) | 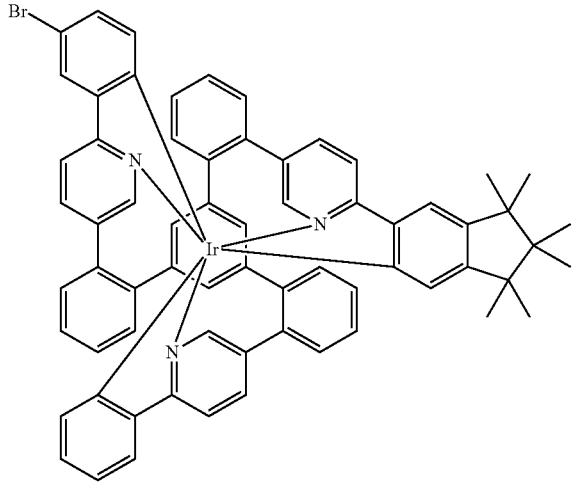<br>Ir(L100) + 10.5 mmol NBS > Ir(L100-1Br)<br>DCM/diastereomer mixture | 27% |
| Ir(L101-1Br) | 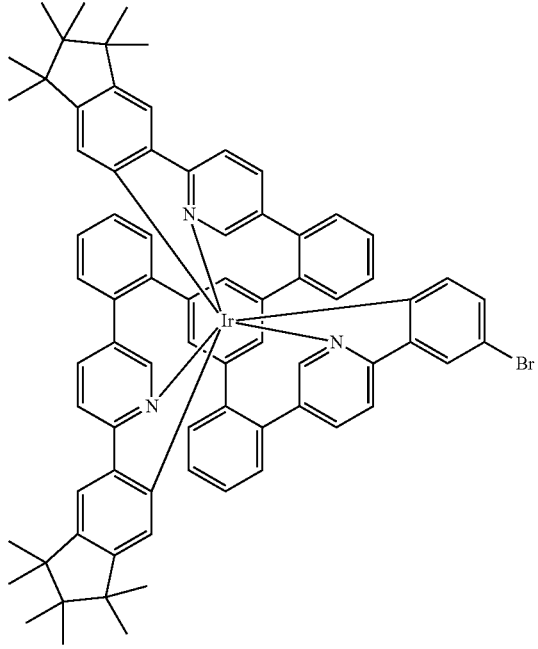<br>Ir(L101) + 10.5 mmol NBS > Ir(L101-1Br)<br>DCM | 91% |

| Ex. | Reactant > brominated complex<br>Conditions (if different from general method) | Yield |
|---|---|---|
| Ir(L102-1Br) | 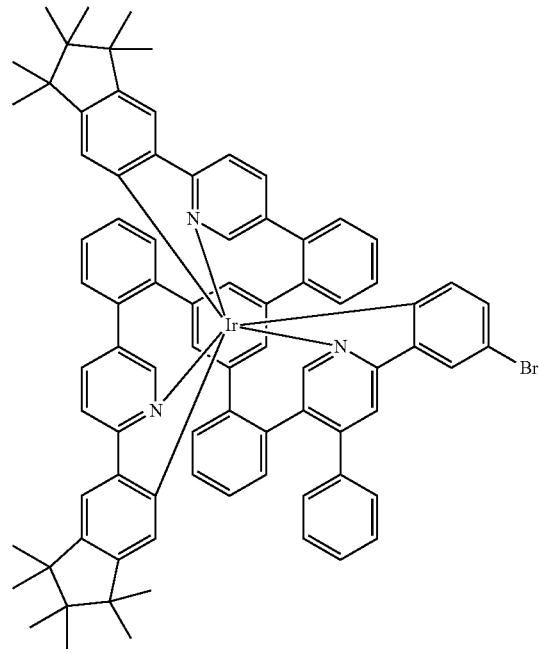<br>Ir(L102) + 10.5 mmol NBS > Ir(L102-1Br)<br>DCM | 93% |
| Ir(L109-1Br) | 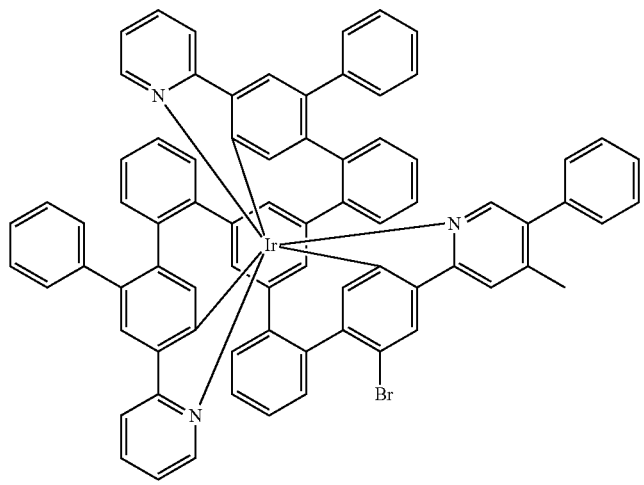 [SMILES: Cc1cc(-c2ccc(-c3ccccc3-c3cc(-c4ccccc4-c4ccc(-c5ccccn5)cc4-c4ccccc4)cc(-c4ccccc4-c4ccc(-c5ccccn5)cc4-c4ccccc4)c3)cc2)ncc1-c1ccccc1]<br>Ir(L109) + 10.5 mmol NBS > Ir(L109-1Br)<br>DCM | 92% |

-continued

| Ex. | Reactant > brominated complex<br>Conditions (if different from general method) | Yield |
|---|---|---|
| Ir(L110-1Br) | 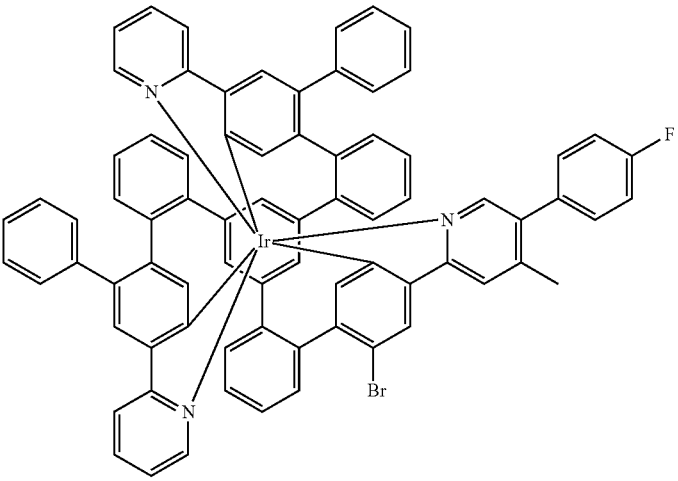<br>Ir(L110) + 10.5 mmol NBS > Ir(L110-1Br)<br>DCM | 90% |
| Ir(L112-1Br) | 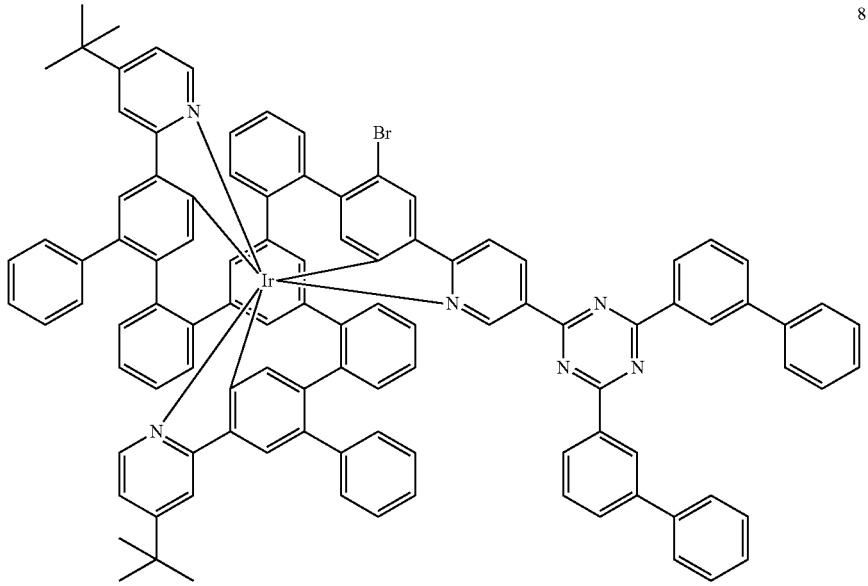 [SMILES: CC(C)(C)c1ccnc(-c2ccc(-c3ccccc3-c3cc(-c4ccccc4-c4ccc(-c5ccc(-c6nc(-c7cccc(-c8ccccc8)c7)nc(-c7cccc(-c8ccccc8)c7)n6)cn5)cc4)cc(-c4ccccc4-c4ccc(-c5cc(C(C)(C)C)ccn5)cc4-c4ccccc4)c3)c(-c3ccccc3)c2)c1]<br>Ir(L112) + 10.5 mmol NBS > Ir(L11-1Br)<br>DCM | 86% |

2.5 Borylation of the Mononuclear Metal Complexes with a Bromine Function

A mixture of 10 mmol of the brominated complex, 12 mmol of bis(pinacolato)diborane [73183-34-3] per bromine function, 30 mmol of anhydrous potassium acetate per bromine function, 0.2 mmol of tricyclohexylphosphine, 0.1 mmol of palladium(II) acetate (variant A) or 0.2 mmol of dppfPdCl$_2$*CH$_2$Cl$_2$ [95464-05-4] (variant B) and 300 ml of solvent (dioxane, DMSO, NMP, toluene, etc.) is stirred at 80-160° C. for 4-16 h. After the solvent has been removed under reduced pressure, the residue is taken up in 300 ml of dichloromethane, THF or ethyl acetate and filtered through a Celite bed, the filtrate is concentrated under reduced pressure until commencement of crystallization and about 100 ml of methanol are finally added dropwise in order to complete the crystallization. The compounds can be recrystallized from dichloromethane, ethyl acetate or THF with addition of methanol.

Synthesis of Ir(L1-3BE)—Variant A

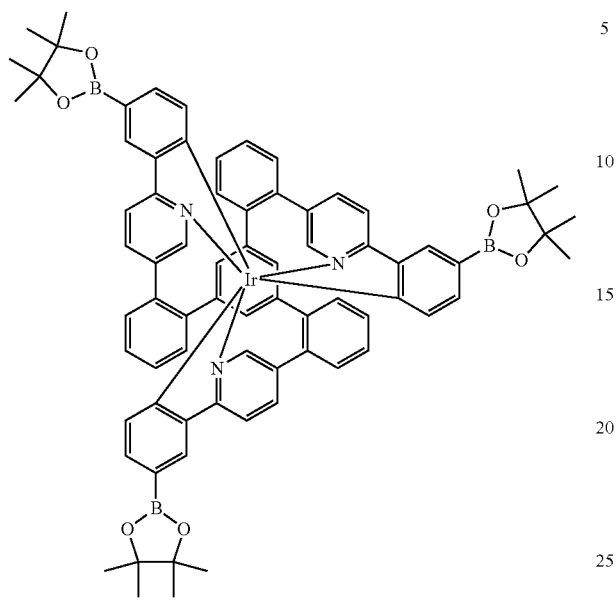

Use of 11.9 g (10 mmol) of Ir(L1-3Br) and 9.1 g (36 mmol) of bis(pinacolato)diborane [73183-34-3], dioxane/toluene 1:1 v/v, 120° C., 16 h, taking up and Celite filtration in THF, recrystallization from THF:methanol. Yield: 7.3 g (5.5 mmol), 55%; purity: about 99.8% by HPLC.

In an analogous manner, it is possible to prepare the following compounds:

| Ex. | Product Reactant/variant | Yield |
|---|---|---|
| | Diborylation | |
| Ir(L1-2BE) | 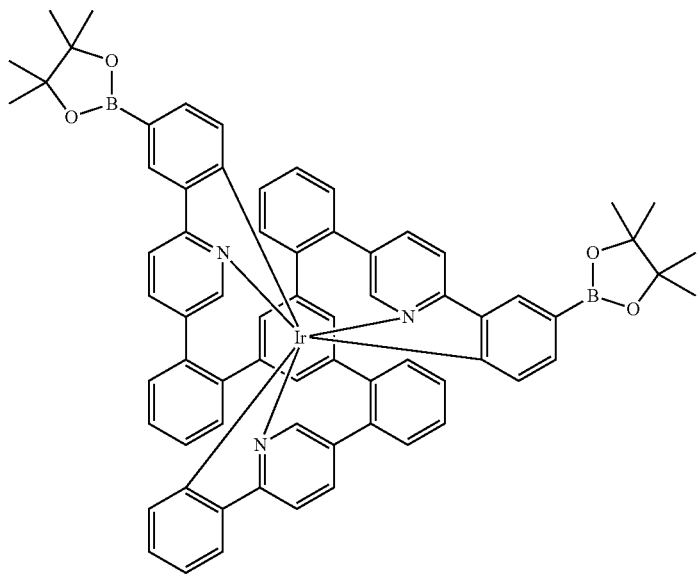  Ir(L1-2Br)/A | 64% |

-continued
| Ex. | Product Reactant/variant | Yield |
|---|---|---|
| Ir(L100-2BE) | 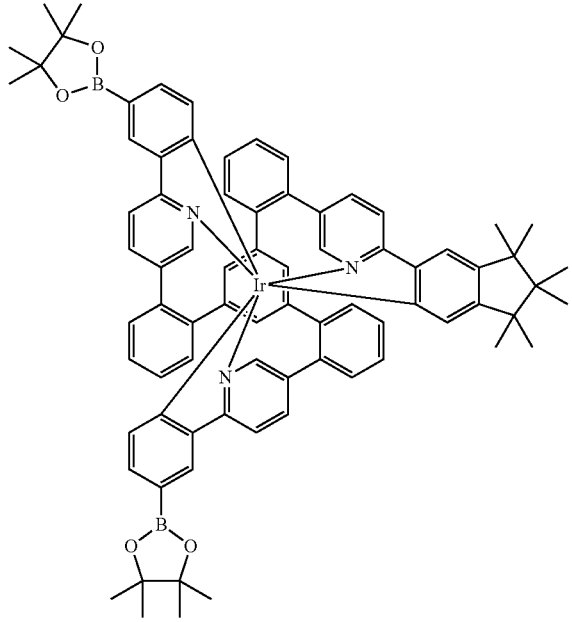．Ir(L100-2Br)/A | 92% |
| Ir(L103-2BE) | 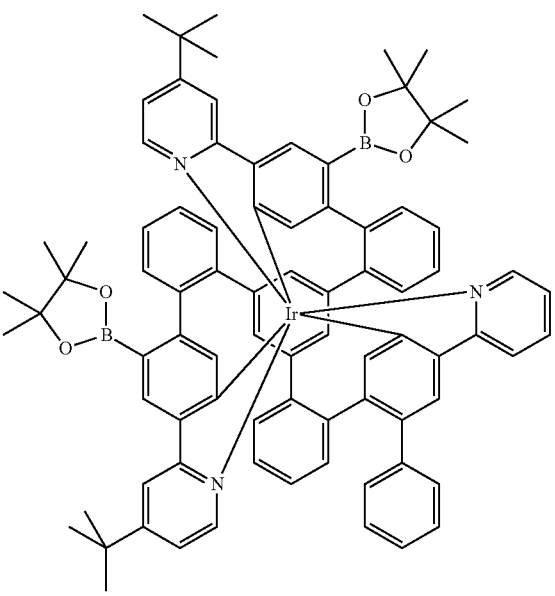．Ir(L103-2Br)/B | 90% |

| Ex. | Product Reactant/variant | Yield |
|---|---|---|
| Ir(L104-2BE) | 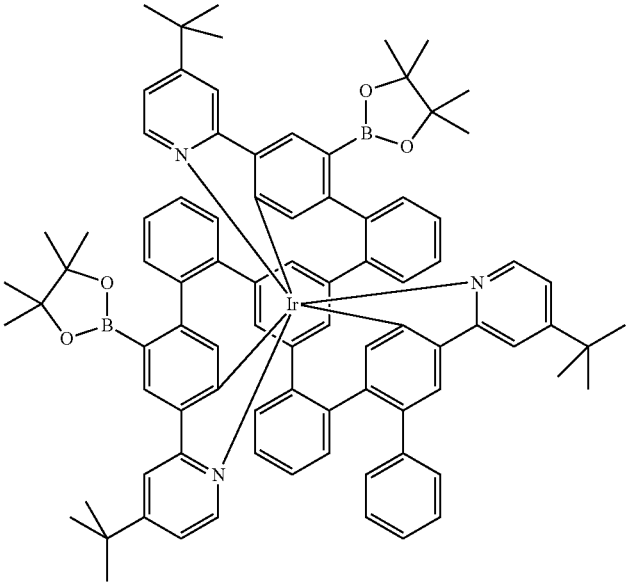<br>Ir(L104-2Br)/B | 90% |
| Monoborylation | | |
| Ir(L1-1BE) | 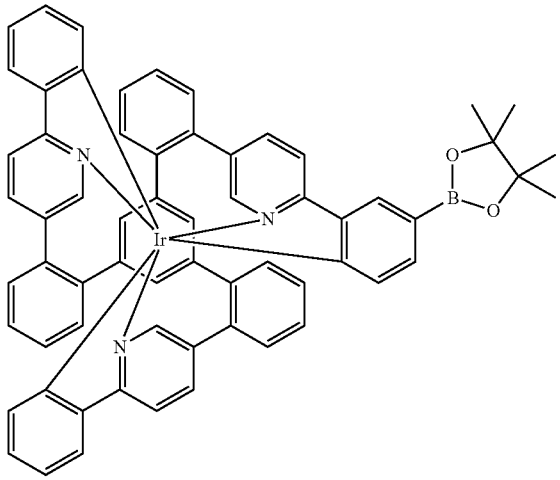<br>Ir(L1-1Br)/A | 78% |

-continued
| Ex. | Product Reactant/variant | Yield |
|---|---|---|
| Ir(L2-1BE) | 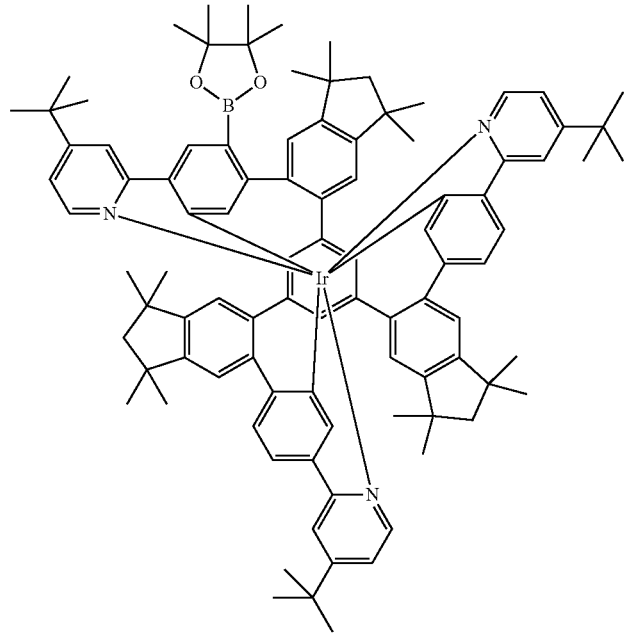<br>Ir(L2-1Br)/B | 80% |
| Ir(L3-1BE) | 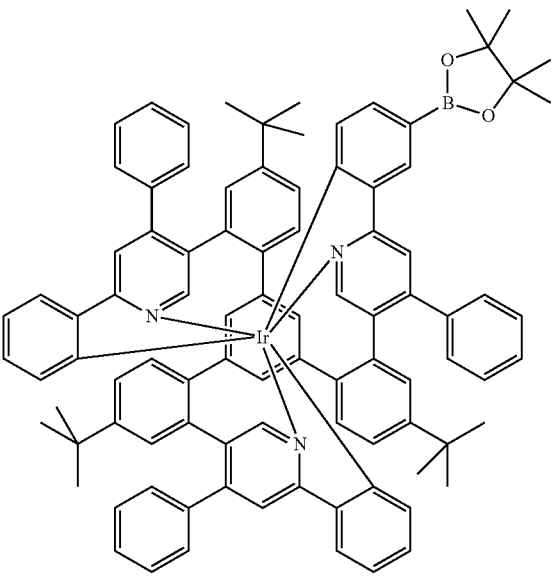<br>Ir(L3-1Br)/A | 86% |

| Ex. | Product Reactant/variant | Yield |
|---|---|---|
| Ir(L4-1BE) | 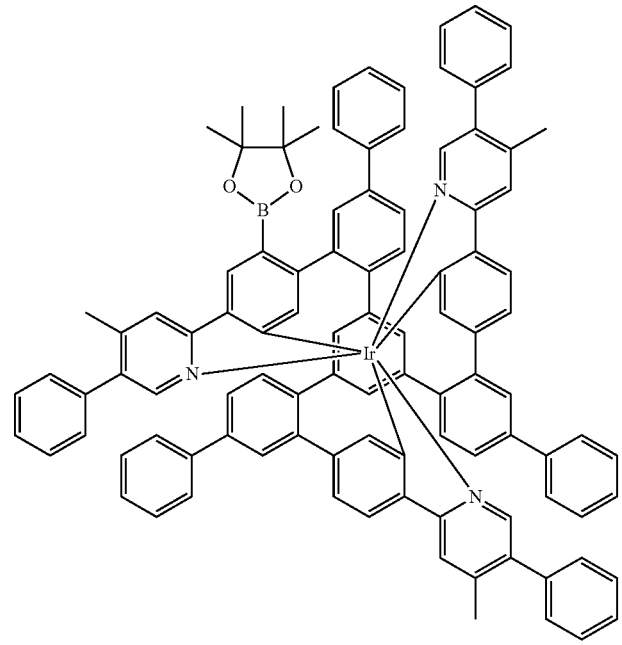<br>Ir(L4-1Br)/B | 80% |
| Ir(L5-1BE) | 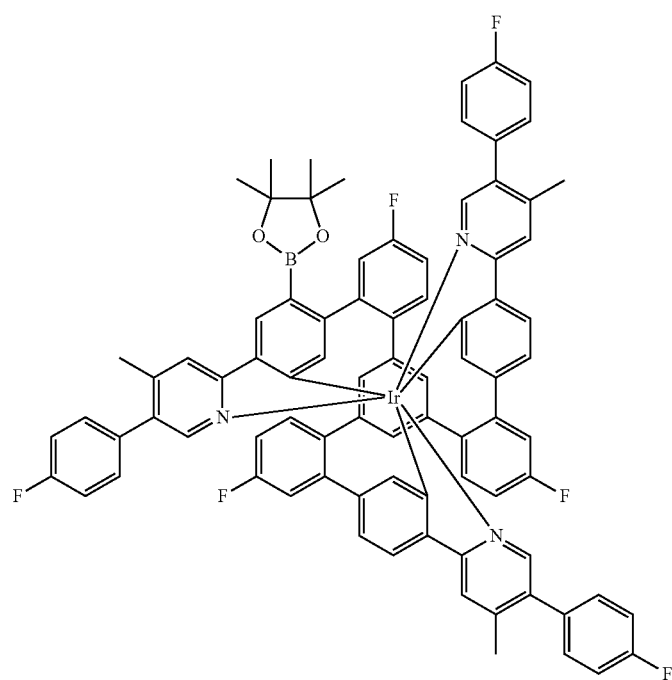<br>Ir(L5-1Br)/B | 75% |

| Ex. | Product Reactant/variant | Yield |
|---|---|---|
| Ir(L100-1BE) | 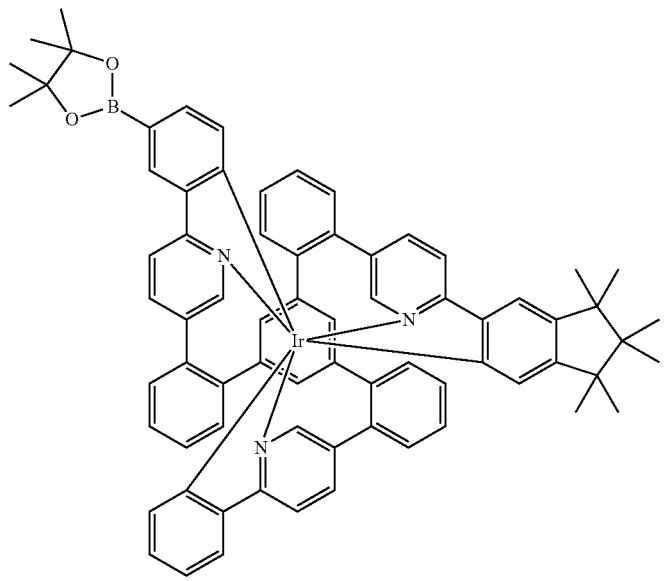<br>Ir(L100-1Br)/A | 79% |
| Ir(L101-BE) | 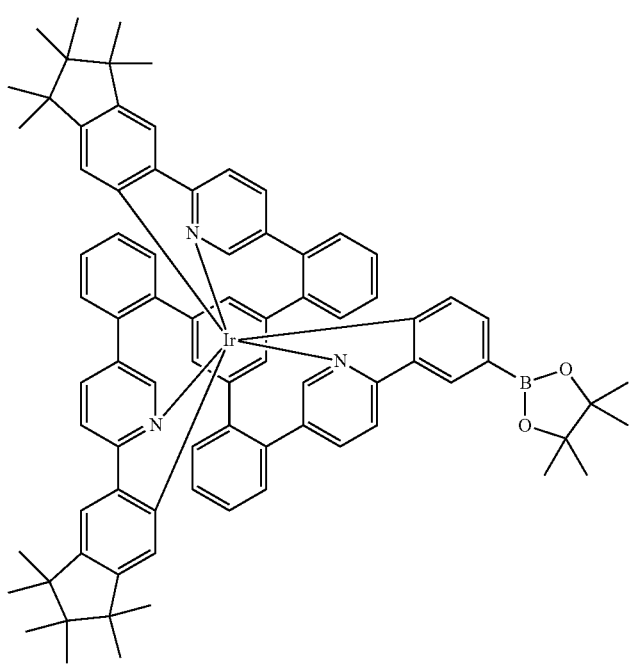<br>Ir(L101-1Br)/A | 77% |

| Ex. | Product Reactant/variant | Yield |
|---|---|---|
| Ir(L102-1BE) | 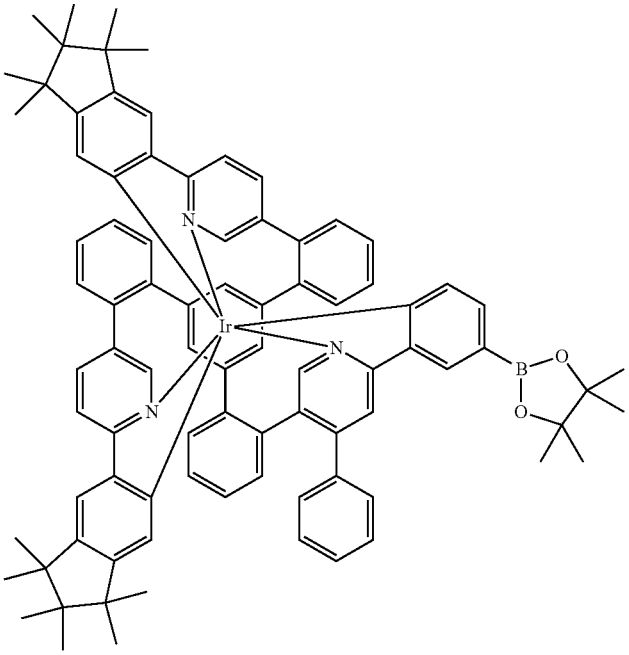 Ir(L102-1Br)/A | 74% |
| Ir(L109-1BE) | 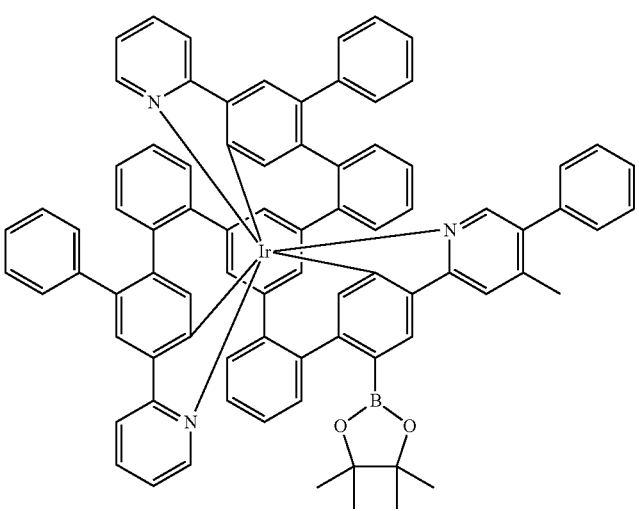 Ir(L109-1Br)/B | 78% |

| Ex. | Product Reactant/variant | Yield |
|---|---|---|
| Ir(L110-1BE) | 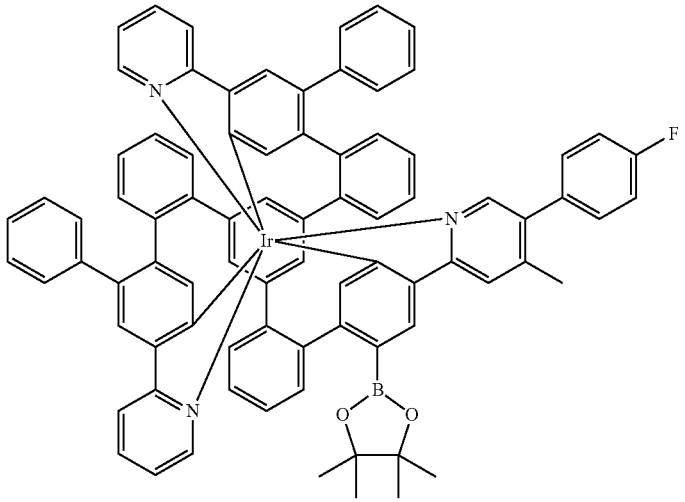<br>Ir(L110-1Br)/B | 80% |
| Ir(L112-1BE) | 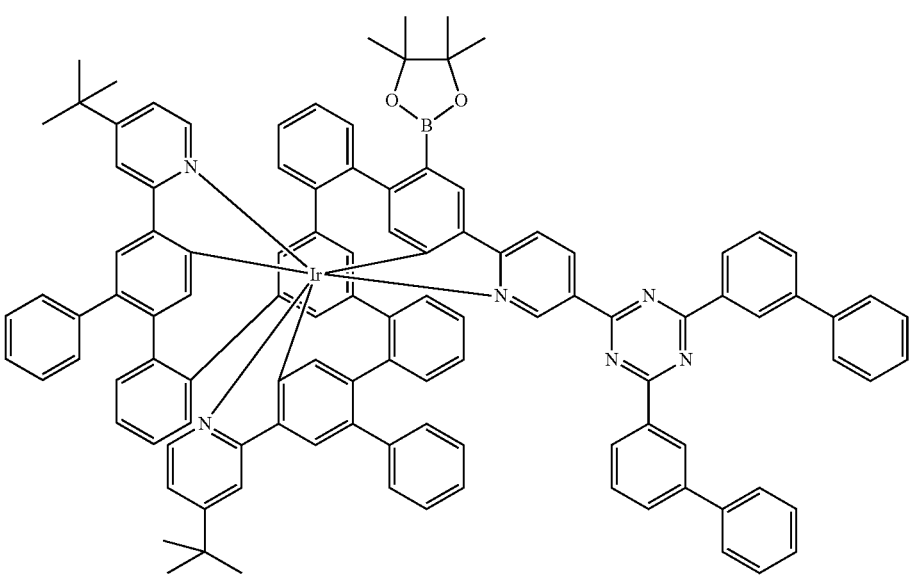<br>Ir(L112-1Br)/B | 78% |

2.6 Suzuki Coupling of Borylated Metal Complexes with Chlorobromoaromatics

To a mixture of 1 equivalent of the metalloboronic ester, 1.0-1.1 equivalents of the chlorobromoaromatic, 3 equivalents of tripotassium phosphate [7778-53-2] per boronic ester function, 300 ml of toluene, 100 ml of dioxane and 100 ml of water are added 0.06 equivalent of tri-o-tolylphosphine [6163-58-2] and 0.01 equivalent of palladium(II) acetate [3975-31-3] per boronic ester function, and the mixture is stirred well under reflux for 18 h. After cooling, the precipitated solids are filtered off with suction. If no solid precipitates out, the organic phase is removed, washed twice with 300 ml each time of water and once with 300 ml of saturated sodium chloride solution and dried over magnesium sulphate, the magnesium sulphate is filtered off by means of a Celite bed in the form of a toluene slurry, and the filtrate is concentrated to dryness. The crude product thus obtained is purified by recrystallization, chromatography or flash chromatography (CombiFlash Torrent from Axel Semrau). Further purification is effected by repeated continuous hot extraction, wherein the product is introduced into a cellulose thimble (from Whatman) in a hot extractor and repeatedly hot-extracted (typically twice) with a suitable hot extractant, for example toluene, chlorobenzene, anisole, ethyl acetate, butyl acetate, acetonitrile, dichloromethane, etc. (initial amount about 150-200 ml), until a purity of >99.0% is attained.

Synthesis of Ir(L200-2Cl)

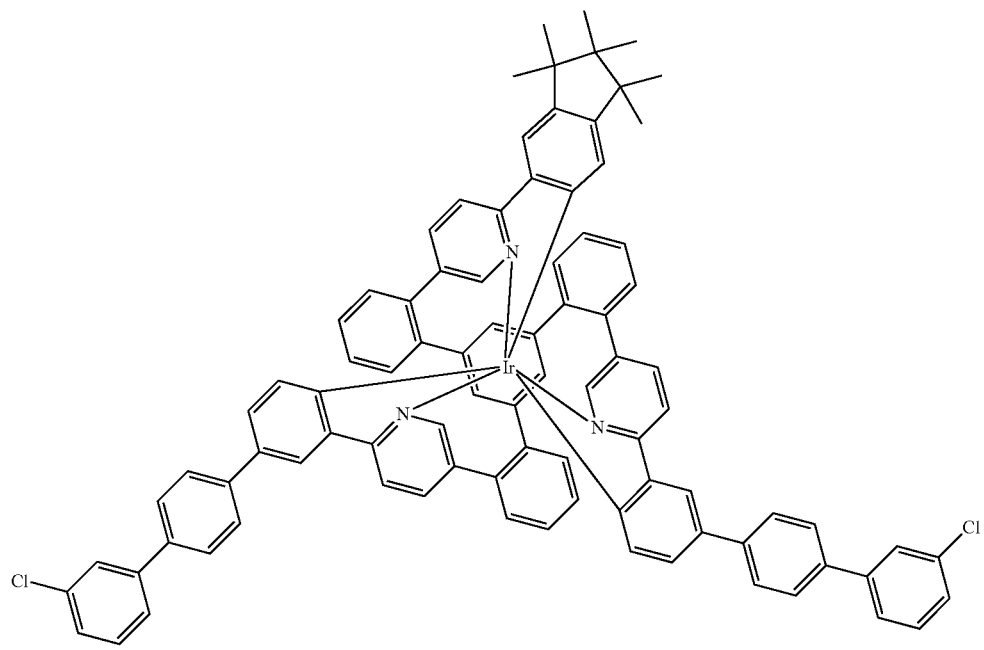

Use of 5.9 g (22 mmol) of 4'-bromo-3-chloro-1,1'-biphenyl [91354-09-5], 12.4 g (10 mmol) of Ir(L100-2BE), 12.7 g (60 mmol) of tripotassium phosphate, 365 mg (1.2 mmol) of tri-o-tolylphosphine and 45 mg (0.2 mmol) of palladium (II) acetate. Chromatographic purification with DCM on silica gel, then hot extraction twice with toluene. Yield: 9.2 g (6.3 mmol), 63%; purity: about 99.5% by HPLC.

In an analogous manner, it is possible to prepare the following compounds:

| Ex. | Product Chlorobromoaromatic/metalloboronic ester | Yield |
|---|---|---|
| Dichlorides | | |
| Ir(L201-2Cl) | 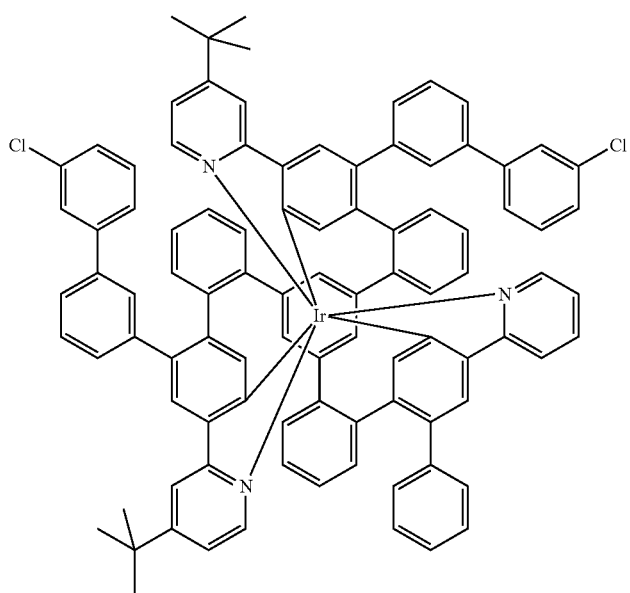 Ir(L103-2BE) 844856-42-4 | 65% |

-continued
| Ex. | Product Chlorobromoaromatic/metalloboronic ester | Yield |
|---|---|---|
| Ir(L202-2Cl) | 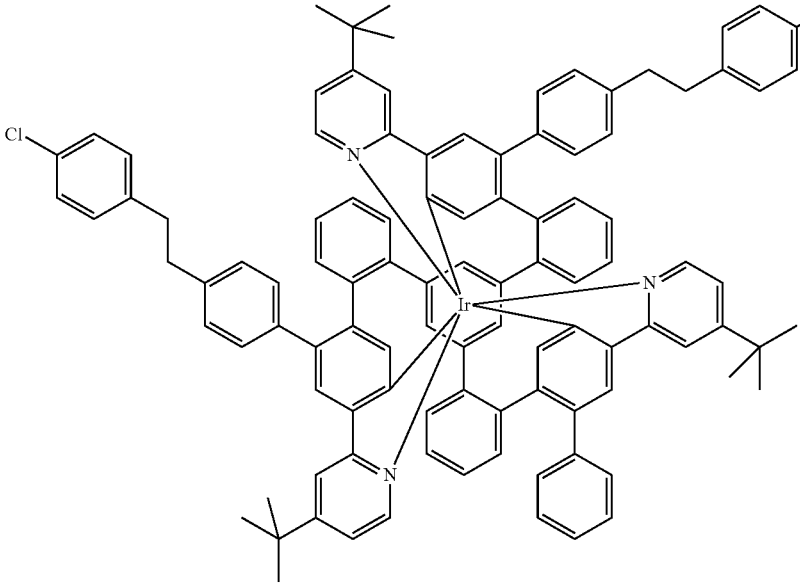<br>Ir(L104-2BE)<br>108545-62-6 | 58% |
Monochlorides
Ir(L250-1Cl)
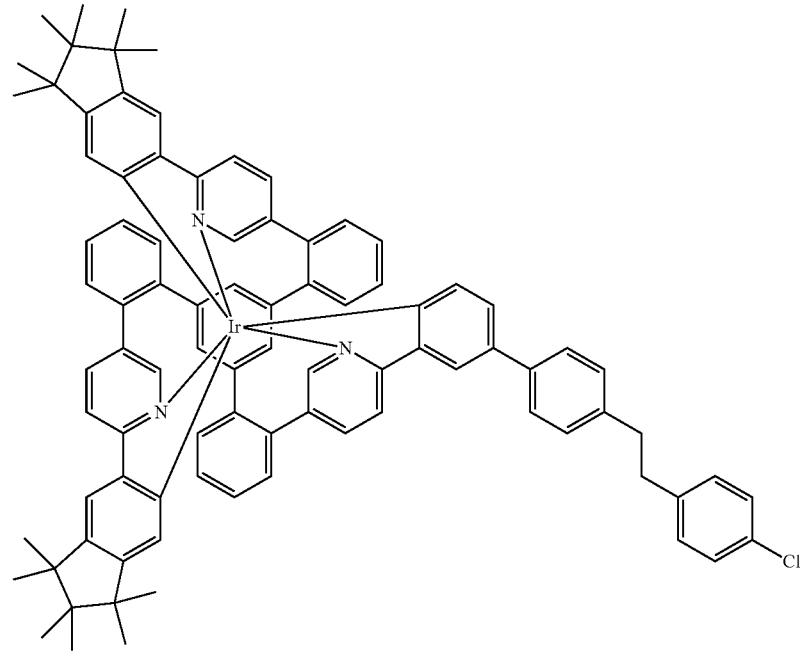
Ir(L101-1BE)
844856-42-4

| Ex. | Product Chlorobromoaromatic/metalloboronic ester | Yield |
|---|---|---|
| Ir(L251-1Cl) | 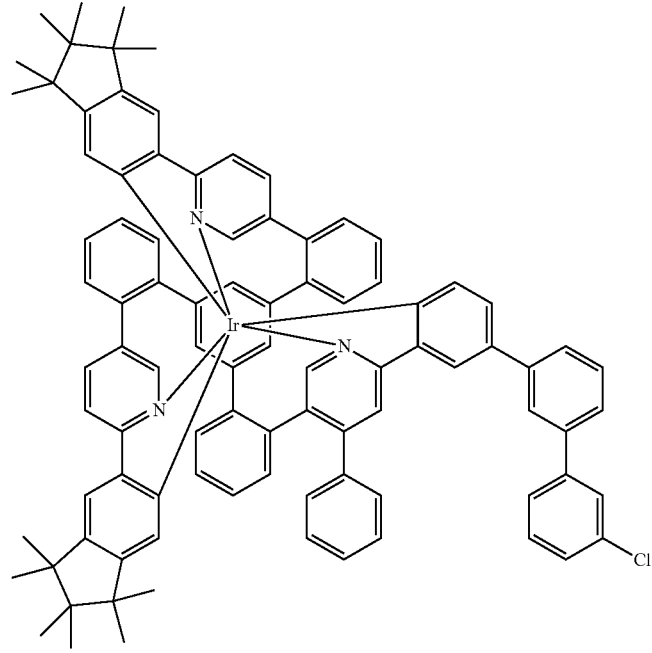<br>Ir(L102-1Br)<br>844856-42-4 | |
| Ir(L252-1Cl) | 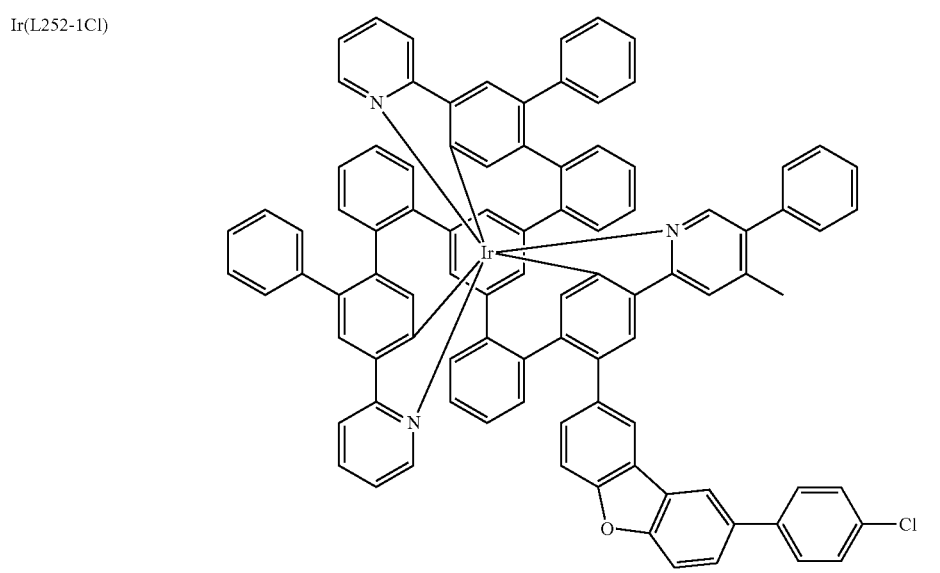<br>Ir(L109-1Br)<br>1426323-63-8 | |

-continued
| Ex. | Product Chlorobromoaromatic/metalloboronic ester | Yield |
|---|---|---|
| Ir(L253-1Cl) | 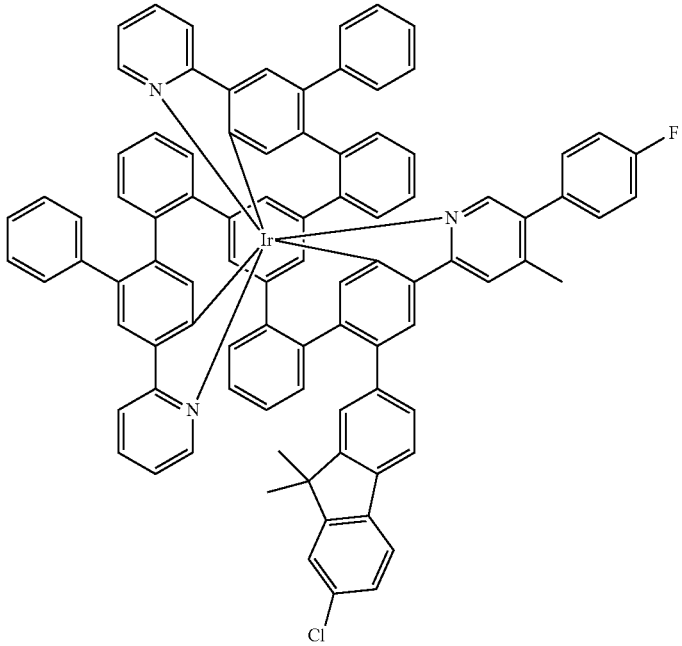<br>Ir(L110-1Br)<br>605630-37-3 | |
| Ir(L254-1Cl) | 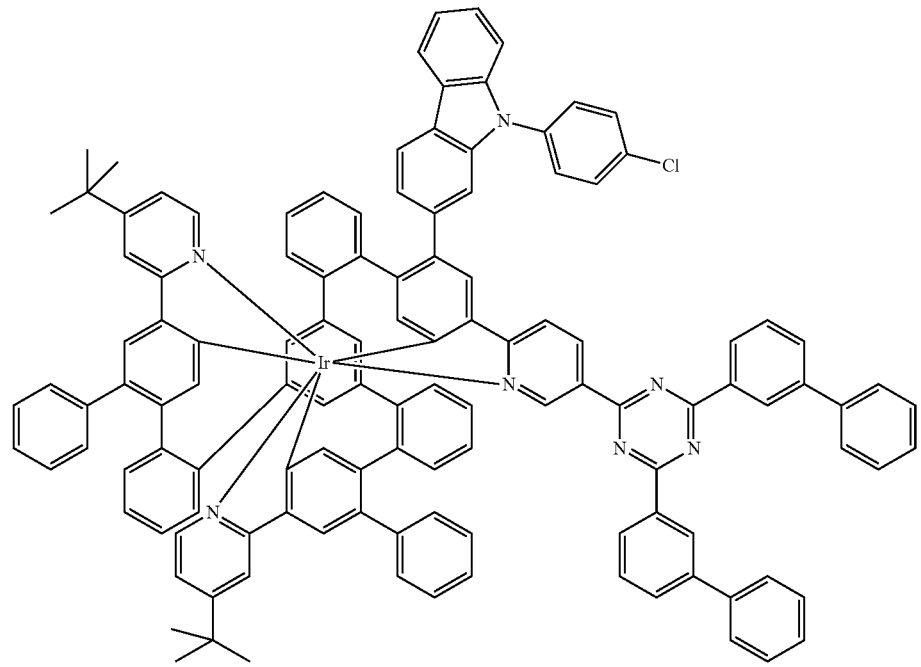<br>Ir(L112-1Br)<br>1151816-79-3 | |

2.7 Borylation of the Mononuclear Metal Complexes with a Chlorine Function

A mixture of 10 mmol of the complex with a chlorine function, 11 mmol of bis(pinacolato)diborane [73183-34-3] per chlorine function, 30 mmol of anhydrous potassium acetate per chlorine function, 0.13 mmol of SPhos, 0.1 mmol of palladium(II) acetate and 300 ml of solvent (dioxane, DMSO, NMP, toluene, etc.) is stirred at 80-160° C. for 4-16 h. After the solvent has been removed under reduced pressure, the residue is taken up in 300 ml of dichloromethane, THF or ethyl acetate and filtered through a Celite bed, the filtrate is concentrated under reduced pressure until commencement of crystallization and about 100 ml of methanol are finally added dropwise in order to complete the crystallization. The compounds can be recrystallized from dichloromethane, ethyl acetate or THF with addition of methanol.

Synthesis of Ir(L200-2BE)

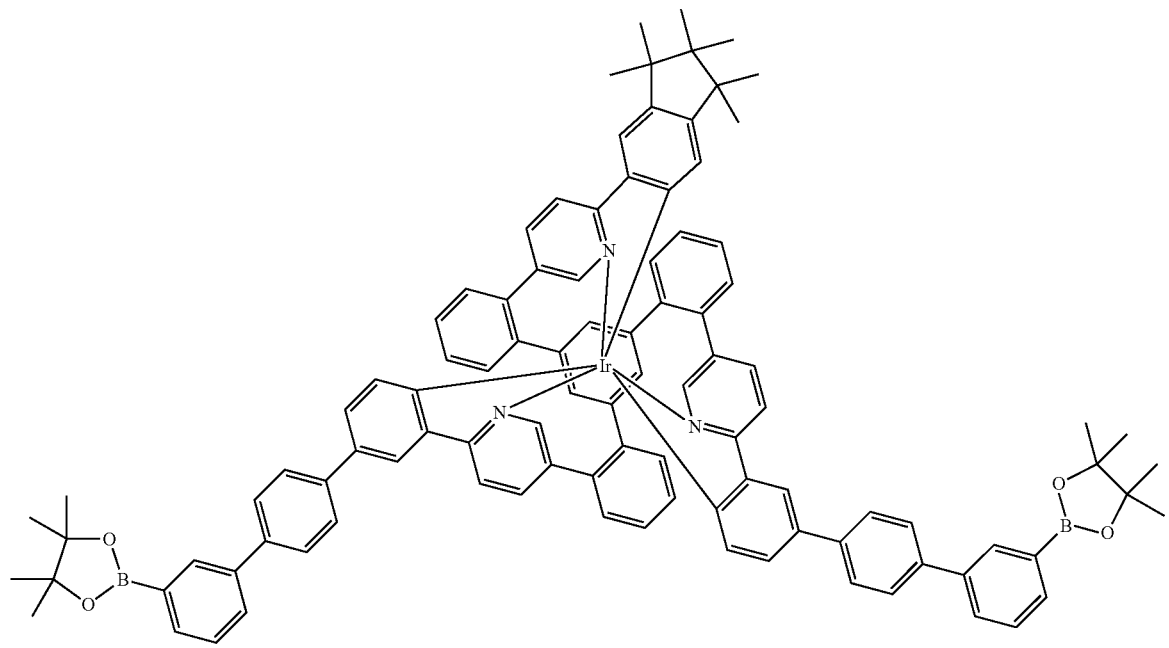

12.4 g (10 mmol) of Ir(L200-201) and 5.6 g (22 mmol) of bis(pinacolato)diborane [73183-34-3] in 300 ml of dioxane are used and stirred at 120° C. for 16 h. The residue is taken up in DMC and filtered through Celite. Further purification is effected by recrystallization from ethyl acetate/methanol. Yield: 14.9 g (9.1 mmol), 91%; purity: about 99% by HPLC.

In an analogous manner, it is possible to prepare the following compounds:
| Ex. | Product Reactant | Yield |
|---|---|---|
| | Diborylation | |
| Ir(L201-2BE) | 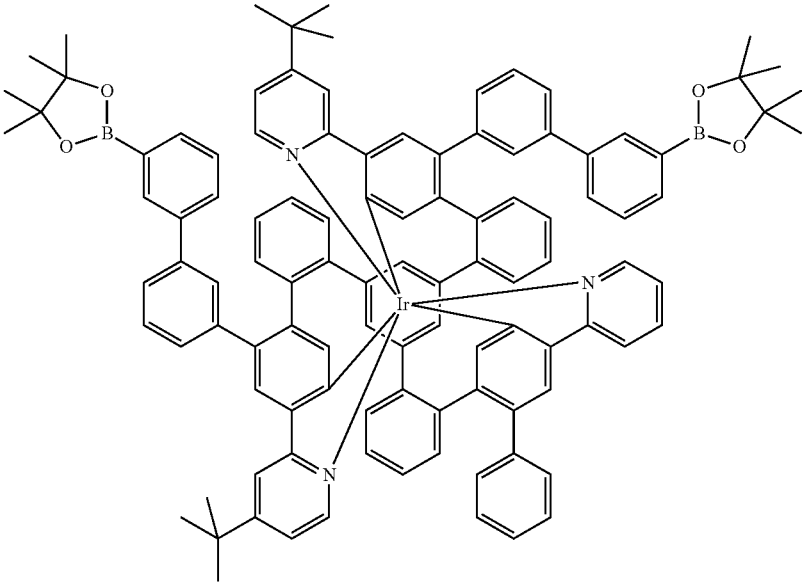<br>Ir(L201-2Cl) | 87% |
| Ir(L202-BE) | 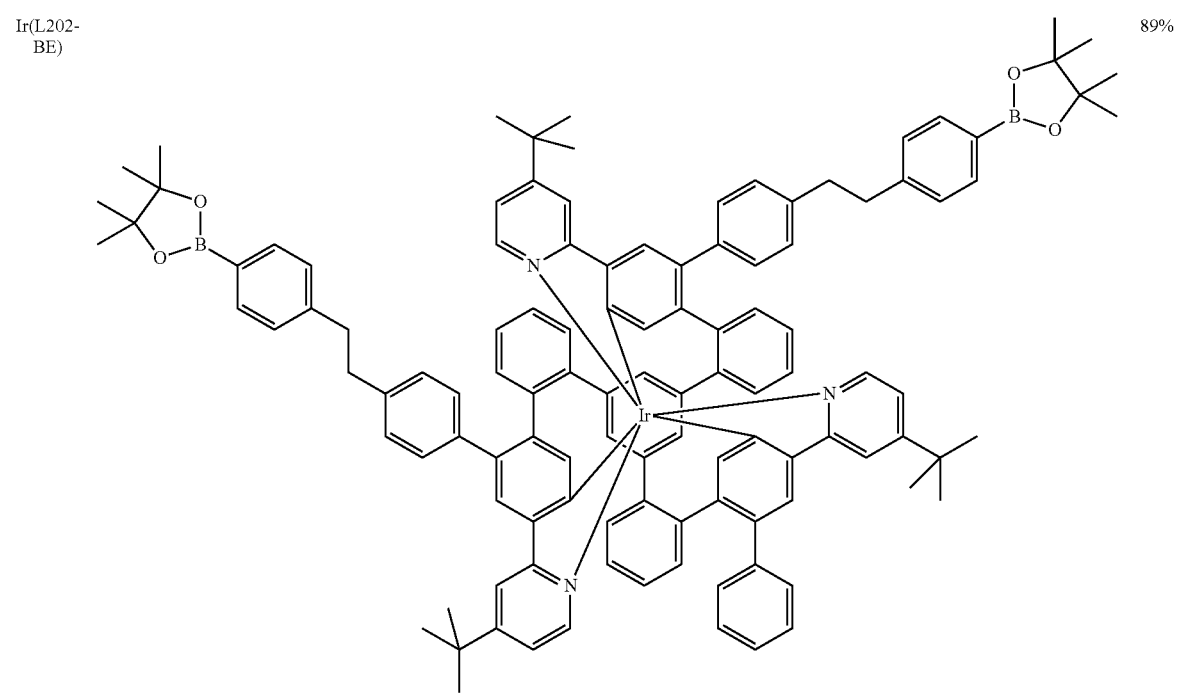 | 89% |

-continued
| Ex. | Product Reactant | Yield |
|---|---|---|
| | Ir(L202-2Cl) Monoborylation | |
| Ir(L250-1BE) | 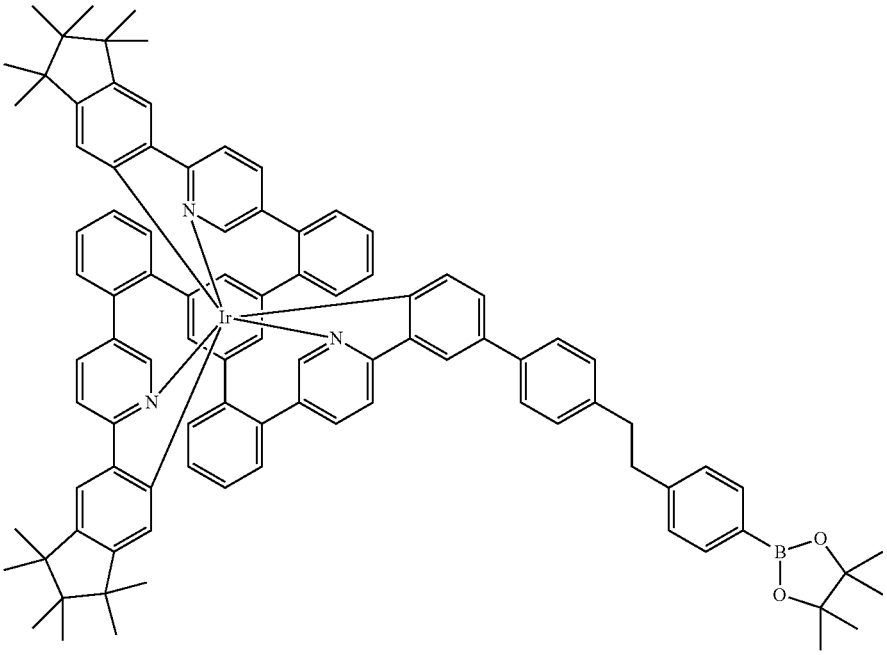<br>Ir(250-1Cl) | 83% |
| Ir(L251-1BE) | 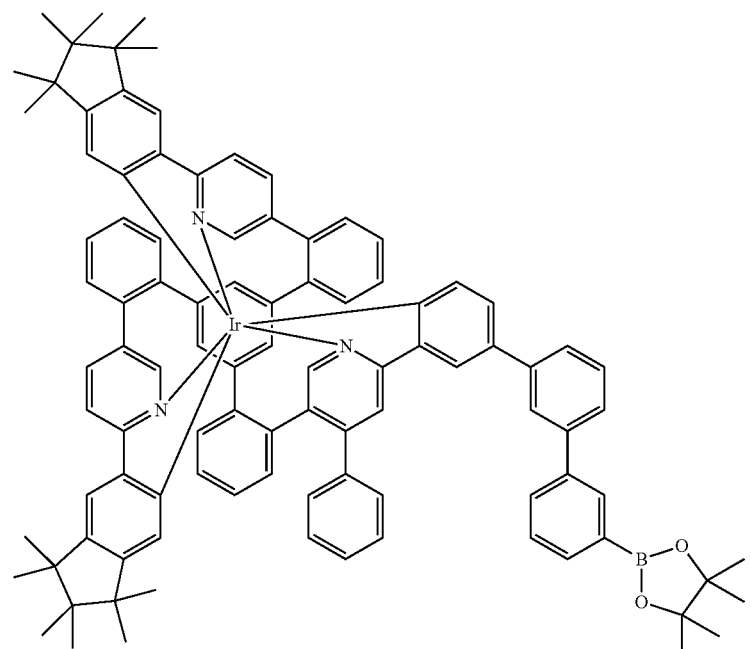<br>Ir(L251-1Cl) | 80% |

-continued
| Ex. | Product Reactant | Yield |
|---|---|---|
| Ir(L252-1BE) | 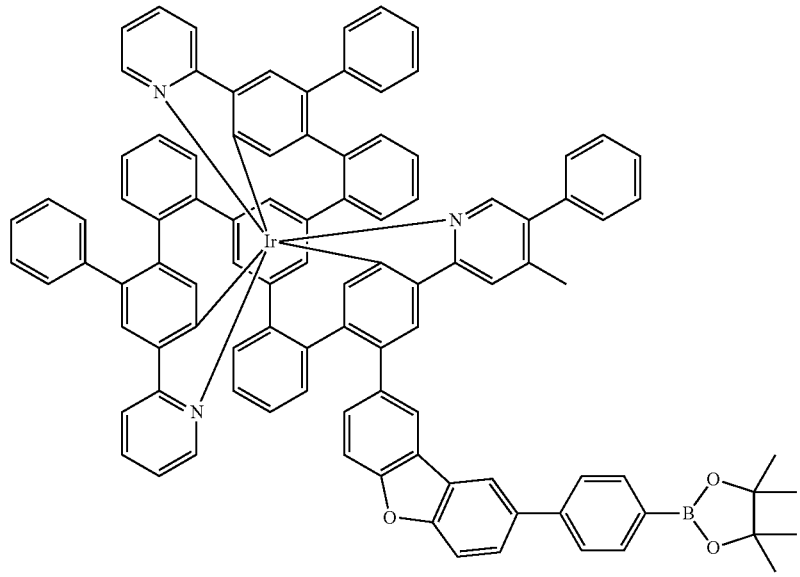  Ir(L252-1Cl) | 85% |
| Ir(L253-1BE) | 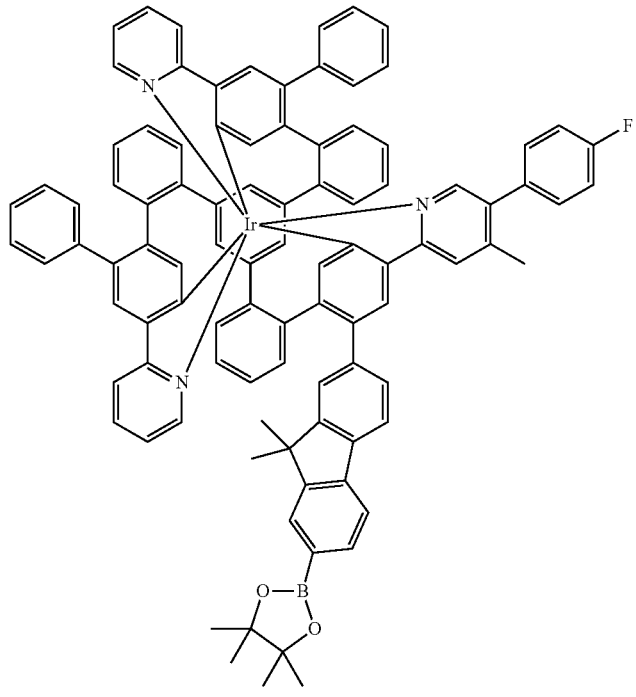  Ir(L253-1Cl) | 84% |

| Ex. | Product Reactant | Yield |
|---|---|---|
| Ir(L254-1BE) | 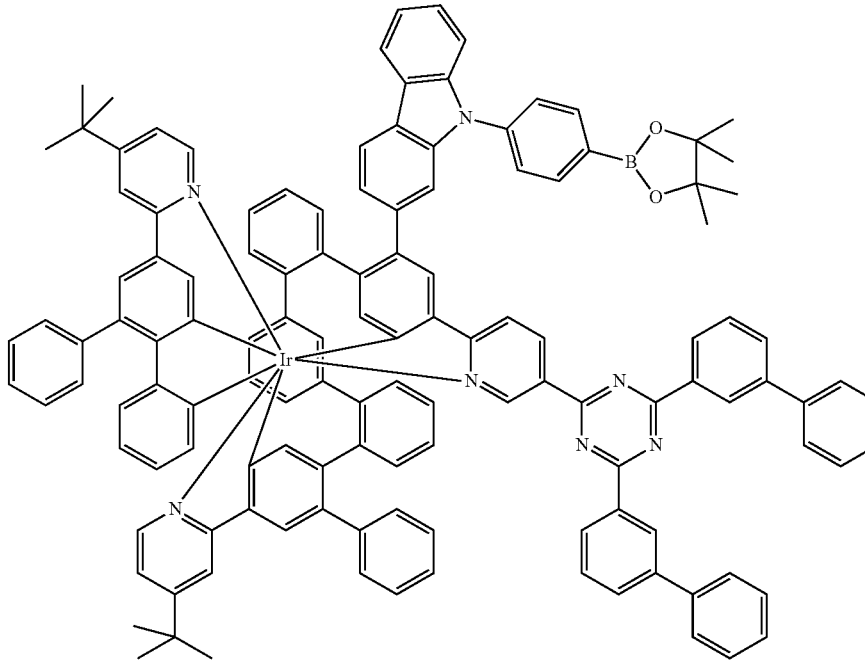<br>Ir(L254-1Cl) | 81% |

3. Preparation of the Metal Complexes of the Invention

Formal Naming of the Products:

In the examples which follow, the metal complexes of the invention are serially numbered. In addition, each complex is described by a formula which arises from the units used in the reaction, in the corresponding molar ratio. The position of the linkage and hence the constitution is defined by the position of reactive groups.

Naming using a general example of the coupling reaction:

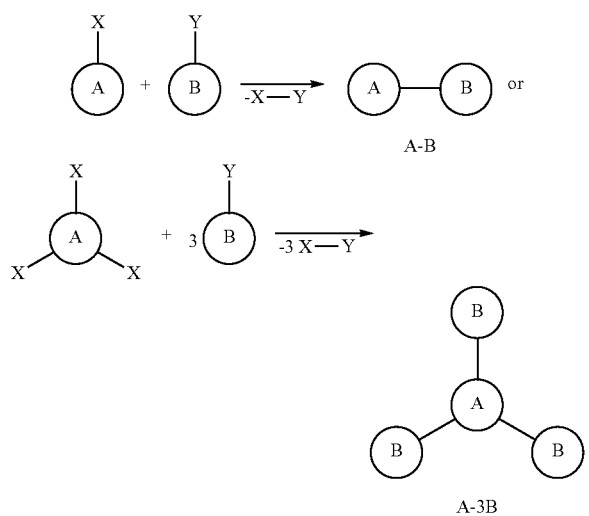

Stereochemistry:

Typically, the mononuclear complex synthesis units are used in the form of a racemate of the Δ and Λ isomers. This leads to diastereomer mixtures in the polynuclear compounds of the invention, for example to Δ,Δ/Λ,Λ and (meso)-Δ,Λ forms for dinuclear compounds. Unless stated otherwise, these are converted or used further as a diastereomer mixture. In addition, it is possible to separate these by chromatographic methods or by fractional crystallization.

3.1 by Suzuki Coupling from Brominated Metal Complexes and Boronic Esters

Variant A: Suzuki Coupling in a Biphasic Aqueous-Organic Medium

The molar ratios of brominated complexes and boronic acids can be found in the table which follows. To a mixture of the brominated metal complex(es) and the boronic esters, 3 equivalents of tripotassium phosphate [7778-53-2] per bromine function, 300 ml of toluene, 100 ml of dioxane and 100 ml water are added 0.06 equivalent of tri-o-tolylphosphine [6163-58-2] and 0.01 equivalent of palladium(II) acetate [3975-31-3] per bromine function, and the mixture is stirred well under reflux for 18 h. After cooling, the precipitated solids are filtered off with suction. If no solid precipitates out, the organic phase is removed, washed twice with 300 ml each time of water and once with 300 ml of saturated sodium chloride solution and dried over magnesium sulphate, the magnesium sulphate is filtered off, and the filtrate is concentrated to dryness. The crude product thus obtained is purified by chromatography or flash chromatography (CombiFlash Torrent from Axel Semrau). Further purification is effected by repeated continuous hot extraction, wherein the product is introduced into a cellulose thimble (from Whatman) in a hot extractor and repeatedly hot-extracted (typically 3-6 times) with a suitable hot extractant, for example toluene, chlorobenzene, anisole, ethyl acetate, butyl acetate, acetonitrile, dichloromethane, etc. (initial amount about 150-200 ml), until a purity of >99.5%, preferably >99.9%, is attained.

Variant B: Suzuki Coupling in a Monophasic Dipolar Aprotic Medium

The molar ratios of brominated complexes and boronic acids can be found in the table which follows. To a mixture of the brominated metal complex(es) and the boronic esters, 3 equivalents of tripotassium phosphate trihydrate [22763-03-7] per bromine function and 200 ml of DMSO are added 0.01 equivalent of tetrakis(triphenylphosphino)palladium(0) [14221-01-3] per bromine function and 50 g of glass beads (diameter 3 mm), and the mixture is stirred well at 80° C. for 18 h. After cooling, the DMSO is substantially removed under reduced pressure, the residue is taken up in 1000 ml of dichloromethane and filtered through a silica gel bed in the form of a dichloromethane slurry, the bed is washed through with 500 ml of dichloromethane and then the organic phase is concentrated to dryness under reduced pressure. The further purification of the crude product thus obtained is effected as described under A.

Variant C: Coupling of Complexes with a Chlorine Function

Procedure as variant 2, except that the catalyst system used is 0.026 equivalent of SPhos [657408-07-6] and 0.02 equivalent of palladium(II) acetate per chlorine function.

Example Ir100: Ir100=Ir(L1)-Ir(L1)

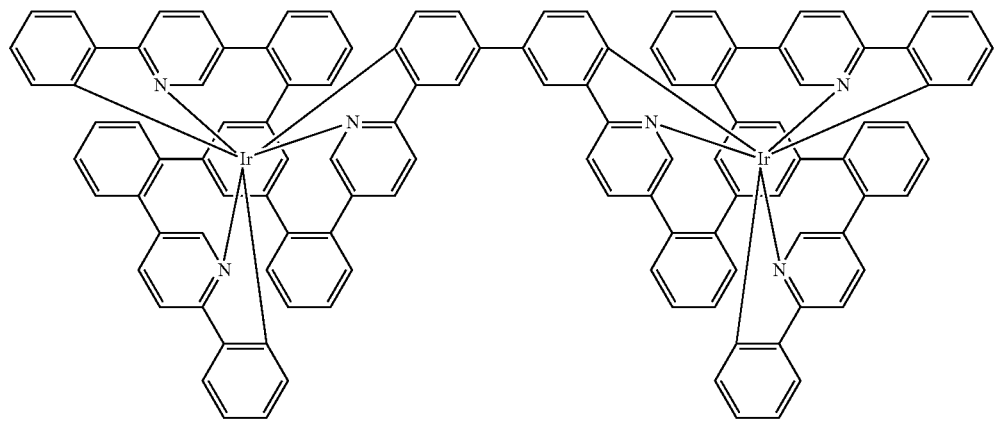

Procedure according to variant B. Use of 10.34 g (10.0 mmol) of Ir(L1-1Br), 10.81 g (10 mmol) of Ir(L1-1BE), 8.0 g (30 mmol) of tripotassium phosphate trihydrate, 116 mg (0.1 mmol) of tetrakis(triphenylphosphino)palladium(0). Hot extraction: 5× from chlorobenzene. Yield: 7.44 g (3.9 mmol), 39%. Purity: >99.8% by HPLC.

In an analogous manner, it is possible to prepare the following compounds:

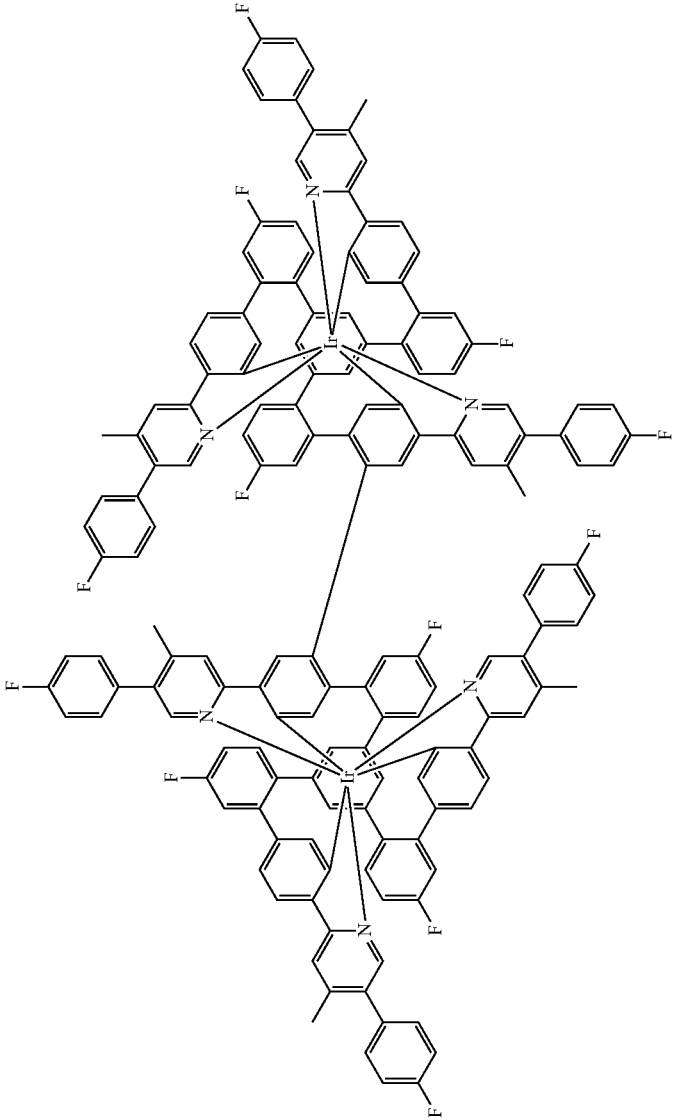

-continued

| Ex. | Product Reactants Varian/hot extractant* | Yield |
|---|---|---|
| Ir103 | | 51% |
| Ir104 | Ir103 = LS1-2Ir(L102)<br>5 mmol LS1 + 10 mmol Ir(L102-1Br)<br>A/toluene<br>Ir104 = LS7-2Ir(L102)<br>5 mmol LS7 + 10 mmol Ir(L102-1Br)<br>A/toluene | 57% |
| Ir105 | Ir105 = LS8-2Ir(L102)<br>5 mmol LS8 + 10 mmol Ir(L102-1Br)<br>A/toluene | 54% |

-continued
| Ex. | Product Reactants Varian/hot extractant* | Yield |
|---|---|---|
| Ir106 | 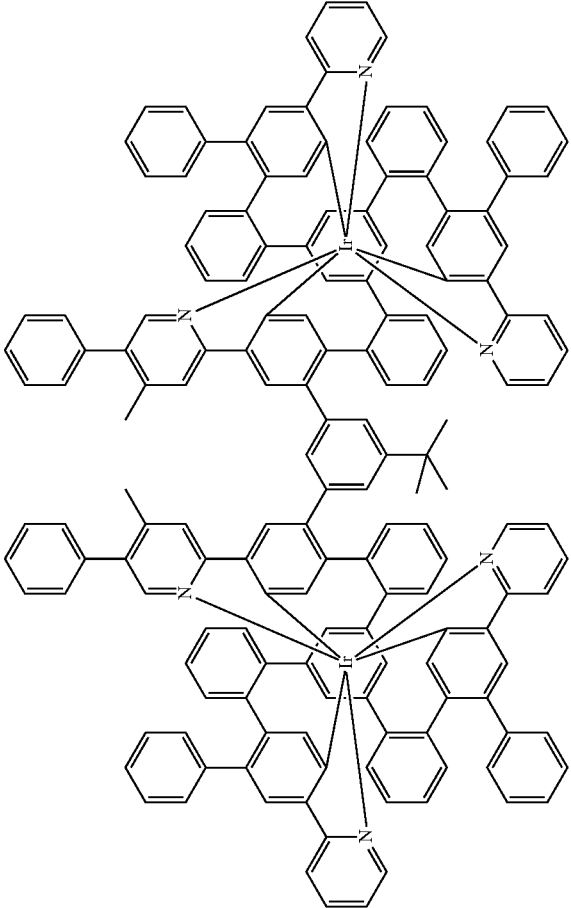 Ir106 = LS5-2Ir(L109) 5 mmol LS5 + 10 mmol Ir(L109-1Br) A/toluene | 33% |
| Ir107 | Ir107 = LS10-2Ir(L112) 5 mmol LS10 + 10 mmol Ir(L112-1Br) A/toluene | 37% |
| Ir108 | Ir108 = LS15-2Ir(L112) 5 mmol LS15 + 10 mmol Ir(L112-1Br) A/toluene | 56% |
| Ir109 | Ir109 = LS17-2Ir(L3) 5 mmol LS17 + 10 mmol Ir(L3-1Br) A/toluene | 41% |
| Ir110 | Ir110 = LS20-2Ir(L4) 5 mmol LS20 + 10 mmol Ir(L4-1Br) A/toluene | 39% |
| Ir111 | Ir111 = LS3-2Ir(L100) 5 mmol LS3 + 10 mmol Ir(L100-1Br) A/toluene | 27% |
| Ir112 | Ir112 = LS13-2Ir(L110) 5 mmol LS13 + 10 mmol Ir(L110-1Br) | 55% |

-continued

| Ex. | Product Reactants Varian/hot extractant* | Yield |
|---|---|---|
| Ir113 | A/toluene Ir113 = LS19-2Ir(L112) 5 mmol LS19 + 10 mmol Ir(L112-1Br) | 49% |
| IR114 | A/toluene Ir114 = Ir(L3)-Ir(L4) 5 mmol Ir(L3-1Br) + 5 mmol Ir(L4-1BE) A/toluene | 26% |
| Ir115 | Ir115 = Ir(L3)-Ir(L112) 5 mmol Ir(L3-1Br) + 5 mmol Ir(L112-1BE) A/toluene | 32% |
| Ir116 | Ir116 = Ir(L109)-Ir(L250) 5 mmol Ir(L109-1Br) + 5 mmol Ir(250-1BE) A/toluene | 53% |
| Ir117 | Ir117 = Ir(L252)-Ir(L254) 5 mmol Ir(L252-1Cl) + 5 mmol Ir(L254-1BE) C/butyl acetate | 48% |
| Ir118 | Ir118 = Ir(L254)-Ir(L254) 5 mol Ir(L254-1Cl) + 5 mmol Ir(L254-1BE) | 45% |

-continued

| Ex. | Product Reactants Varian/hot extractant* | Yield |
|---|---|---|
| | C/o-xylene Trimetallic complexes | |
| Ir200 | | 27% |
| Ir201 | Ir200 = Ir(L1)-2Ir(L1)<br>4 mmol Ir(L1-2Br) + 8 mmol Ir(L1-1BE)<br>B/chlorobenzene<br><br>Ir201 = Ir(L111)-2Ir(L112)<br>4 mmol Ir(L111-2Br) + 8 mmol Ir(L112-1BE)<br>A/o-xylene | 23% |
| Ir202 | Ir202 = Ir(L111)-2Ir(L102)<br>4 mmol Ir(L111-2Br) + 8 mmol Ir(L102-1BE)<br>A/toluene | 33% |
| Ir203 | Ir203 = Ir(L104)-2Ir(L112)<br>4 mmol Ir(L104-2Br) + 8 mmol Ir(L112-1BE)<br>A/toluene | 31% |

-continued

| Ex. | Product Reactants Varian/hot extractant* | Yield |
|---|---|---|
| Ir204 | Ir204 = Ir(L201)-2Ir(L253)<br>4 mmol Ir(L201-2Cl) + 8 mmol Ir(L253-1BE)<br>C/toluene | 29% |
| Ir205 | Ir205 = LS24-3Ir(L110)<br>3 mmol LS24 + 9 mmol Ir(L110-1Br)<br>A/toluene | 36% |
| Ir206 | Ir206 = LS23-3Ir(L251)<br>3 mmol LS23 + 9 mmol Ir(L251-1Cl)<br>C/toluene | 27% |
| Ir207 | Ir207 = LS25-3Ir(L250)<br>3 mmol LS25 + 9 mmol Ir(L250-1Cl)<br>C/toluene | 25% |
| Ir208 | Ir208 = LS26-3Ir(L101)<br>3 mmol LS26 + 9 mmol Ir(L101-1Br)<br>A/toluene | 37% |
| Ir209 | Ir209 = LS27-3Ir(L254)<br>3 mmol LS27 + 9 mmol Ir(L254-1Cl)<br>C/toluene | 30% |
| Ir210 | Ir210 = LS28-3Ir(L110)<br>3 mmol LS28 + 9 mmol Ir(L110-1Br)<br>A/toluene | 34% |
| Ir211 | Ir211 = LS29-3Ir(L253)<br>3 mmol LS29 + 9 mmol Ir(L253-1C)<br>C/toluene | 29% |
| Ir212 | Ir212 = Ir(L111)-2Ir(L252)<br>3 mmol Ir(L111-2Br) + 6 mmol Ir(L252-1BE)<br>A/toluene | 31% |
| | Tetrametallic complexes | |
| Ir300 | | 19% |

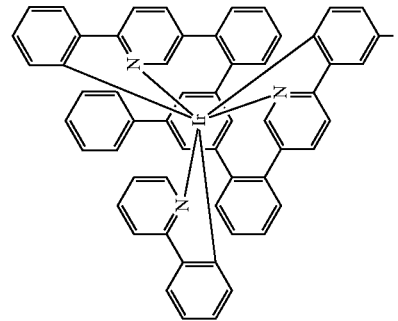

-continued
| Ex. | Product Reactants Varian/hot extractant* | Yield |
|---|---|---|
| | 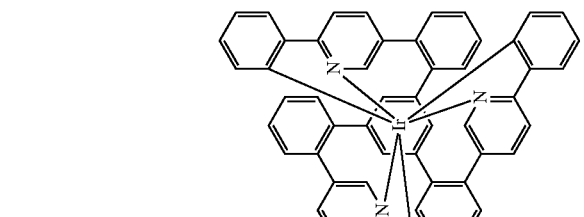 | |
| | Ir300 = Ir(L1)-3Ir(L1) 2 mmol Ir(L1-3Br) + mmol Ir(L1-1BE) B/chlorobenzene | |
| Ir301 | Ir301 = LS30-4Ir(L102) 2 mmol LS30 + 8 mmol Ir(L102-1Br) A/toluene | 21% |
| Ir302 | Ir302 = LS30-4Ir(L109) 2 mmol LS30 + 8 mmol Ir(L109-1Br) A/toluene | 26% |
| Ir303 | Ir303 = LS31-4Ir(L251) 2 mmol LS31 + 8 mmol Ir(251-1Cl) C/o-xylene | 22% |
| Ir304 | Ir304 = LS31-4Ir(L254) 2 mmol LS31 + 8 mmol Ir(254-1Cl) C/o-xylene | 18% |
*if different from Example Ir100

5) Oligomeric and Polymeric Metal Complexes

General Polymerization Method for the Bromides or Boronic Acid Derivatives as Polymerizable Group, Suzuki Polymerization Variant A: Biphasic Reaction Mixture The procedure is in accordance with WO 2002/077060 and WO 2003/048225 under inert conditions with carefully degassed solvents. The monomers (bromides and boronic acids or boronic esters, purity by HPLC>99.8%) are converted in the composition specified in the table in a total concentration of about 100 mmol/l in a mixture of 3 parts by volume of toluene:6 parts by volume of dioxane:2 parts by volume of water. The monomer M1 and the monomer M3 are always initially charged in full. Then 2 molar equivalents of tripotassium phosphate are added per Br functionality used overall, the mixture is stirred for a further 5 min, 0.06 molar equivalent of tri-ortho-tolylphosphine and then 0.01 molar equivalent of palladium(II) acetate per Br functionality used are added and the mixture is heated under reflux with very good stirring. After 1 h, the rest of the monomers according to the table are added all at once and the mixture is heated under reflux for a further 4 h. If the viscosity of the mixture rises too significantly, dilution is possible with a mixture of 2 parts by volume of toluene:3 parts by volume of dioxane. After a total reaction time of 4-6 h, for end-capping, 0.05 molar equivalent per boronic acid functionality used of a monobromoaromatic, 3-bromobiphenyl [2113-57-7] here, and then, 30 min thereafter, 0.05 molar equivalent per Br functionality used of a monoboronic acid or a monoboronic ester, 3-biphenylboronic acid pinacol ester [912844-88-3] here, are added and the mixture is boiled for a further 1 h. After cooling, the mixture is diluted with 500 ml of toluene, the aqueous phase is removed and the organic phase is washed twice with 300 ml each time of water. The organic phase is stirred at 80° C. with 300 ml of an aqueous 5% by weight N-acetylcysteine solution for 16 h, and the organic phase is removed, dried over magnesium sulphate, filtered through a Celite bed and then concentrated to dryness. The crude polymer is dissolved in THF (concentration about 10-30 g/l) and the solution is allowed to run gradually into twice the volume of methanol with very good stirring. The polymer is filtered off with suction and washed three times with methanol and dried. The reprecipitation operation is repeated five times, then the polymer is dried under reduced pressure to constant weight at 30-50° C.

Variant B—Monophasic Reaction Mixture

The monomers (bromides and boronic acids or boronic esters, purity by HPLC>99.8%) are dissolved or suspended in the composition specified in the table in a total concentration of about 100 mmol/l in a solvent (THF, dioxane, xylene, mesitylene, dimethylacetamide, NMP, DMSO, etc.). Then 3 molar equivalents of base (potassium fluoride, tripotassium phosphate (anhydrous, monohydrate or trihydrate), potassium carbonate, caesium carbonate, etc., each in anhydrous form) per Br functionality and the equivalent weight of glass beads (diameter 3 mm) are added, the mixture is stirred for a further 5 min, 0.03 to 0.003 molar equivalent of tri-ortho-tolylphosphine and then 0.005 to 0.0005 molar equivalent of palladium(II) acetate (ratio of phosphine to Pd preferably 6:1) per Br functionality are added and the mixture is heated up to 80° C. to reflux with very good stirring for 2-3 h. Alternatively, it is possible to use other phosphines such as tri-tert-butylphosphine, SPhos, XPhos, RuPhos, XanthPhos, etc., the preferred phosphine:palladium ratio in the case of these phosphines being 2:1 to 1.3:1. After a total reaction time of 4-12 h, for end-capping, 0.05 molar equivalent of a monobromoaromatic (see above) and then, 30 min thereafter, 0.05 molar equivalent of a monoboronic acid or a monoboronic ester (see above) are added and the mixture is boiled for a further 1 h. The solvent is substantially removed under reduced pressure, the residue is taken up in toluene and the polymer is purified as described in Variant A.

Oligomer/polymer P and the composition thereof composed of monomers M1 to M5, figures in mmol:

| Ex. | M1 | M2 | M3 | M4 | Yield |
|---|---|---|---|---|---|
| IrP1 | Ir(L3-1Br) 2 mmol | LS101 10 mmol | LS7 11 mmol | — | 84% |
| IrP2 | Ir(L102-1Br) 2 mmol | LS106 10 mmol | LS8 11 mmol | — | 88% |
| IrP3 | Ir(L109-1Br) 2 mmol | LS107 8 mmol | LS15 11 mmol | LS110 2 mmol | 91% |
| IrP4 | Ir(L112-1Br) 2 mmol | LS106 20 mmol | LS19 21 mmol | — | 90% |
| IrP5 | Ir(L112-1Br) 2 mmol | LS113 20 mmol | LS22 21 mmol | — | 83% |
| IrP6 | Ir(L250-1BE) 2 mmol | LS3 10 mmol | LS101 11 mmol | — | 85% |
| IrP7 | Ir(L250-1BE) 2 mmol | LS7 10 mmol | LS102 10 mmol | Ir(L102-1Br) 2 mmol | 87% |
| IrP8 | Ir(254-1BE) 2 mmol | LS21 6 mmol | LS107 4 mmol | Ir(L100-2Br) 3 mmol | 81% |

Example: Production of the OLED Devices

A: Solution-Processed Devices Made from Soluble Functional Materials of Low Molecular Weight The iridium complexes of the invention can be processed from solution and lead to OLEDs having very good properties. The production of such components is based on the production of polymeric light-emitting diodes (PLEDs), which has already been described many times in the literature (for example in WO 2004/037887). The structure is composed of substrate/ITO/hole injection layer (60 nm)/interlayer (20 nm)/emission layer (60 nm)/hole blocker layer (10 nm)/electron transport layer (40 nm)/cathode. For this purpose, substrates from Technoprint (soda-lime glass) are used, to which the ITO structure (indium tin oxide, a transparent conductive anode) is applied. The substrates are cleaned in a cleanroom with DI water and a detergent (Deconex 15 PF) and then activated by a UV/ozone plasma treatment. Thereafter, likewise in a cleanroom, a 20 nm hole injection layer is applied by spin-coating. The required spin rate depends on the degree of dilution and the specific spin-coater geometry. In order to remove residual water from the layer, the substrates are baked on a hotplate at 200° C. for 30 minutes. The interlayer used serves for hole transport; in this case, HLX from Merck is used. The interlayer may alternatively also be replaced by one or more layers which merely have to fulfil the condition of not being leached off again by the subsequent processing step of EML deposition from solution. For production of the emission layer, the triplet emitters of the invention are dissolved together with the matrix materials in toluene or chlorobenzene. The typical solids content of such solutions is between 16-25 g/l for type 1 and 2 devices when a device is to attain a typical layer thickness of about 60 nm, and 10-15 g/l for type 3 devices when a device is to attain a typical layer thickness of about 40 nm, by means of spin-coating. The solution-processed type 1 devices contain an emission layer composed of M1:M2:IrL (20%:60%:20%), the type 2 devices contain an emission layer composed of M1:M2:

IrLa:IrLb (30%:35%:30%:5%), meaning that they contain two different Ir complexes, and the type 3 devices contain an emission layer composed of M1:IrL (40:60%). The emission layer is spun on in an inert gas atmosphere, argon in the present case, and baked at 160° C. for 10 min. Vapour-deposited above the latter are the hole blocker layer (10 nm ETM1) and the electron transport layer (40 nm ETM1 (50%)/ETM2 (50%)) (vapour deposition systems from Lesker or the like, typical vapour deposition pressure $5 \times 10^{-6}$ mbar). Finally, a cathode of aluminium (100 nm) (high-purity metal from Aldrich) is applied by vapour deposition. In order to protect the device from air and air humidity, the device is finally encapsulated and then characterized. The OLED examples cited have not yet been optimized. Table 1 summarizes the data obtained.

TABLE 1

Results with materials processed from solution

| Ex. | Emitter IrLa IrLb Device | EQE (%) 1000 cd/m² | Voltage (V) 1000 cd/m² | CIE x/y | LD50 (h) 1000 cd/m² |
|---|---|---|---|---|---|
| Orange/red devices | | | | | |
| Sol-Ref-Red1 | IrRef1 IrRef2 Typ2 | 17.3 | 6.4 | 0.61/0.39 | 240000 |
| Sol-Red D1 | IrRef1 Ir107 Typ2 | 19.7 | 6.0 | 0.64/0.36 | 300000 |
| Sol-RedD2 | IrRef1 Ir108 Typ2 | 20.0 | 5.7 | 0.64/0.36 | 320000 |
| Sol-RedD3 | Ir103 Ir108 Typ2 | 20.3 | 5.9 | 0.63/0.37 | 380000 |
| Sol-RedD4 | Ir103 Ir118 Typ2 | 20.2 | 5.7 | 0.64/0.35 | 350000 |
| Sol-RedD5 | Ir212 Typ1 | 20.1 | 5.6 | 0.65/0.35 | 390000 |
| Sol-RedD5 | IrP4 Typ3 | 19.2 | 6.2 | 0.63/0.37 | 200000 |
| Green/yellow devices | | | | | |
| Sol-Ref-Green1 | IrRef1 Typ1 | 19.7 | 4.8 | 0.34/0.62 | 200000 |
| Sol-GreenD1 | Ir101 Typ1 | 20.7 | 4.9 | 0.35/0.62 | 260000 |
| Sol-GreenD2 | Ir103 Typ1 | 21.4 | 4.7 | 0.42/0.57 | 330000 |
| Sol-GreenD3 | Ir106 Typ1 | 21.2 | 4.8 | 0.35/0.63 | 270000 |
| Sol-GreenD4 | Ir116 Typ1 | 22.0 | 4.8 | 0.36/0.60 | 300000 |
| Sol-GreenD5 | Ir204 Typ1 | 21.7 | 4.7 | 0.35/0.62 | 290000 |
| Sol-GreenD6 | Ir210 Typ1 | 21.5 | 4.5 | 0.36/0.61 | 330000 |
| Sol-GreenD7 | Ir303 Typ1 | 21.8 | 4.7 | 0.42/0.57 | 340000 |
| Sol-GreenD8 | IrP3 Typ1 | 19.8 | 4.9 | 0.36/0.61 | 210000 |

Using the emitters Ir113, Ir201, Ir202, Ir203, Ir209, Ir304 and IrP8, it is possible in an analogous manner to the examples described above to obtain orange- to red-emitting devices having comparable performance data in terms of EQE, voltage, CIE and LD50 to those listed in Table 1.

Using the emitters Ir100, Ir102, Ir104, Ir105, Ir109, Ir110, Ir111, Ir112, Ir114, Ir200, Ir205, Ir206, Ir207, Ir208, Ir300, Ir301, Ir302, IrP1, IrP2, IrP5, IrP6 and IrP7, it is possible in an analogous manner to the examples described above to obtain green- to yellow-emitting devices having comparable performance data in terms of EQE, voltage, CIE and LD50 to those listed in Table 1.

TABLE 2

Structural formulae of the materials used

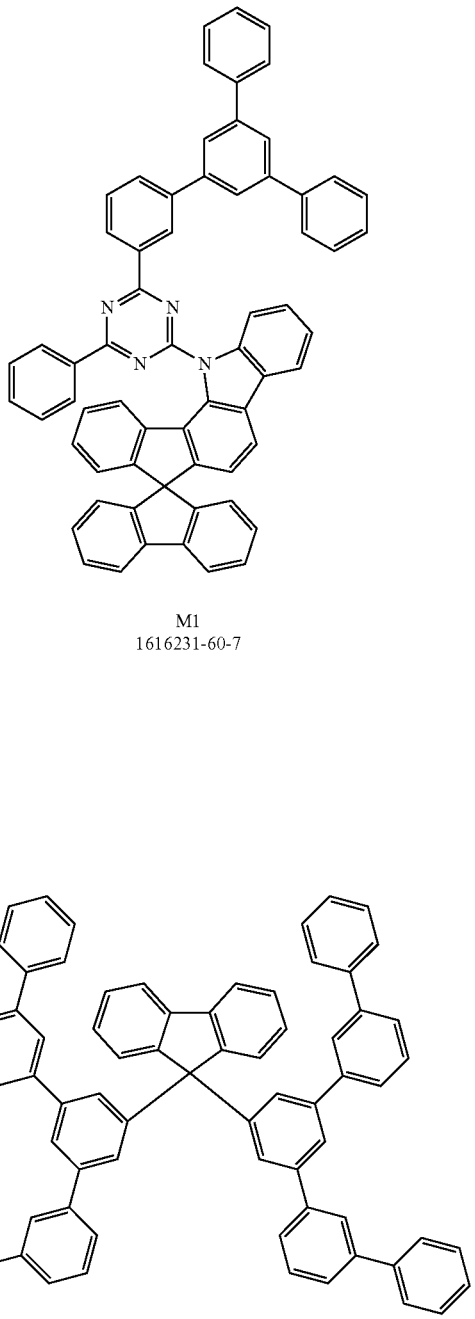

M1
1616231-60-7

M2
1246496-85-4

TABLE 2-continued

Structural formulae of the materials used

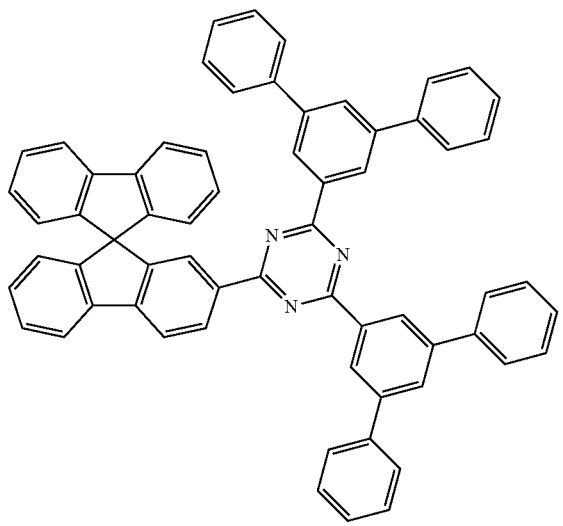

ETM1
1233200-52-6

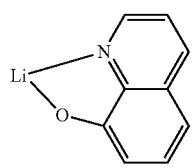

ETM2
25387-93-3

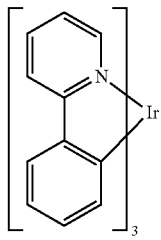

IrPPy
693794-98-8

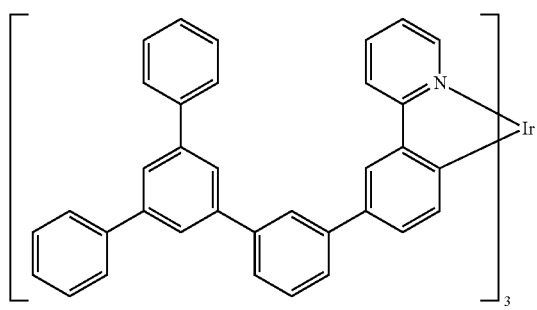

IrRef1
1269508-30-6

TABLE 2-continued

Structural formulae of the materials used

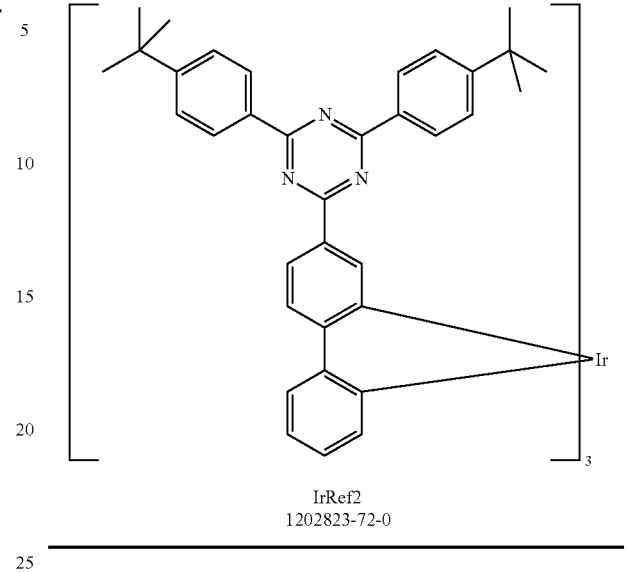

IrRef2
1202823-72-0

The invention claimed is:

1. A compound of formula (1):

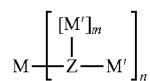

wherein

M is an iridium complex comprising a hexadentate tripodal ligand wherein three bidentate sub-ligands coordinate to an iridium atom and the three bidentate sub-ligands, which are optionally the same or different, are joined via a bridge of formula (2) or formula (3):

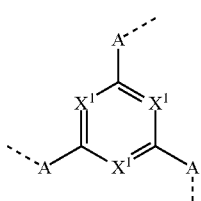

(2)

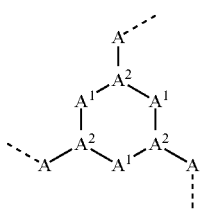

(3)

wherein the dotted line denotes the bond of the bidentate sub-ligands to this structure and wherein:

X' is the same or different in each instance and is CR or N;

A' is the same or different in each instance and is $C(R)_2$ or 0;

A² is the same or different in each instance and is CR, P(=O), B, or SiR, with the proviso that, when A² is P(=O), B, or SiR, A¹ is O and the A bonded to said A² is not —C(=O)—NR'— or —C(=O)—O—;

A is the same or different in each instance and is —CR=CR—, —C(=O)—NR'—, —C(=O)—O—, or a group of formula (4):

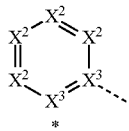

wherein the dotted line denotes the position of the bond of the bidentate sub-ligands to said group of formula (4) and * denotes the position of the direct bond to said group of formula (4) to the central cyclic group in formula (2) or formula (3);

X² is the same or different in each instance and is CR or N or two adjacent X² groups together are NR, O, or S, so as to define a five-membered ring, and the remaining X² are the same or different in each instance and are CR or N; or two adjacent X² groups together are CR or N when one of the X³ groups in the cycle is N, so as to define a five-membered ring; with the proviso that not more than two adjacent X² groups are N;

X³ is C in each instance or one X³ group is N and the other X³ group in the same cycle is C; with the proviso that two adjacent X² groups together are CR or N when one of the X³ groups in the cycle is N; and wherein, at the same time, the three bidentate sub-ligands, in addition to the bridge of formulae (2) or (3), are optionally closed via a further bridge to form a cryptate;

M' is the same or different in each instance and is M or an iridium complex wherein three bidentate ligands, which are optionally the same or different, coordinate to one iridium atom, or a platinum complex wherein two bidentate ligands, which are optionally the same or different, coordinate or wherein a tetradentate ligand coordinates to one platinum atom;

R is the same or different in each instance and is H, D, F, Cl, Br, I, N(R¹)₂, CN, NO₂, OH, COOH, C(=O)N(R¹)₂, Si(R¹)₃, B(OR¹)₂, C(=O)R¹, P(=O)(R¹)₂, S(=O)R¹, S(=O)₂R¹, OSO₂R¹, a straight-chain alkyl, alkoxy, or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, wherein the alkyl, alkoxy, thioalkoxy, alkenyl, or alkynyl groups are each optionally substituted by one or more le radicals, wherein one or more nonadjacent CH₂ groups are optionally replaced by Si(R¹)₂, C=O, NR¹, O, S, or CONR¹, or an aromatic or heteroaromatic ring system which has 5 to 40 aromatic ring atoms and is optionally substituted in each case by one or more le radicals, or an aryloxy or heteroaryloxy group which has 5 to 40 aromatic ring atoms and is optionally substituted by one or more le radicals; and wherein two R¹ radicals together optionally define a ring system;

R' is the same or different in each instance and is H, D, a straight-chain alkyl group having 1 to 20 carbon atoms or a branched or cyclic alkyl group having 3 to 20 carbon atoms, wherein the alkyl group in each case is optionally substituted by one or more R¹ radicals and wherein one or more nonadjacent CH₂ groups are optionally replaced by Si(R¹)₂, or an aromatic or heteroaromatic ring system which has 5 to 40 aromatic ring atoms and is optionally substituted in each case by one or more R¹ radicals;

R¹ is the same or different in each instance and is H, D, F, Cl, Br, I, N(R²)₂, CN, NO₂, Si(R²)₃, B(OR²)₂, C(=O)R², P(=O)(R²)₂, S(=O)R², S(=O)₂R², OSO₂R², a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are each be optionally substituted by one or more R² radicals, wherein one or more nonadjacent CH₂ groups are optionally replaced by Si(R²)₂, C=O, NR², O, S, or CONR², or an aromatic or heteroaromatic ring system which has 5 to 40 aromatic ring atoms and is optionally substituted in each case by one or more R² radicals, or an aryloxy or heteroaryloxy group which has 5 to 40 aromatic ring atoms and is optionally substituted by one or more R² radicals; and wherein two or more R¹ radicals together optionally define a ring system;

R² is the same or different in each instance and is H, D, F, or an aliphatic, aromatic, and heteroaromatic organic radical having 1 to 20 carbon atoms, wherein one or more hydrogen atoms are optionally replaced by F;

Z is the same or different in each instance and is a single bond or a linker that covalently joins two or more complexes M and M' to one another;

n is 1, 2, 3, 4, 5, or 6; and m is the same or different in each instance and is 0, 1, 2, 3, or 4 and wherein the three bidentate sub-ligands in M are the same or different in each instance and are selected from the group consisting of structures of formulae (L-1), (L-2), and (L-3):

(L-1)

(L-2)

(L-3)

wherein the dotted line denotes the bond of the sub-ligand to the bridge of formula (2) or (3);

wherein the sub-ligands are optionally joined to Z;

CyC is the same or different in each instance and is a substituted or unsubstituted aryl or heteroaryl group which has 5 to 14 aromatic ring atoms or a substituted or unsubstituted fluorene group, each of which coordinates to the metal via a carbon atom and which is bonded in each case to CyD via a covalent bond; and CyD is the same or different in each instance and is a substituted or unsubstituted heteroaryl group which has 5 to 14 aromatic ring atoms and coordinates to the metal via a nitrogen atom or via a carbene carbon atom and which is bonded to CyC in formulae (L-1) and (L-2) or CyD in formula (L-3) via a covalent bond; and wherein two or more of the optional substituents together optionally form a ring system.

2. The compound of claim 1, wherein n is 1 or 2 and m is 0 or 1.

3. The compound of claim 1, wherein Z is selected from the group consisting of a single bond, an alkylene group which has 1 to 20 carbon atoms and is optionally substituted by one or more $R^1$ radicals, wherein one or more nonadjacent $CH_2$ groups are optionally replaced by $R^1C=CR^1$, $C\equiv C$, $Si(R^1)_2$, $C=O$, $NR^1$, $O$, $S$, or $CONR^1$, an aromatic or heteroaromatic ring system which has 5 to 20 aromatic ring atoms and is optionally substituted in each case by one or more $R^1$ radicals, or an —Ar—alkylene— group, an —alkylene—Ar—alkylene— group, or an —Ar—[alkylene—Ar]— group, wherein p is 1, 2, or 3, wherein Ar is the same or different in each instance and is in each case an aromatic or heteroaromatic ring system which has 5 to 30 aromatic ring atoms and is optionally substituted by one or more $R^1$ radicals, and alkylene is an alkylene group which has 1 to 20 carbon atoms and is optionally substituted by one or more $R^1$ radicals, wherein one or more nonadjacent $CH_2$ groups are optionally replaced by $R^1C=CR^1$, $C\equiv C$, $Si(R^1)_2$, $C=O$, $NR^1$, $O$, $S$, or $CONR^1$; or Z is an oligomer or polymer.

4. The compound of claim 1, wherein Z is the same or different in each instance and is selected from the group consisting of a single bond and groups of formulae (Z-1) through (Z-8):

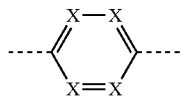
(Z-1)

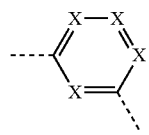
(Z-2)

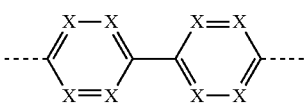
(Z-3)

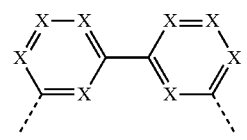
(Z-4)

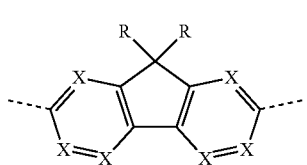
(Z-5)

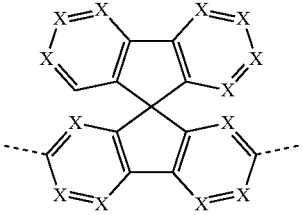
(Z-6)

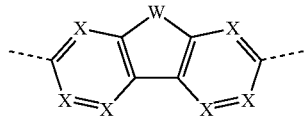
(Z-7)

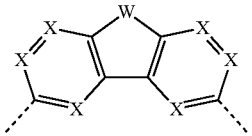
(Z-8)

wherein the dotted lines denote the direct bond to these groups;

X is the same or different in each instance and is CR or N; and

W is the same or different in each instance and is NR, O, or S.

5. The compound of claim 1, wherein the group of the formula (2) is selected from the group consisting of structures of formulae (5) through (8) and the group of formula (3) is selected from the group consisting of structures of formulae (9) through (13):

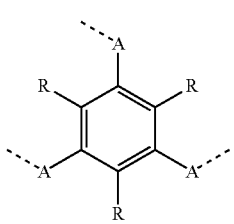
Formula (5)

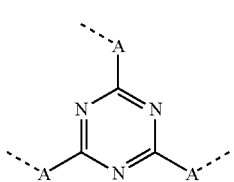
Formula (6)

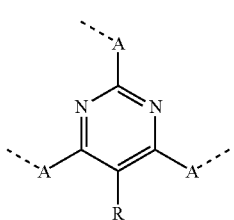
Formula (7)

Formula (8)
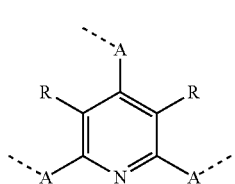

Formula (9)
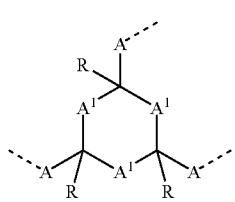

Formula (10)
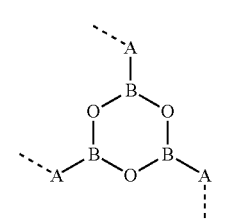

Formula (11)
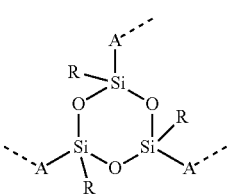

Formula (12)
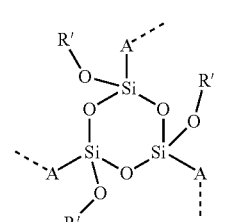

Formula (13)
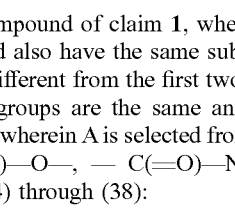

6. The compound of claim 1, wherein two A groups are the same and also have the same substitution and the third A group is different from the first two A groups, or wherein all three A groups are the same and also have the same substitution, wherein A is selected from the group consisting of —C(=O)—O—, —C(=O)—NR'—, and groups of formulae (14) through (38):

Formula (14)
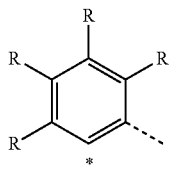

Formula (15)
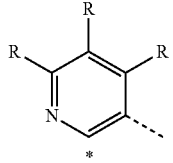

Formula (16)
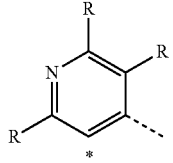

Formula (17)
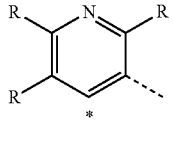

Formula (18)
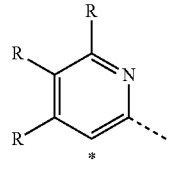

Formula (19)
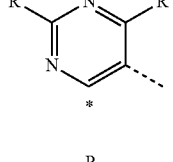

Formula (20)
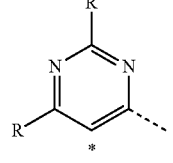

Formula (21)
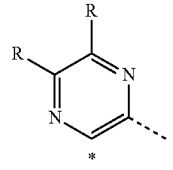

Formula (22)
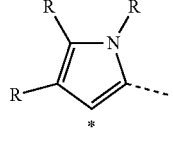

-continued

Formula (23)
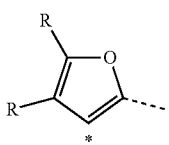

Formula (24)
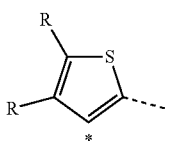

Formula (25)
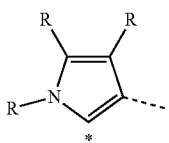

Formula (26)
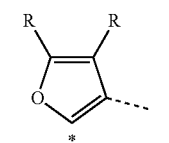

Formula (27)
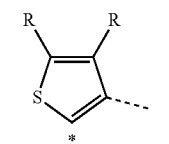

Formula (28)
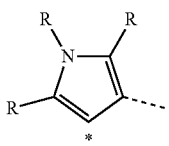

Formula (29)
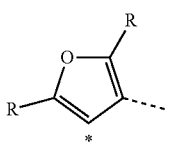

Formula (30)
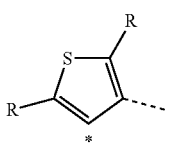

Formula (31)
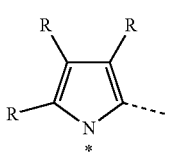

Formula (32)
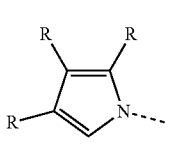

-continued

Formula (33)
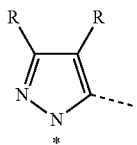

Formula (34)
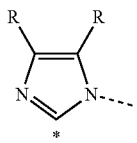

Formula (35)
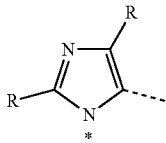

Formula (36)
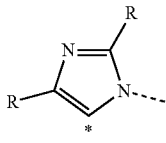

Formula (37)
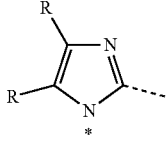

Formula (38)
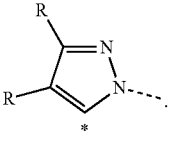

7. The compound of claim 1, wherein the group of formula (2) is a group of formula (5a″):

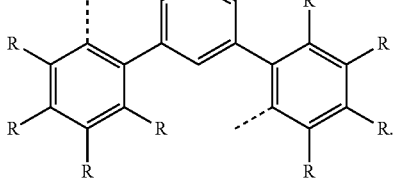

8. The compound of claim 1, wherein either the three bidentate sub-ligands in M are selected identically, or wherein two of the bidentate sub-ligands are selected identically and the third bidentate sub-ligand is different from the first two bidentate sub-ligands, and wherein each of the bidentate sub-ligands is monoanionic.

9. The compound of claim 1, wherein the bidentate sub-ligands are selected from the group consisting of structures of formulae (L-1-1), (L-1-2), (L-2-1) through (L-2-3), (L-4) through (L-33) and (L-40) through (L-44):
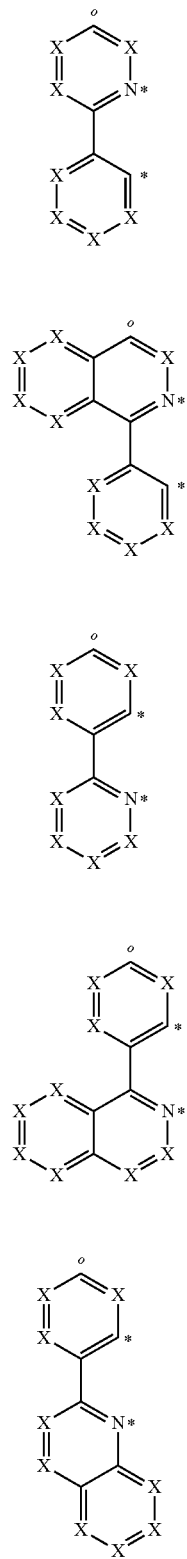
(L-1-1)
(L-1-2)
(L-2-1)
(L-2-2)
(L-2-3)
-continued
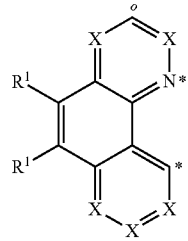
(L-4)
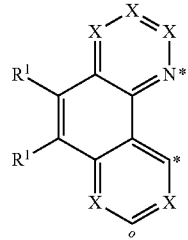
(L-5)
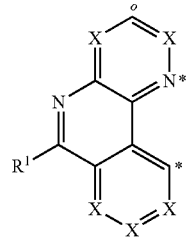
(L-6)
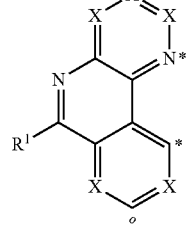
(L-7)
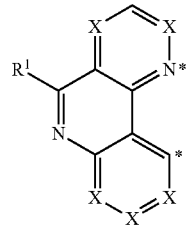
(L-8)
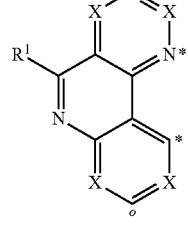
(L-9)

(L-10)
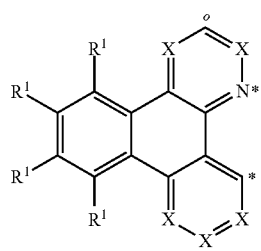
(L-11)
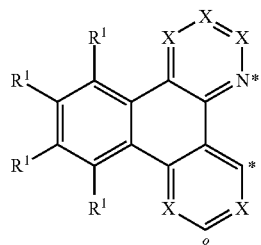
(L-12)
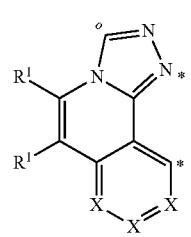
(L-13)
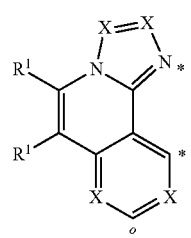
(L-14)
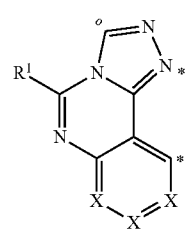
(L-15)
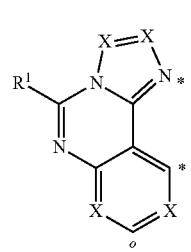
(L-16)
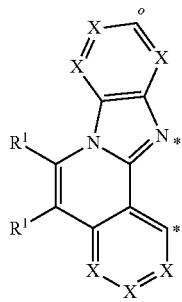
(L-17)
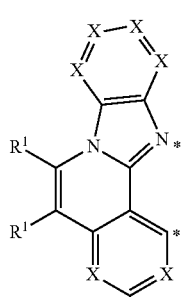
(L-18)
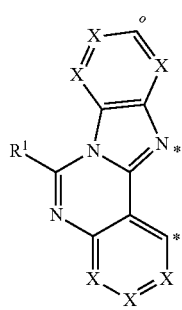
(L-19)
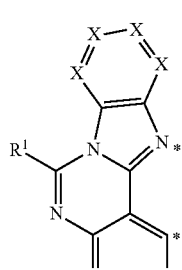
(L-20)
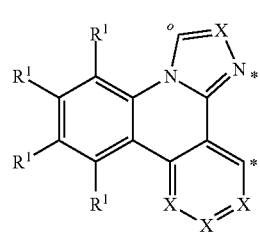

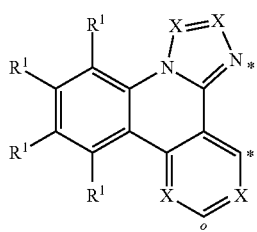 (L-21)
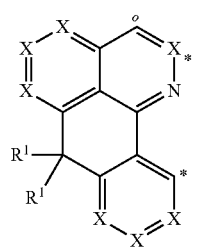 (L-22)
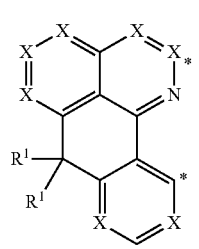 (L-23)
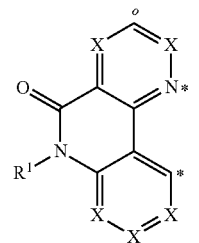 (L-24)
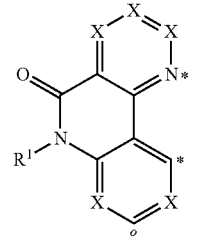 (L-25)
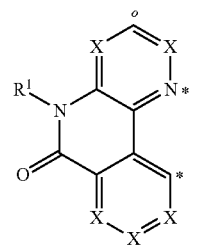 (L-26)
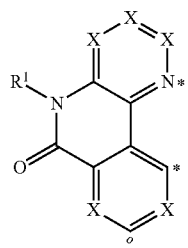 (L-27)
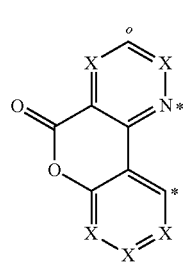 (L-28)
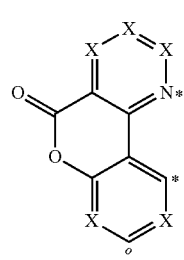 (L-29)
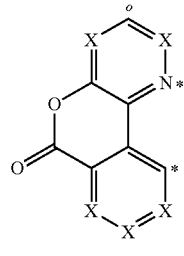 (L-30)
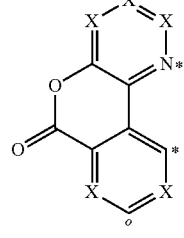 (L-31)
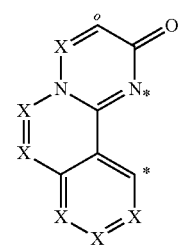 (L-32)

(L-33) 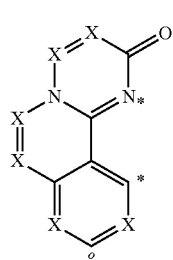

(L-40) 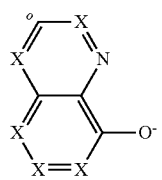

(L-41) 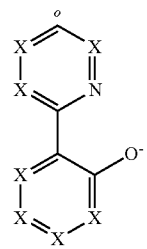

(L-42) 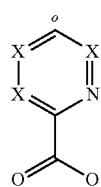

(L-43) 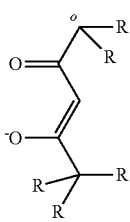

(L-44) 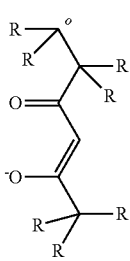

wherein
* represents the position of coordination to the iridium atom;
X is the same or different in each instance and is CR or N; and
o denotes the position where the structure is directly bonded to the group of formula (2) or (3), with the proviso that, when Z is bonded to this structure, one X is C and Z is bonded to this carbon atom.

10. The compound of claim 1, wherein each M' is the same or different and is M or an iridium complex wherein three bidentate ligands, which are optionally the same or different, coordinate to one iridium atom, wherein the bidentate ligands are selected from the group consisting of structures of formulae (L-1') and (L-3'):

wherein
CyC is the same or different in each instance and is a substituted or unsubstituted aryl or heteroaryl group which has 5 to 14 aromatic ring atoms or a substituted or unsubstituted fluorene group, each of which coordinates to the metal via a carbon atom and which is bonded in each case to CyD via a covalent bond; and
CyD is the same or different in each instance and is a substituted or unsubstituted heteroaryl group which has 5 to 14 aromatic ring atoms and coordinates to the metal via a nitrogen atom or via a carbene carbon atom and which is bonded to CyC in formulae (L-1') or CyD in formula (L-3') via a covalent bond; and wherein two or more of the optional substituents together optionally form a ring system.

11. A formulation comprising at least one compound of claim 1 and at least one further compound.

12. The formulation of claim 11, wherein the at least one further compound is at least one solvent.

13. An electronic device comprising at least one compound of claim claim 1.

14. The electronic device of claim 13, wherein the device is selected from the group consisting of organic electroluminescent devices, organic integrated circuits, organic field-effect transistors, organic thin-film transistors, organic light-emitting transistors, organic solar cells, organic optical detectors, organic photoreceptors, organic field-quench devices, light-emitting electrochemical cells, oxygen sensors, and organic laser diodes.

15. The electronic device of claim 13, wherein the electronic device is an organic electroluminescent device, wherein the organic electroluminescent device comprises one or more emitting layers, wherein the one or more emitting layers comprises at least one compound of claim 1.

16. The compound of claim 1, wherein $R^2$ is a hydrocarbyl radical.

* * * * *